(12) United States Patent
DeSanti et al.

(10) Patent No.: US 12,730,486 B2
(45) Date of Patent: Sep. 8, 2026

(54) RACKED GPU SYSTEM

(71) Applicant: Dell Products L.P., Round Rock, TX (US)

(72) Inventors: Claudio DeSanti, Santa Cruz, CA (US); Joseph Lasalle White, San Jose, CA (US); David Piehler, Mountain View, CA (US)

(73) Assignee: Dell Products L.P., Round Rock, TX (US)

( * ) Notice: Subject to any disclaimer, the term of this patent is extended or adjusted under 35 U.S.C. 154(b) by 123 days.

(21) Appl. No.: 18/926,790

(22) Filed: Oct. 25, 2024

(65) Prior Publication Data

US 2026/0118925 A1 Apr. 30, 2026

(51) Int. Cl.
*G06F 1/186* (2026.01)
*H05K 7/14* (2006.01)

(52) U.S. Cl.
CPC ........... *G06F 1/186* (2013.01); *H05K 7/1492* (2013.01)

(58) Field of Classification Search
CPC combination set(s) only.
See application file for complete search history.

(56) References Cited

U.S. PATENT DOCUMENTS 10,206,297 B2 * 2/2019 Breakstone ......... G06F 13/4282
11,395,431 B2 * 7/2022 Pham ................... H05K 7/1489
11,538,132 B2 * 12/2022 Ni ........................... G06F 15/78
11,727,529 B2 * 8/2023 Ni ......................... H05K 7/1485 361/679.02
11,800,675 B2 * 10/2023 Pham ................... H05K 5/0291
2009/0152216 A1 * 6/2009 Champion ................ G06F 1/20 211/26
2016/0073544 A1 * 3/2016 Heyd ...................... G06F 1/185 361/679.31
2017/0150621 A1 * 5/2017 Breakstone ........ H05K 7/20736
2019/0269040 A1 * 8/2019 Gao ...................... H05K 7/1488
2021/0201435 A1 * 7/2021 Ni ......................... H05K 7/1485
2022/0312624 A1 * 9/2022 Pham ................... H05K 5/0291
2022/0418145 A1 * 12/2022 Heymann ............... G06F 1/185
2023/0094401 A1 * 3/2023 Ni ............................ G06T 1/20 361/679.02
2025/0337194 A1 * 10/2025 Doll ...................... H01R 13/518
2025/0393157 A1 * 12/2025 Panella ................ H05K 7/1498
2026/0013069 A1 * 1/2026 Frankel ................ H05K 7/1487

* cited by examiner

*Primary Examiner* — Lisa Lea-Edmonds
(74) *Attorney, Agent, or Firm* — Joseph Mencher

(57) ABSTRACT

A racked GPU system includes a rack system defining a plurality of device housings. An interposer device is housed in the rack system adjacent the plurality of device housings. A plurality of compute devices that each include a plurality of Graphics Processing Units (GPU) devices are housed in a respective one of the plurality of the device housings and connected to the interposer device. At least one switch system including a plurality of networking processing devices is housed in the rack system opposite the interposer device from the plurality of compute devices and the plurality of device housings, and connected to the interposer device to communicatively couple each of the plurality of networking processing devices in that switch system to each of the plurality of GPU devices in each of the plurality of compute devices.

20 Claims, 49 Drawing Sheets

300

(PRIOR ART)
FIG. 6A
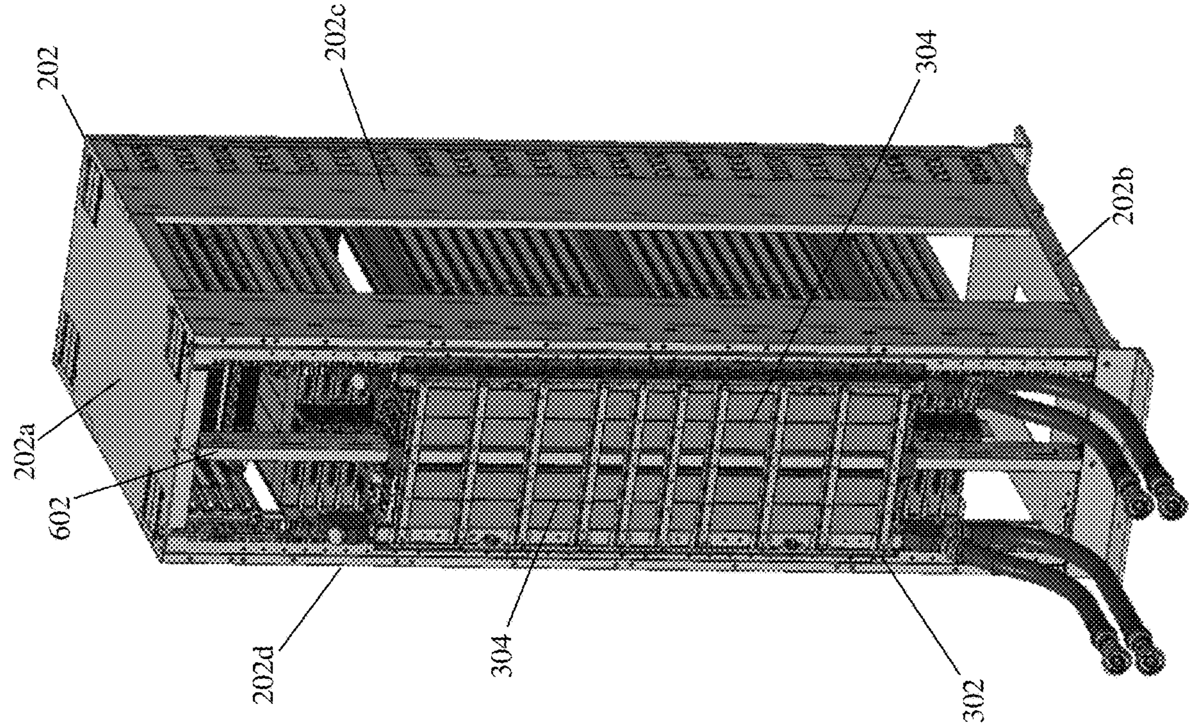

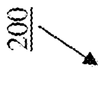
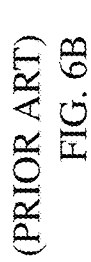
(PRIOR ART)
FIG. 6B
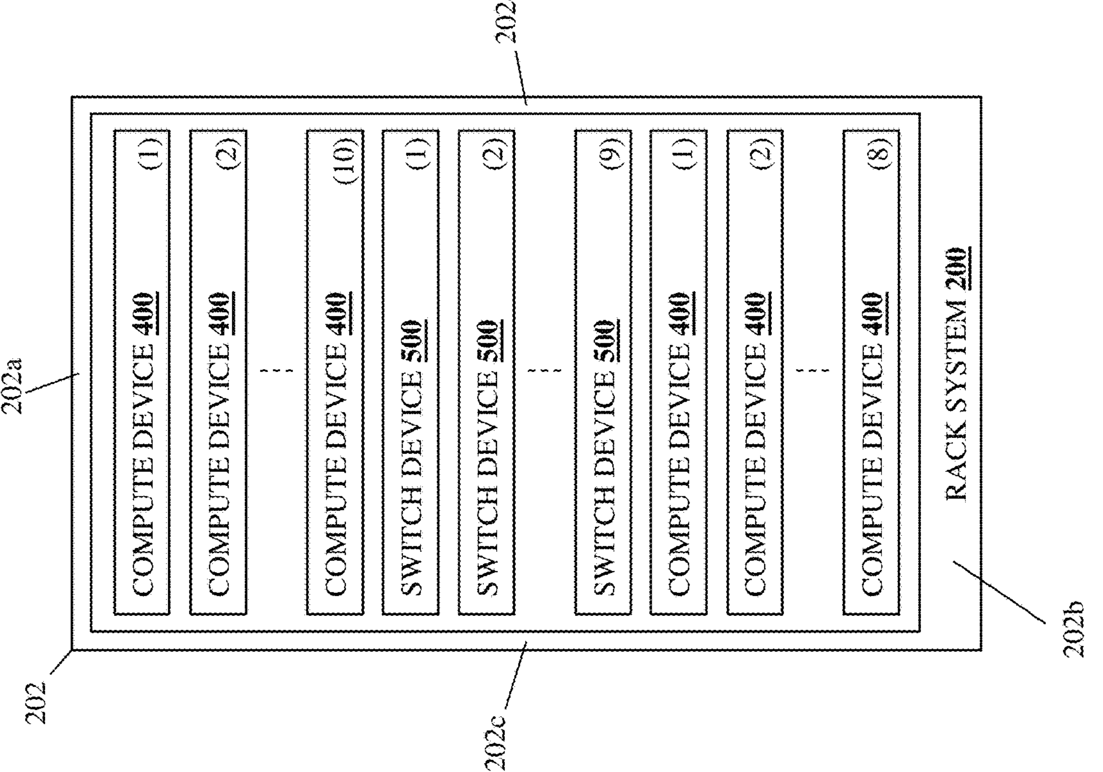

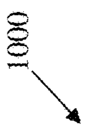
FIG. 17C
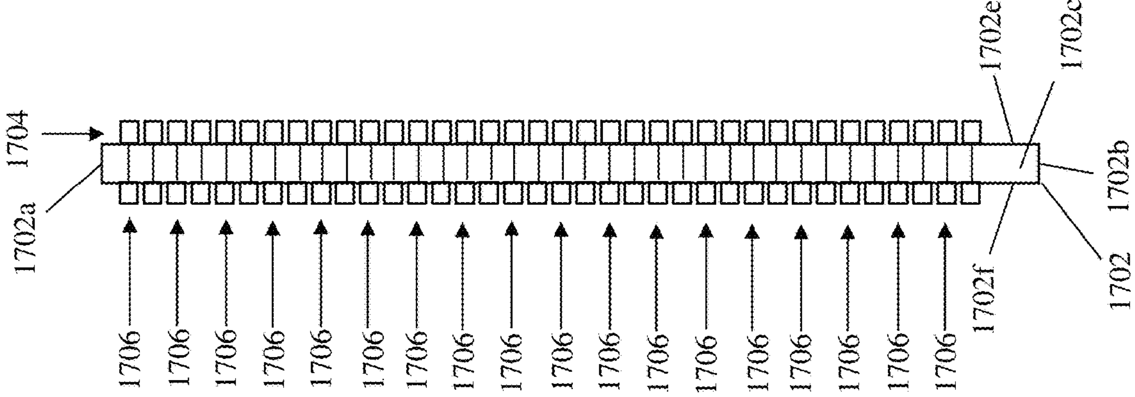

RACKED GPU SYSTEM

BACKGROUND

The present disclosure relates generally to information handling systems, and more particularly to racked GPU systems that are provided using information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices and compute devices including a plurality of Graphics Processing Units (GPUs), may be provided in a rack system and coupled together in order to provide a racked GPU system for use in Artificial Intelligence (AI) applications and/or other racked GPU system applications known in the art. However, the inventors of the present disclosure have recognized issues in the configuration of such conventional racked GPU systems that limit the GPU density and scalability of such racked GPU systems. In particular, conventional racked GPU systems house the compute devices and switch devices in respective rack units defined by a rack system and provide a passive cable cartridge in the rack system to which each of the compute devices and switch devices connect to for both mechanical support and in order to communicatively couple to each other.

To provide a specific example, "NVL72" racked GPU systems available from NVIDIA® Corporation of Santa Rosa, California, United States, discussed in further detail below, may include up to 18 compute devices (also called "compute sleds") that each include four GPUs (e.g., "Blackwell" GPUs available from NVIDIA®), and use 9 switch devices (e.g., "NVSwitch" switch devices available from NVIDIA®, also referred to a "switch sleds") that each include two switch processors (e.g., "Quantum-3" switch Application-Specific Integrated Circuits (ASICs)) available from NVIDIA®), with each of the compute devices and switch devices provided in respective rack units in a rack system and connected to a passive cable cartridge provided at the back of the rack system.

While the conventional racked GPU systems discussed above are currently considered to have "high-GPU-density", increased GPU density is desirable, and such GPU density increases will continue to be desirable into the future.

However, as discussed in further detail below, the inventors of the present disclosure have recognized that each rack unit in a rack system that is used to house a switch device for the racked GPU system as described above could otherwise be used to house an additional compute device with additional GPUs, and thus the configuration of conventional racked GPU systems described above operates to limit their GPU density.

Furthermore, the passive cable cartridge discussed above that connects to and communicatively couples each of the compute devices and switch devices provided in the rack system requires a "full complement" of switch devices (e.g., all 9 switch devices must be provided in the rack system of the "NVL72" racked GPU system discussed above) in order to provide communicative connectivity between any compute devices provided in the rack system, regardless of how many compute devices are actually provided in that rack system. As such, users must purchase the "full complement" of switch devices for their conventional GPU racked system even if they do not plan on using the "full complement" of compute devices (e.g., even if they plan on using half of (or less than half of) the 18 compute devices that the "NVL72" racked GPU system discussed above is capable of including), and such issues increase as the number of switch devices required by a racked GPU system increases (e.g., 12 switch devices are required in racked GPU systems using "64 Falcon Shores" GPUs available from INTEL® Corporation of Santa Clara, California, United States; 16 switch devices are required in racked GPU systems using "64 MI400" GPUs available from AMD® Corporation of Santa Clara, California, United States; etc.).

Accordingly, it would be desirable to provide a racked GPU system that addresses the issues discussed above.

SUMMARY

According to one embodiment, an Information Handling System (IHS) includes a rack system defining a plurality of device housings; an interposer device housed in the rack system adjacent the plurality of device housings; a plurality of compute devices that each include a plurality of Graphics Processing Units (GPU) devices, wherein each of the plurality of compute devices is housed in a respective one of the plurality of the device housings and connected to the interposer device; and at least one switch system that includes a plurality of networking processing devices, wherein each at least one switch system is housed in the rack system opposite the interposer device from the plurality of compute devices and the plurality of device housings, and connected to the interposer device, wherein each of the plurality of GPU devices in the plurality of compute devices communicates via the interposer device and the at least one switch system with at least one of the others of the plurality of GPU devices in the plurality of compute devices.

BRIEF DESCRIPTION OF THE DRAWINGS

FIG. 6A is a rear perspective view illustrating an embodiment of a conventional racked GPU system provided by the conventional rack system of FIG. 2 including the conventional passive cable cartridge of FIG. 3 and housing a plurality of the conventional compute devices of FIG. 4 and a plurality of the conventional switch devices of FIGS. 5A and 5B.

FIG. 6B is a schematic view illustrating an embodiment of the conventional racked GPU system of FIG. 6A.

FIG. 17C is a schematic side view illustrating an embodiment of the interposer device of FIGS. 17A and 17B.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
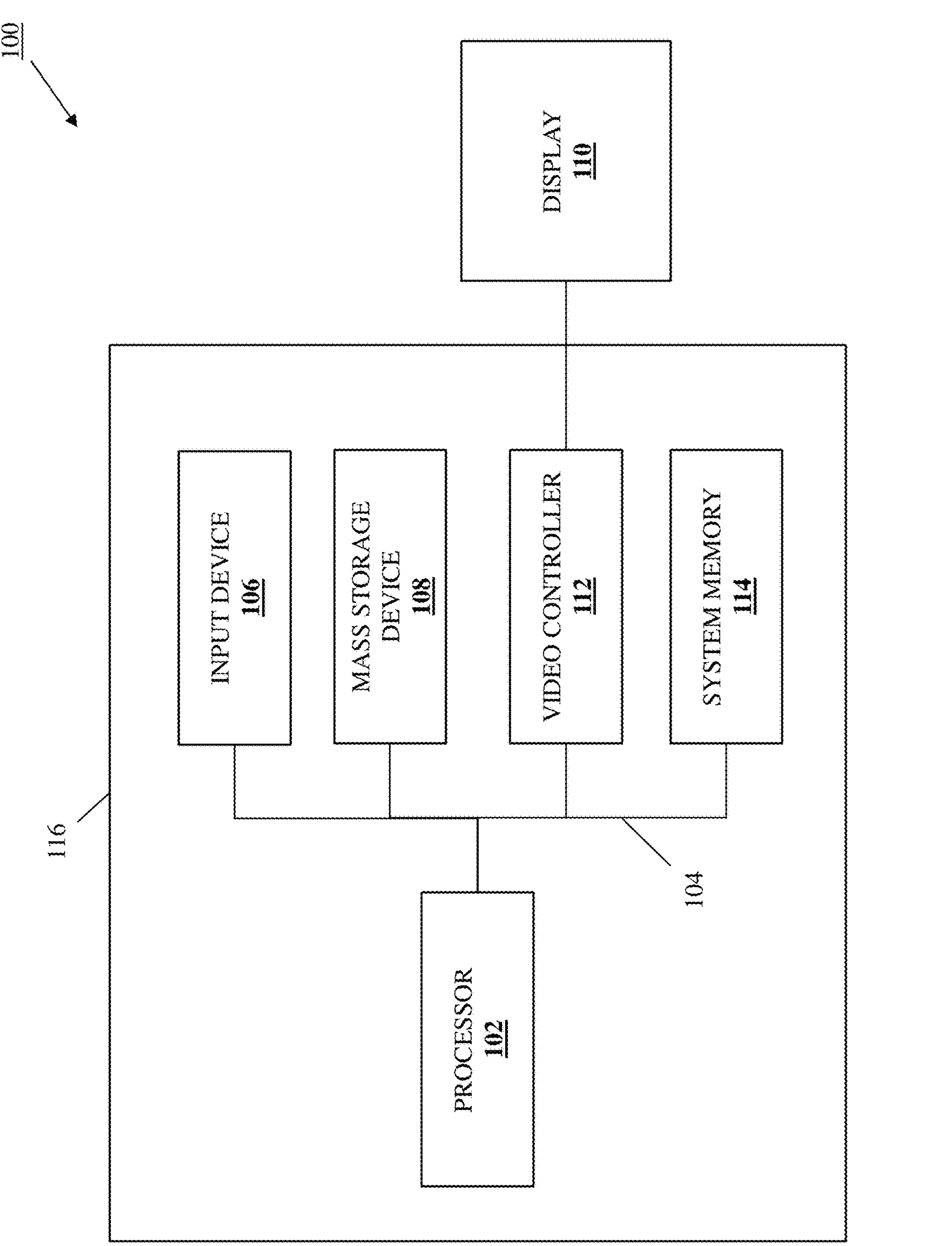
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

A conventional racked GPU system will now be described for purposes of comparison to the racked GPU system of the present disclosure, and one of skill in the art in possession of the present disclosure will appreciate that the details of the conventional racked GPU system illustrated and described below are specific to "NVL72" racked GPU systems available from NVIDIA® Corporation of Santa Rosa, California, United States. However, one of skill in the art in possession of the present disclosure will also appreciate how other conventional racked GPU systems such as those that utilize the "Falcon Shores" GPUs available from INTEL® Corporation of Santa Clara, California, United States, those that use the "MI400" GPUs available from AMD® Corporation of Santa Clara, California, United States, and/or other conventional racked GPU systems known in the art, include similar configurations and thus suffer from the same issues.

Figure 2:
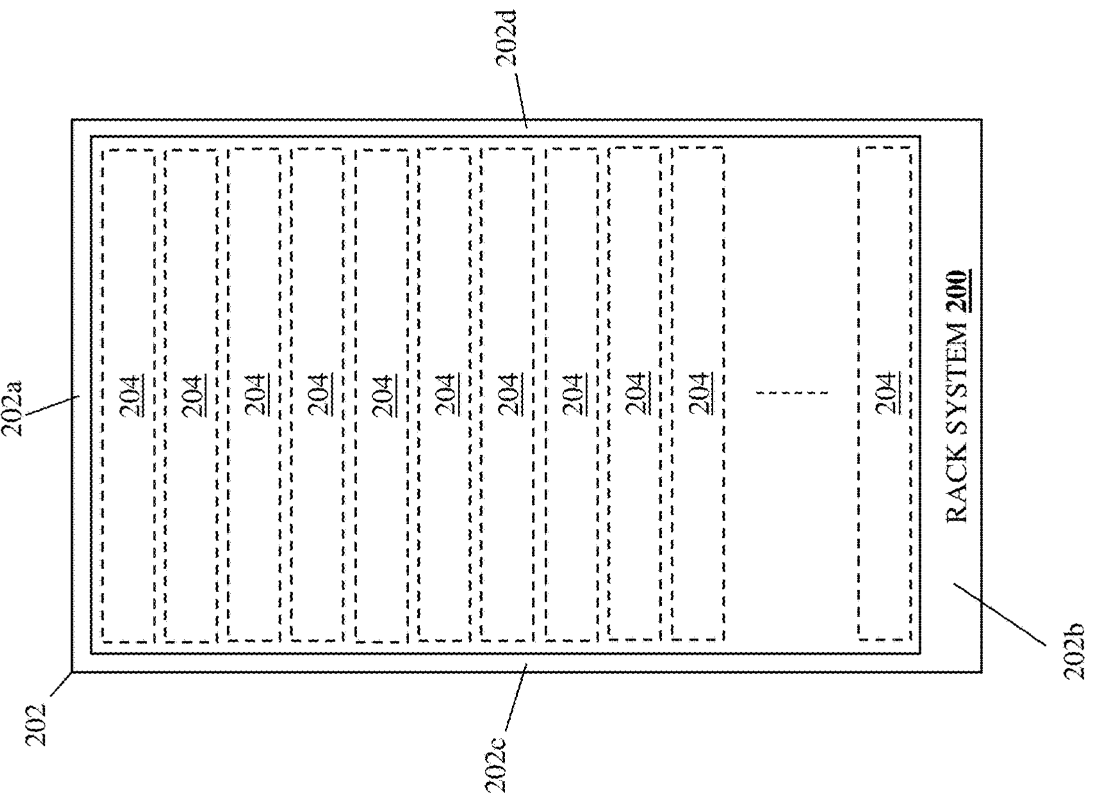
FIG. 2 is a schematic view illustrating an embodiment of a conventional rack system.

Referring now to FIG. 2, an embodiment of a conventional rack system 200 utilized in conventional racked GPU systems is illustrated. In the illustrated embodiment, the conventional rack system 200 includes a rack chassis 202 having a top wall 202*a*, a bottom wall 202*b* that is located opposite the rack chassis 202 from the top wall 202*a*, and a pair of opposing side walls 202*c* and 202*d* that are located opposite the rack chassis 202 from each other and that extend between the top wall 202*a* and the bottom wall 202*b*. A rack housing is defined between the top wall 202*a*, the bottom wall 202*b*, and the side walls 202*c* and 202*d*, and in the illustrated embodiment includes a plurality of device housings 204 that may also be referred to as "rack units".

While not illustrated, one of skill in the art in possession of the present disclosure will appreciate how the conventional rack system 200 may include device coupling/securing features (e.g., READYRAIL® systems available from DELL® Inc. of Round Rock, Texas, United States) that are mounted to the rack chassis 202 adjacent each device housing 204 and that are configured to couple devices to the rack chassis 202 and secure those devices in each of the device housings 204. Furthermore, while a specific conventional rack system 200 is illustrated and described, one of skill in the art in possession of the present disclosure will appreciate how conventional rack systems may include a variety of components and/or component configurations while remaining within the scope of the present disclosure as well.

Figure 3:
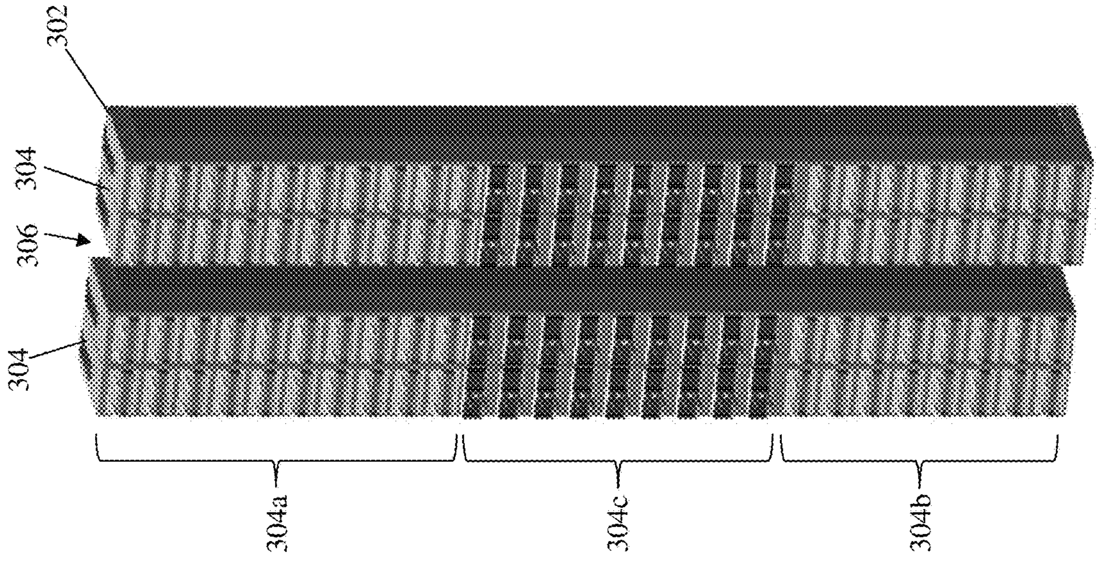
FIG. 3 is a perspective view illustrating an embodiment of a conventional passive cable cartridge.

Referring now to FIG. 3, an embodiment of a conventional passive cable cartridge system 300 utilized in conventional racked GPU systems is illustrated. In the illustrated embodiment, the conventional passive cable cartridge system 300 includes a cable cartridge chassis 302 providing a pair of cable cartridge "towers" 304 that are separated by spacing 306 that, as discussed below, is used to allow the conventional passive cable cartridge system 300 to be positioned in the rack system 200 discussed above with reference to FIG. 2 without interfering with a rack power system. In the specific example provided in FIG. 3, the cable cartridge towers 304 include a pair of compute device connector groups 304*a* and 304*b* separated by a plurality of switch device connector groups 304*c*.

Continuing with the example of the "NVL72" racked GPU systems discussed above, the cable cartridge towers 304 may provide 10 compute device connector groups 304*a* each having 4 compute device connectors positioned in the same horizontal plane, 9 switch device connector groups each having 4 switch device connectors 304*c* positioned in the same horizontal plane, and 8 compute device connector groups 304*b* each having 4 compute device connectors positioned in the same horizontal plane. While not illustrated or described in detail, the cable cartridge towers 304 in the conventional passive cable cartridge system 300 house a plurality of cables connecting the compute device connectors in the compute device connector groups 304*a* and 304*b* to the switch device connectors in the switch device connector groups 304*c* (e.g., conventional passive cable cartridges used in the "NVL72" racked GPU systems discussed above include 5184 copper twin-axial cables).

Figure 4:
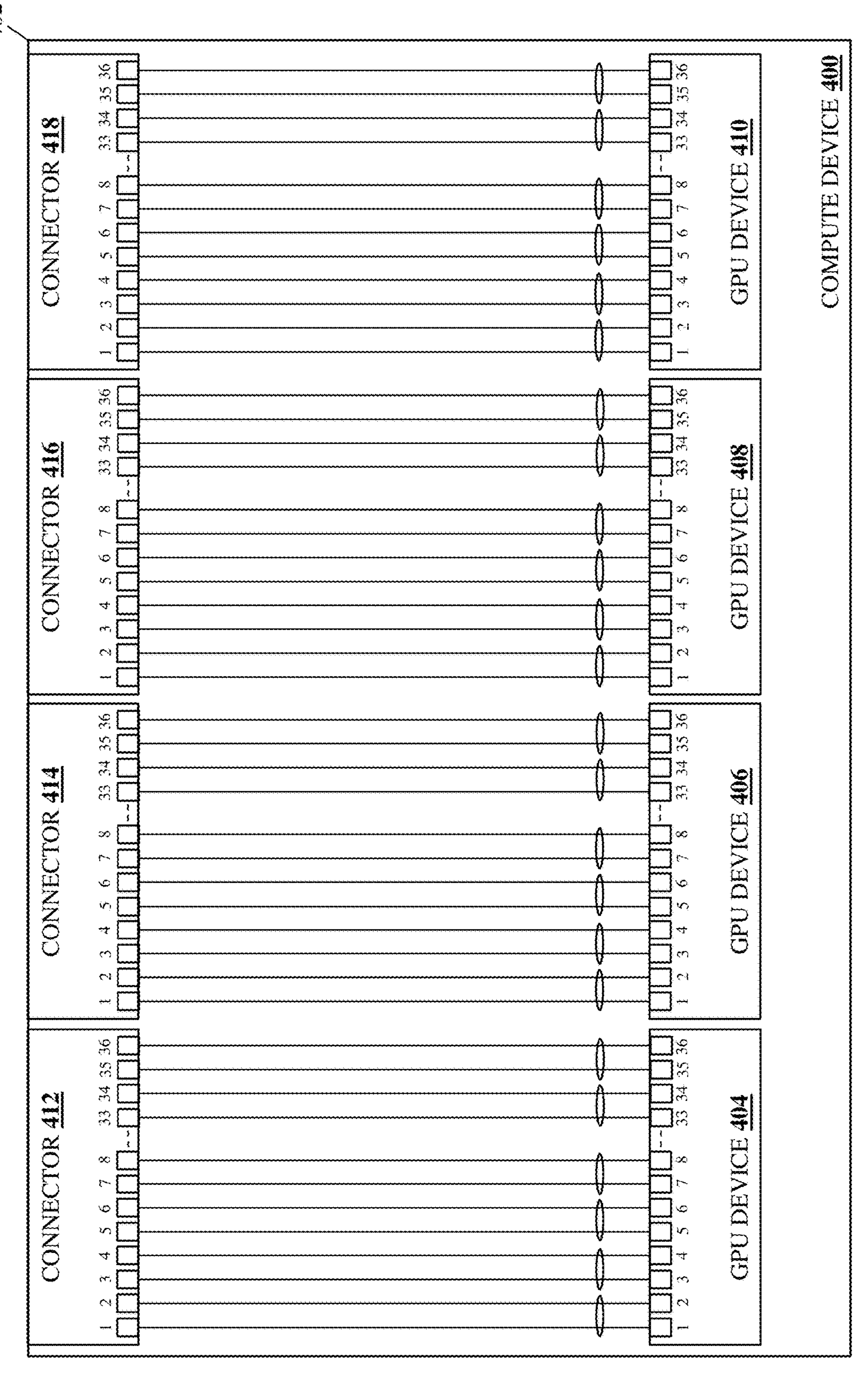
FIG. 4 is a schematic view illustrating an embodiment of a conventional compute device.

Referring now to FIG. 4, an embodiment of a conventional compute device 400 utilized in conventional racked GPU systems is illustrated. The conventional compute device 400 includes a chassis 402 that houses the components of the conventional compute device 400, only some of which are illustrated and described below. In the illustrated example, the chassis 402 houses four GPU devices 404, 406, 408, and 410 (e.g., four "Blackwell" GPU devices in compute devices used in the "NVL72" racked GPU systems discussed above), with each GPU device including 36 GPU interfaces (e.g., 36 bidirectional GPU interfaces in the examples provided herein). While not illustrated or described in detail, one of skill in the art in possession of the present disclosure will appreciate how the compute device 400 may include other processing systems (e.g., two "Grace" processors in compute devices used in the "NVL72" racked GPU systems discussed above) while remaining within the scope of the present disclosure as well.

The chassis 402 also includes four connectors 412, 414, 416, and 418, with each connector including 36 connector interfaces. Continuing with the example of the "NVL72" racked GPU systems discussed above, the GPU devices 404-410 and the connectors 412-418 are coupled to each other, with each of the 36 GPU interfaces on the GPU device 404 connected to the 36 respective connector interfaces on the connector 412 (i.e., with the "1" GPU interface on the GPU device 404 connected to the "1" connector interface on the connector 412, the "2" GPU interface on the GPU device 404 connected to the "2" connector interface on the connector 412, and so on), each of the 36 GPU interfaces on the GPU device 406 connected to the 36 respective connector interfaces on the connector 414 (i.e., with the "1" GPU interface on the GPU device 406 connected to the "1" connector interface on the connector 414, the "2" GPU interface on the GPU device 406 connected to the "2" connector interface on the connector 414, and so on), each of the 36 GPU interfaces on the GPU device 408 connected to the 36 respective connector interfaces on the connector 416 (i.e., with the "1" GPU interface on the GPU device 408 connected to the "1" connector interface on the connector 416, the "2" GPU interface on the GPU device 408 connected to the "2" connector interface on the connector 416, and so on), and each of the 36 GPU interfaces on the GPU device 410 connected to the 36 respective connector interfaces on the connector 418 (i.e., with the "1" GPU interface on the GPU device 410 connected to the "1" connector interface on the connector 418, the "2" GPU interface on the GPU device 410 connected to the "2" connector interface on the connector 418, and so on).

As will be appreciated by one of skill in the art in possession of the present disclosure, pairs of serial links that are each provided by a respective connected GPU interface/connector interface pair on the GPU devices 404-410 and connectors 412-418 are used to provide 18 communication paths for each GPU device (e.g., a first communication path using a serial link pair provided by the connected GPU/connector interfaces 1/1 and 2/2, a second communication path using a serial link pair provided by the connected GPU connector interfaces 3/3 and 4/4, etc.). Furthermore, one of skill in the art in possession of the present disclosure will appreciate how each GPU device may communication with each of the 18 networking processing devices provided in the conventional racked GPU system described below via a respective one of those 18 communication paths.

Figure 5A:
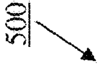
FIG. 5A is a top view illustrating an embodiment of a conventional switch device.
Figure 5A:
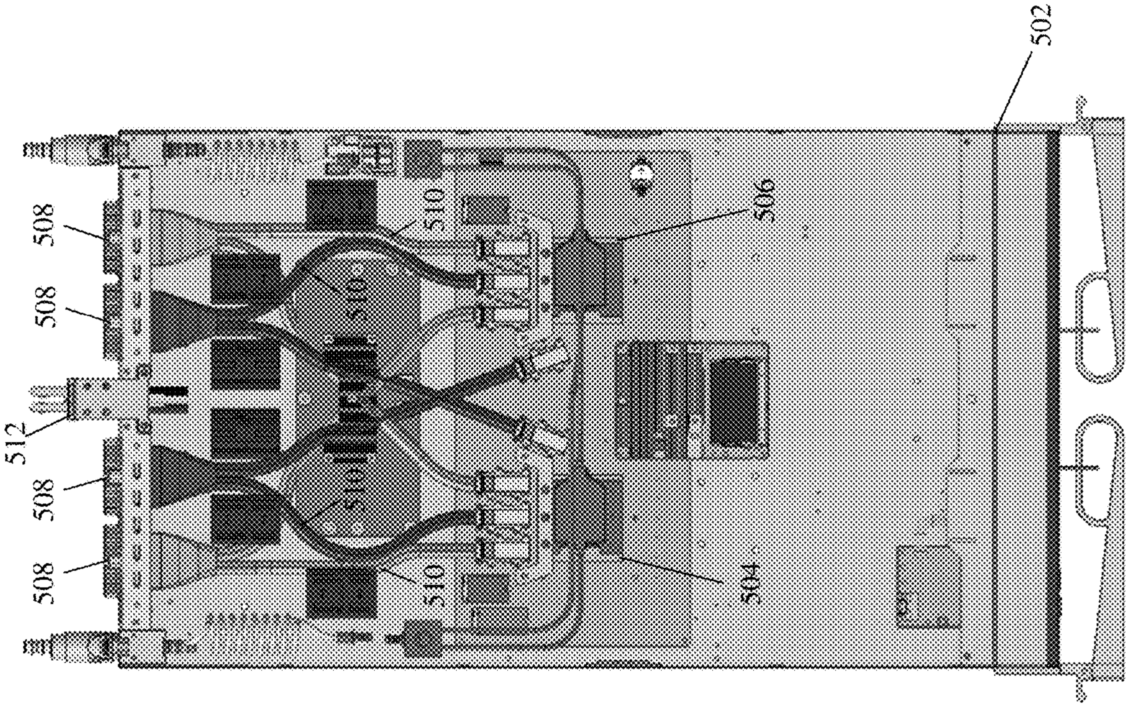
Figure 5B:
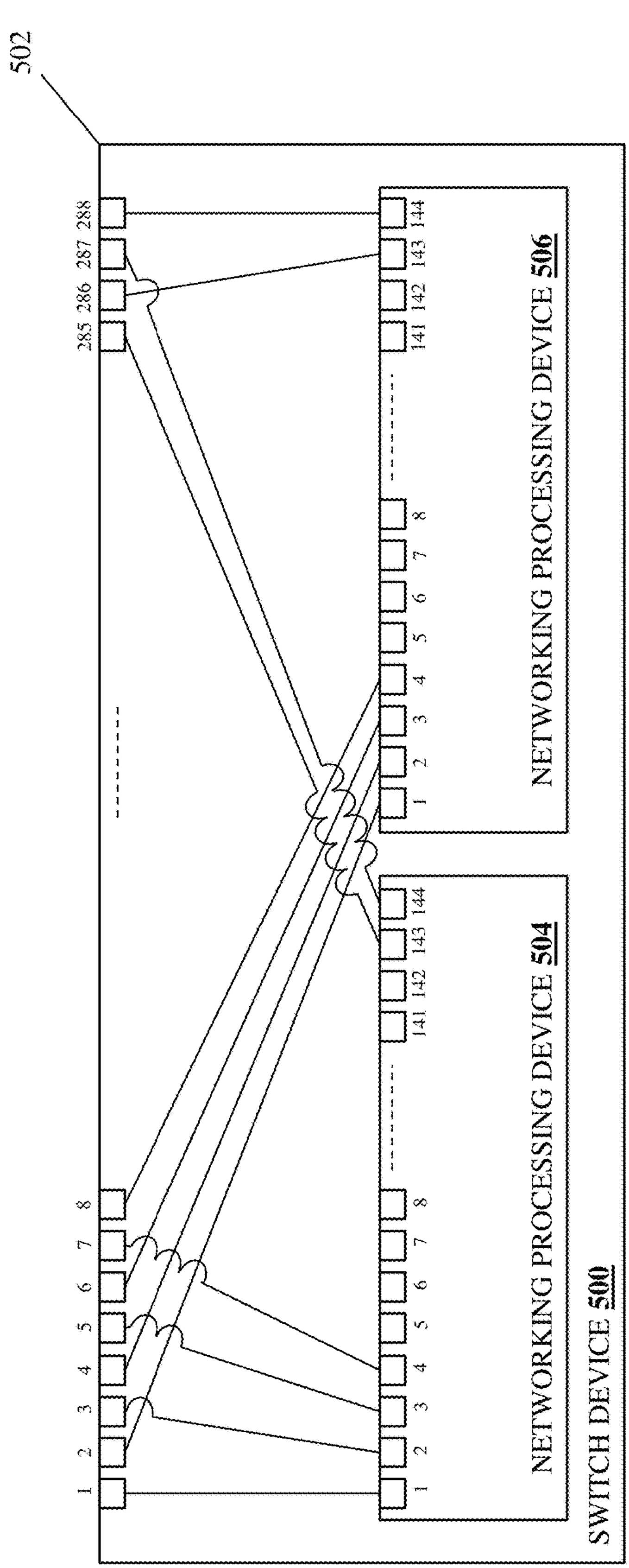
FIG. 5B is a schematic view illustrating an embodiment of the conventional switch device of FIG. 5A.

Referring now to FIGS. 5A and 5B, an embodiment of a conventional switch device 500 utilized in conventional racked GPU systems is illustrated. The conventional switch device 500 includes a chassis 502 that houses the components of the conventional switch device 500, only some of which are illustrated and described below. In the illustrated example, the chassis 502 houses two networking processing devices 504 and 506 (e.g., two "Quantum-3" switching ASICs in switch devices used in the "NVL72" racked GPU systems discussed above), with each networking processing device including 144 networking processing device interfaces.

The chassis 502 also includes four connectors 508 providing 288 connector interfaces (shown in FIG. 5B). Continuing with the example of the "NVL72" racked GPU systems discussed above, the networking processing devices 504 and 506 and the connectors 508 are coupled to each other, with each of the 144 networking processing device interfaces on the networking processing device 504 connected to the "odd" connector interfaces provided by the connectors 508 (i.e., with the "1" networking processing device interface on the networking processing device 504 connected to the "1" connector interface provided by the connectors 508, the "2" networking processing device interface on the networking processing device 504 connected to the "3" connector interface provided by the connectors 508, and so on), and each of the 144 networking processing device interfaces on the networking processing device 506 connected to the "even" connector interfaces provided by the connectors 508 (i.e., with the "1" networking processing device interface on the networking processing device 506 connected to the "2" connector interface provided by the connectors 508, the "2" networking processing device interface on the networking processing device 506 connected to the "4" connector interface provided by the connectors 508, and so on).

As illustrated in FIG. 5A, the coupling of the networking processing devices 504 and 506 to the connectors 508 may be provided by cabling. Continuing with the example of the "NVL72" racked GPU systems discussed above, four "Y" cables 510 may be provided, with each "Y" cable 510 connected to a respective one of the connectors 508, and to both of the networking processing devices 504 and 506. Furthermore, a power coupling 512 may be located between pairs of the connectors 508. Finally, while not identified with element numbers, one of skill in the art in possession of the present disclosure will recognize the cooling system that is provided for the networking processing devices 504 and 506 and that is illustrated in FIG. 5A.

Figure 6C:
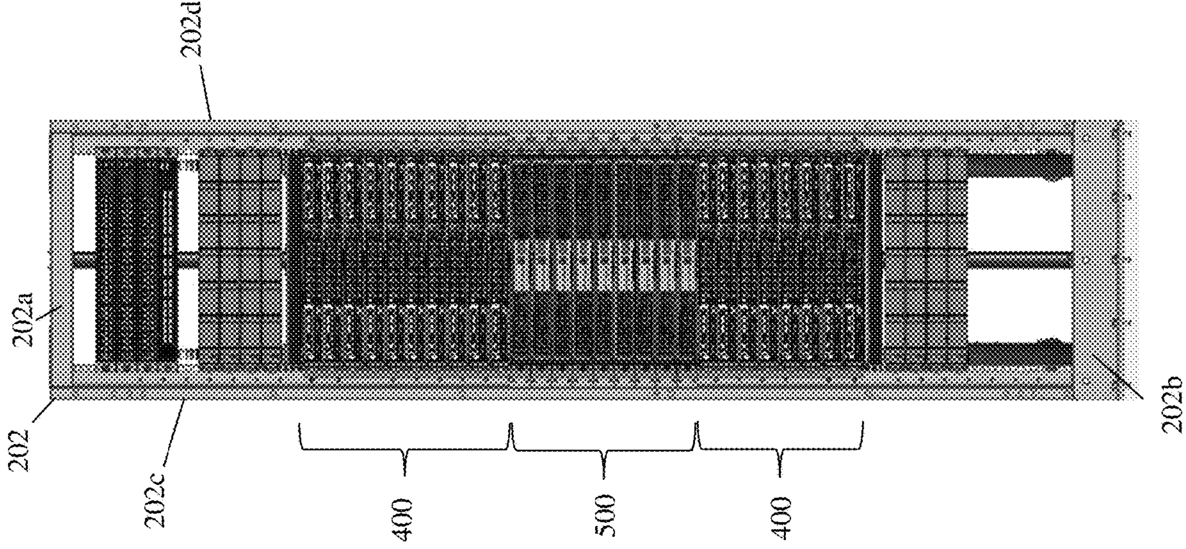
FIG. 6C is a front view illustrating an embodiment of the conventional racked GPU system of FIGS. 6A and 6B.

With reference to FIGS. 6A, 6B, and 6C, a conventional racked GPU system 600 is illustrated. As can be seen in FIG. 6A, the conventional racked GPU system 600 illustrates how the rack chassis 202 on the rack system 200 may include a rack power system 602 that is located at the rear of the rack chassis 202, with the conventional passive cable cartridge 300 mounted to the rack chassis 202 such that rack power system 602 is located in the spacing 306 defined between the cable cartridge towers 304, and the compute device connectors 304*a* and 304*b* and the switch device connectors 304*c* face the device housings 204 defined by the rack chassis 202.

As can be seen in FIGS. 6B and 6C, the conventional racked GPU system 600 is provided by positioning a plurality of the conventional compute devices 400 in the device housings 204 defined by the rack chassis 202 in the rack system 200 to connect them to the compute device connectors 304*a* and 304*b* provided by the conventional passive cable cartridge 300, and positioning a plurality of the conventional switch devices 500 in the device housings 204 defined by the rack chassis 202 in the rack system 200 to connect them to the switch device connectors 304*c* provided by the conventional passive cable cartridge 300 (as well as to connect the power coupling 512 on each switch device 500 to the rack power system 602). As will be appreciated by one of skill in the art in possession of the present disclosure, the embodiment illustrated in FIGS. 6A-6C provides an example of the "NVL72" racked GPU systems discussed above, with ten of the conventional compute devices 400 positioned in respective device housings 204 in the rack chassis 202 and connected to the compute device connectors 304*a* on the conventional passive cable cartridge 300, nine of the conventional switch devices 500 positioned in respective device housings 204 in the rack chassis 202 and connected to the switch device connectors 304*c* on the conventional passive cable cartridge 300, and eight of the conventional compute devices 400 positioned in respective device housings 204 in the rack chassis 202 and connected to the compute device connectors 304*b* on the conventional passive cable cartridge 300.

Figure 7A:
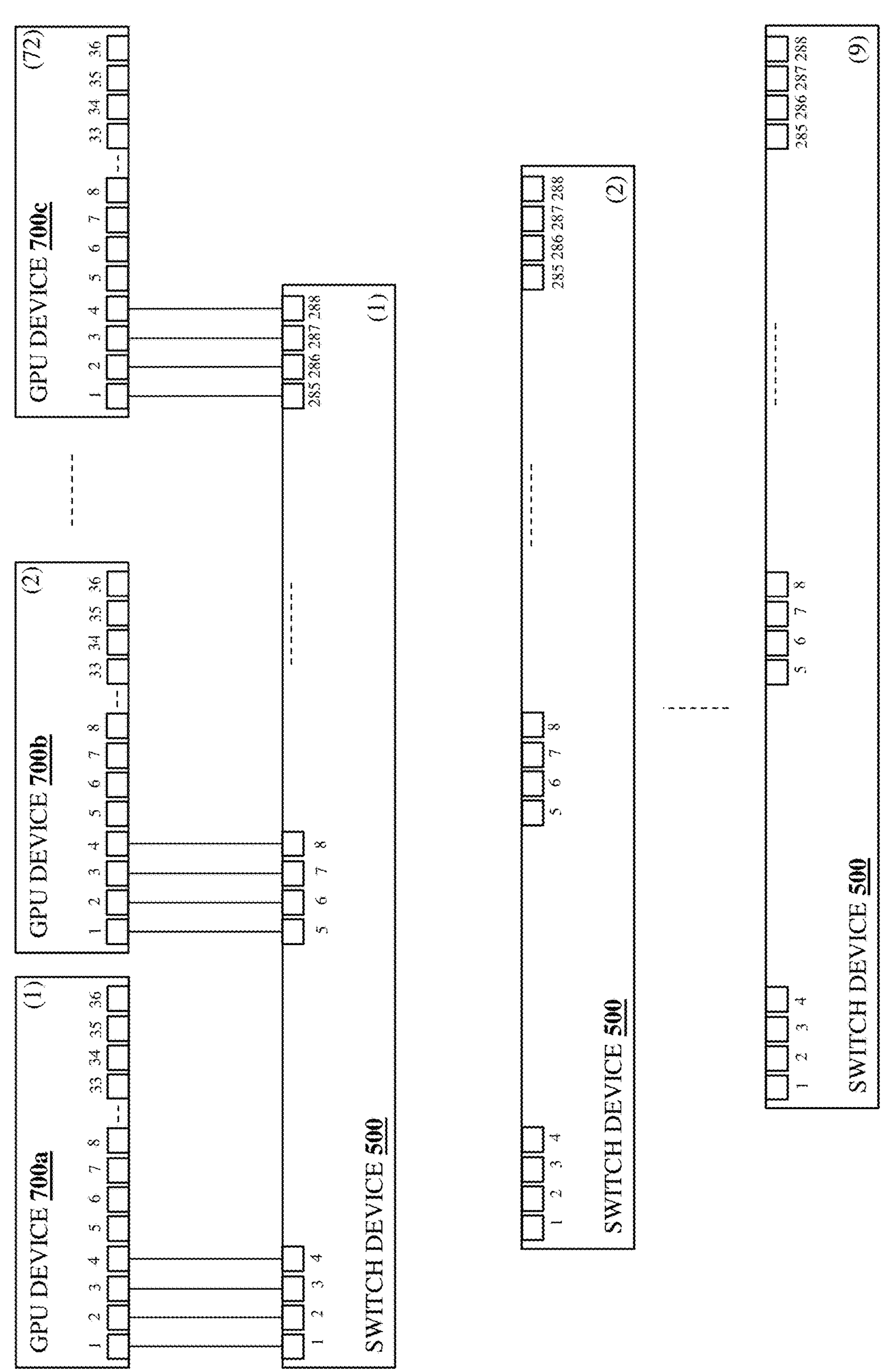
FIG. 7A is a schematic view illustrating some of the connections provided by the conventional passive cable cartridge in the conventional racked GPU system of FIGS. 6A-6C between the switch devices and the GPU devices in the compute devices.
Figure 7B:
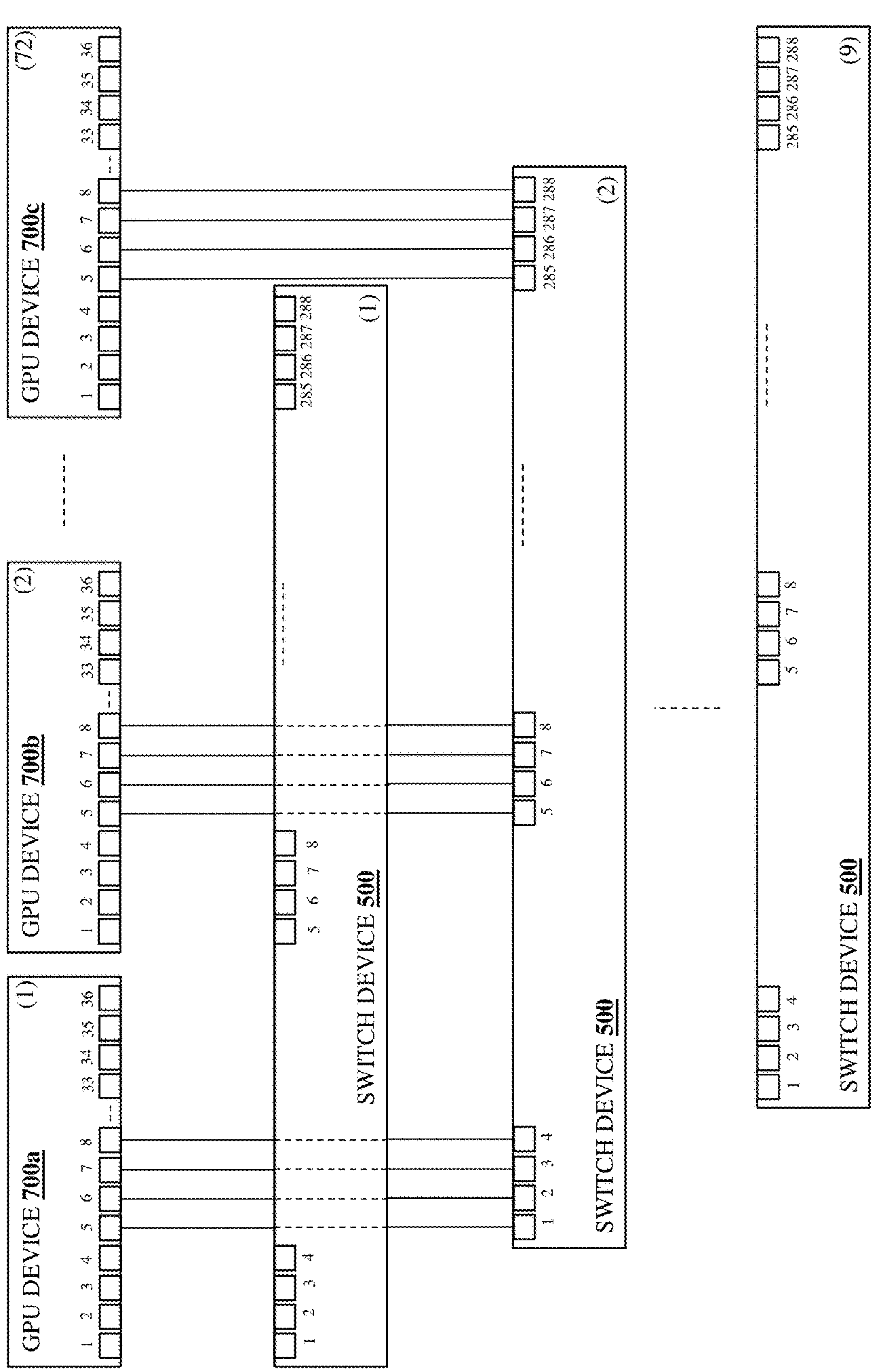
FIG. 7B is a schematic view illustrating some of the connections provided by the conventional passive cable cartridge in the conventional racked GPU system of FIGS. 6A-6C between the switch devices and the GPU devices in the compute devices.
Figure 7C:
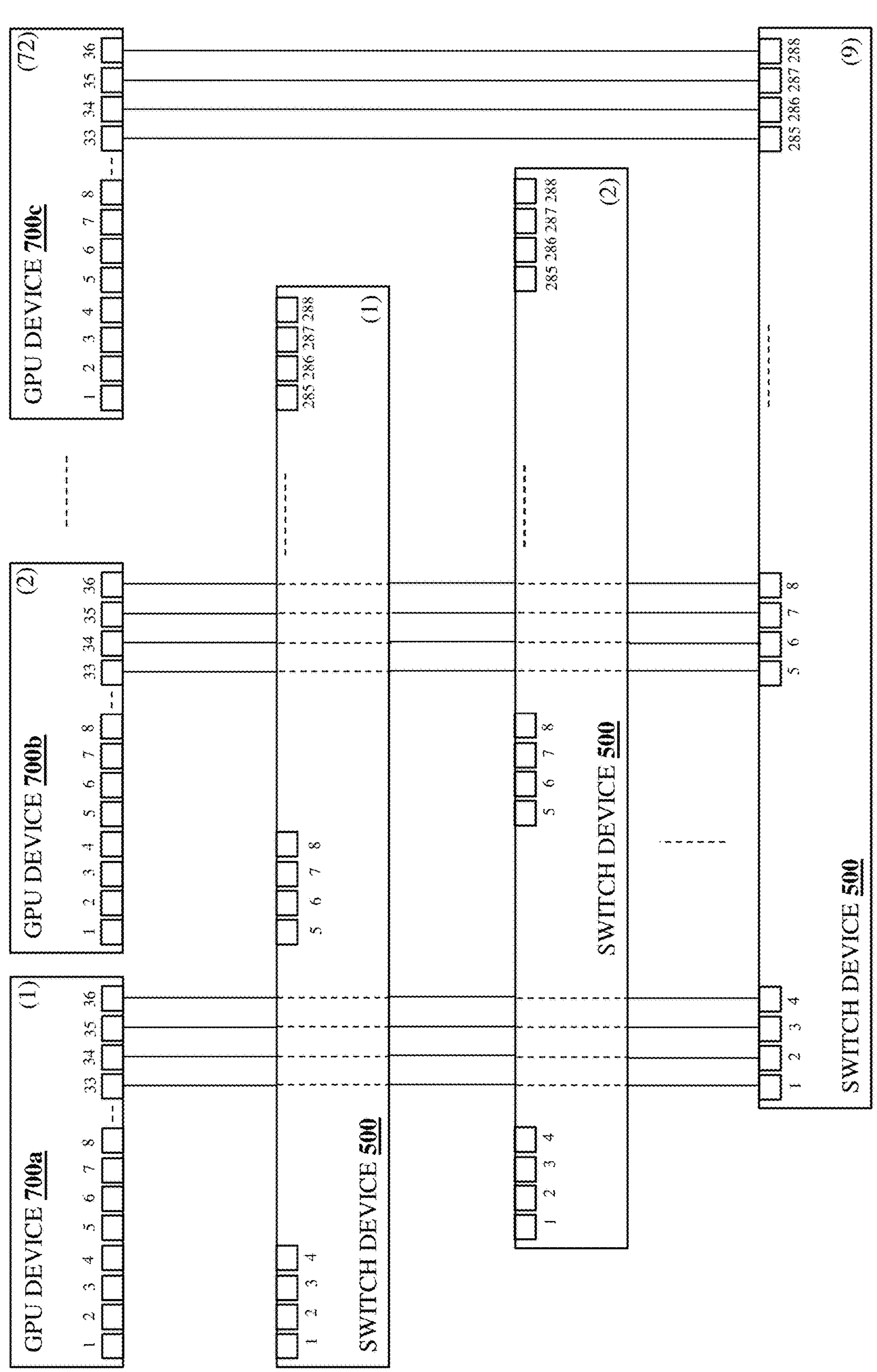
FIG. 7C is a schematic view illustrating some of the connections provided by the conventional passive cable cartridge in the conventional racked GPU system of FIGS. 6A-6C between the switch devices and the GPU devices in the compute devices.

With reference to FIGS. 7A, 7B, and 7C, some of the connections provided between the GPU devices in the conventional compute devices 400 and the conventional switch devices 500 by the conventional passive cable cartridge 300 are illustrated, and one of skill in the art in possession of the present disclosure will recognize how the unillustrated connections are provided similarly as those illustrated and described below. In FIGS. 7A-7C, the GPU devices provided in the conventional compute devices 400 in the conventional racked GPU system 600 are renumbered to GPU devices 700*a*, 700*b*, and up to 700*c*, and in the examples of the "NVL72" racked GPU systems discussed above, the 18 conventional compute devices 400 provide 4 GPU devices each to provide (18*4=) 72 GPU devices that are coupled to the 9 conventional switch devices 500. FIG. 7A illustrates how the "1-4" GPU interfaces on the "first" GPU device 700*a* are connected to the respective "1-4" connector interfaces provided by the connectors 508 on the "first" switch device 500, the "1-4" GPU interfaces on the "second" GPU device 700*b* are connected to the respective "5-8" connector interfaces provided by the connectors 508 on the "first" switch device 500, and the "1-4" GPU interfaces on the "seventy-second" GPU device 700*c* are connected to the respective "285-288" connector interfaces provided by the connectors 508 on the "first" switch device 500.

Similarly, FIG. 7B illustrates how the "5-8" GPU interfaces on the "first" GPU device 700*a* are connected to the respective "1-4" connector interfaces provided by the connectors 508 on the "second" switch device 500, the "5-8" GPU interfaces on the "second" GPU device 700*b* are connected to the respective "5-8" connector interfaces provided by the connectors 508 on the "second" switch device 500, and the "5-8" GPU interfaces on the "seventy-second" GPU device 700*c* are connected to the respective "285-288" connector interfaces provided by the connectors 508 on the "second" switch device 500. Similarly as well, FIG. 7C illustrates how the "33-36" GPU interfaces on the "first" GPU device 700*a* are connected to the respective "1-4" connector interfaces provided by the connectors 508 on the "ninth" switch device 500, the "33-36" GPU interfaces on the "second" GPU device 700*b* are connected to the respective "5-8" connector interfaces provided by the connectors 508 on the "ninth" switch device 500, and the "33-36" GPU interfaces on the "seventy-second" GPU device 700*c* are connected to the respective "285-288" connector interfaces provided by the connectors 508 on the "ninth" switch device 500.

As discussed above, the inventors of the present disclosure have recognized that the configuration of the conventional racked GPU system 600 (and similar racked GPU systems) operates to limit its GPU density, as the device housings 204 in the rack chassis 202 of the conventional rack system 200 that are used to house the conventional switch devices 500 as described above could otherwise be used to house additional compute devices with additional GPUs. Furthermore, as also discussed above, the conventional passive cable cartridge 300 discussed above requires that all nine conventional switch devices 500 be connected thereto in order to provide communicative connectivity between any conventional compute devices 400 used in the conventional racked GPU system 600, regardless of how many conventional compute devices 400 are actually provided in that conventional racked GPU system 600. As such, users must purchase nine conventional switch devices 500 for their conventional racked GPU system 600 even if they plan on using half of (or less than half of) the maximum of 18 conventional compute devices 400 the conventional racked GPU system 600 is configured to support.

As discussed below, the racked GPU system of the present disclosure increases GPU density relative to such conventional racked GPU systems, while allowing the racked GPU system to be "scaled down" by providing less than its maximum number of switch devices when less than its maximum number of compute devices are used. In general, the racked GPU system of the present disclosure increases GPU density by taking advantage of the fact that the communication path for each GPU device to a networking processing device may be provided by a single serial link (e.g., a bidirectional serial link in the examples provided herein) in order to double the number of GPU devices that may be used in the racked GPU system (i.e., relative to the conventional GPU systems described above).

However, the doubling of the number of GPU devices requires a doubling of the number of networking processing devices in order to enable communications between all the GPU devices, and in order to fit the additional GPU devices and networking processing devices in a rack system, the switch devices are removed from the device housings in the rack system and replaced with compute devices that include the additional GPU devices, and the networking processing devices from those switch devices are provided in switch systems that are housed in the rack system adjacent the device housings and connected to the compute devices via an interposer device that is located between those compute devices and switch systems. Finally, the interposer device is configurable to allow fewer than the maximum number of the switch systems that are supported by the interposer device to be used to enable communication between GPU devices when the number of GPU devices being used drops below one or more thresholds, and thus provides compute device/switch system scalability.

Figure 8A:
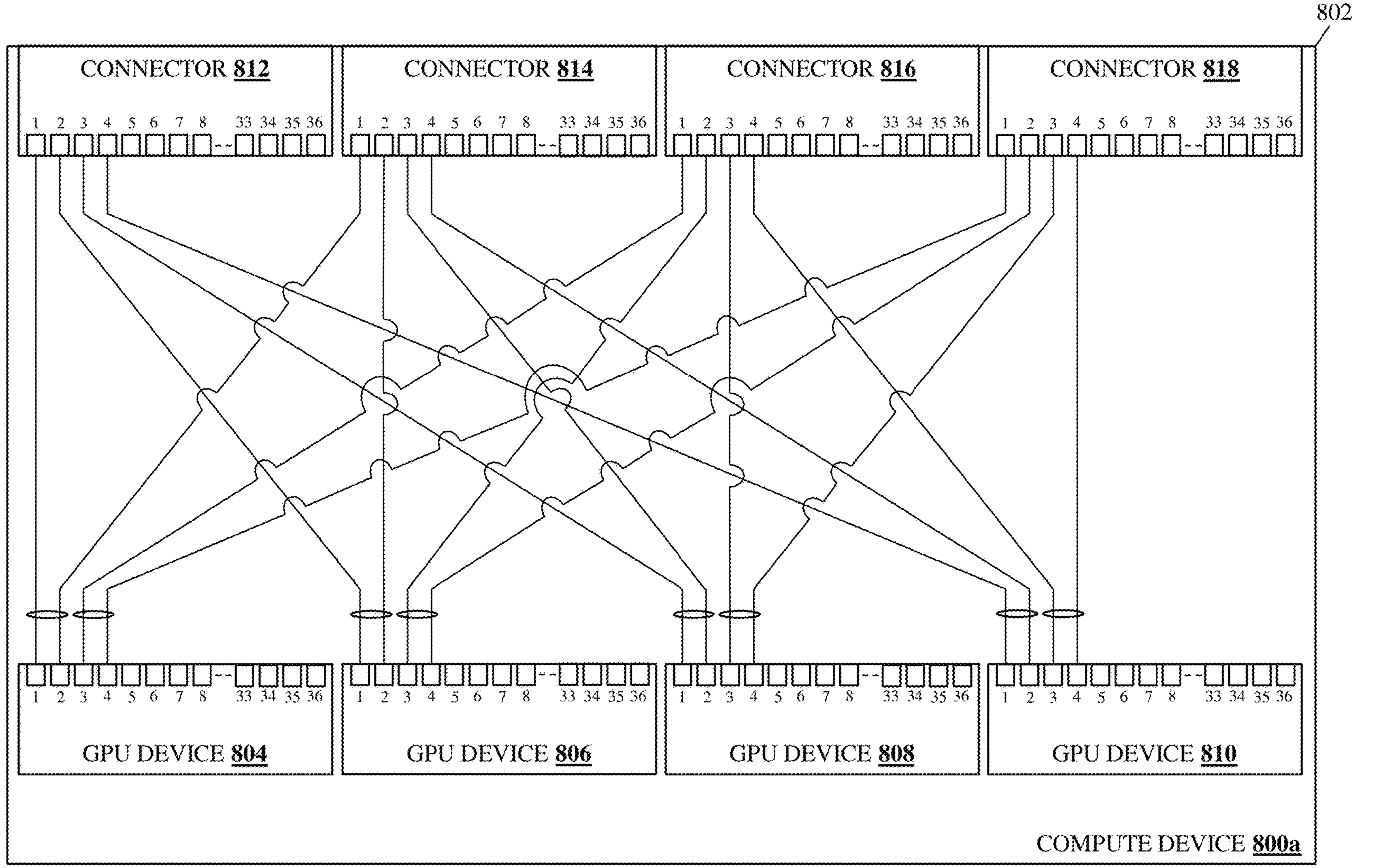
FIG. 8A is a schematic view illustrating an embodiment of a compute device that may be used in the racked GPU system of the present disclosure.

Referring now to FIG. 8A, an embodiment of a compute device 800*a* utilized in the racked GPU system of the present disclosure is illustrated. The compute device 800*a* includes a chassis 802 that houses the components of the compute device 800*a*, only some of which are illustrated and described below. In the illustrated example, the chassis 802 of the compute device 800*a* houses four GPU devices 804, 806, 808 and 810, with each GPU device including 36 GPU interfaces (e.g. 36 GPU bidirectional interfaces in the examples provided herein). In a specific example, each of the GPU devices 804-810 may be provided by the "Blackwell" GPUs described above, although other GPU devices will fall within the scope of the present disclosure as well. While not illustrated or described in detail, one of skill in the art in possession of the present disclosure will appreciate how the compute device 800*a* may include other processing systems while remaining within the scope of the present disclosure as well.

The chassis 802 of the compute device 800*a* also includes four connectors 812, 814, 816, and 818, with each connector including 36 connector interfaces. The GPU devices 804-10 and the connectors 812-818 are coupled to each other, with only a subset of those connections illustrated in FIG. 8A for clarity. As can be seen, each of the "1-4" GPU interfaces on the GPU device 804 is connected to a "1" connector interface on a respective one of the connectors 812-818 (i.e., with the "1" GPU interface on the GPU device 804 connected to the "1" connector interface on the connector 812, the "2" GPU interface on the GPU device 804 connected to the "1" connector interface on the connector 814, the "3" GPU interface on the GPU device 804 connected to the "1" connector interface on the connector 816, and the "4" GPU interface on the GPU device 804 connected to the "1" connector interface on the connector 818).

Similarly, each of the "1-4" GPU interfaces on the GPU device 806 is connected to a "2" connector interface on a respective one of the connectors 812-818 (i.e., with the "1" GPU interface on the GPU device 806 connected to the "2" connector interface on the connector 812, the "2" GPU interface on the GPU device 806 connected to the "2" connector interface on the connector 814, the "3" GPU interface on the GPU device 806 connected to the "2" connector interface on the connector 816, and the "4" GPU interface on the GPU device 806 connected to the "2" connector interface on the connector 818). Similarly as well, each of the "1-4" GPU interfaces on the GPU device 808 is connected to a "3" connector interface on a respective one of the connectors 812-818 (i.e., with the "1" GPU interface on the GPU device 808 connected to the "3" connector interface on the connector 812, the "2" GPU interface on the GPU device 808 connected to the "3" connector interface on the connector 814, the "3" GPU interface on the GPU device 808 connected to the "3" connector interface on the connector 816, and the "4" GPU interface on the GPU device 808 connected to the "3" connector interface on the connector 818).

Similarly as well, each of the "1-4" GPU interfaces on the GPU device 810 is connected to a "4" connector interface on a respective one of the connectors 812-818 (i.e., with the "1" GPU interface on the GPU device 810 connected to the "4" connector interface on the connector 812, the "2" GPU interface on the GPU device 810 connected to the "4" connector interface on the connector 814, the "3" GPU interface on the GPU device 810 connected to the "4" connector interface on the connector 816, and the "4" GPU interface on the GPU device 810 connected to the "4" connector interface on the connector 818). Furthermore, while not illustrated or described in detail, one of skill in the art in possession of the present disclosure will recognize how the "5-36" GPU interfaces on the GPU devices 804-810 may be connected to the "5-36" connector interfaces on the connectors 812-818 similarly as described above.

As will be appreciated by one of skill in the art in possession of the present disclosure, each of the serial links (e.g., bidirectional serial links in the examples provided herein) that is provided by a respective connected GPU interface/connector interface pair on the GPU devices 804-810 and connectors 812-818 is used to provide 36 communication paths for each GPU device to (e.g., a first communication path for the GPU device 804 using each serial link provided by the connected GPU/connector interfaces 1/1, a second communication path for the GPU device 804 each serial link provided by the connected GPU connector interfaces 2/1, etc.). Furthermore, one of skill in the art in possession of the present disclosure will appreciate how each GPU device may communication with each of the 36 networking processing devices provided in the racked GPU system described below via a respective one of those 36 communication paths.

Figure 8B:
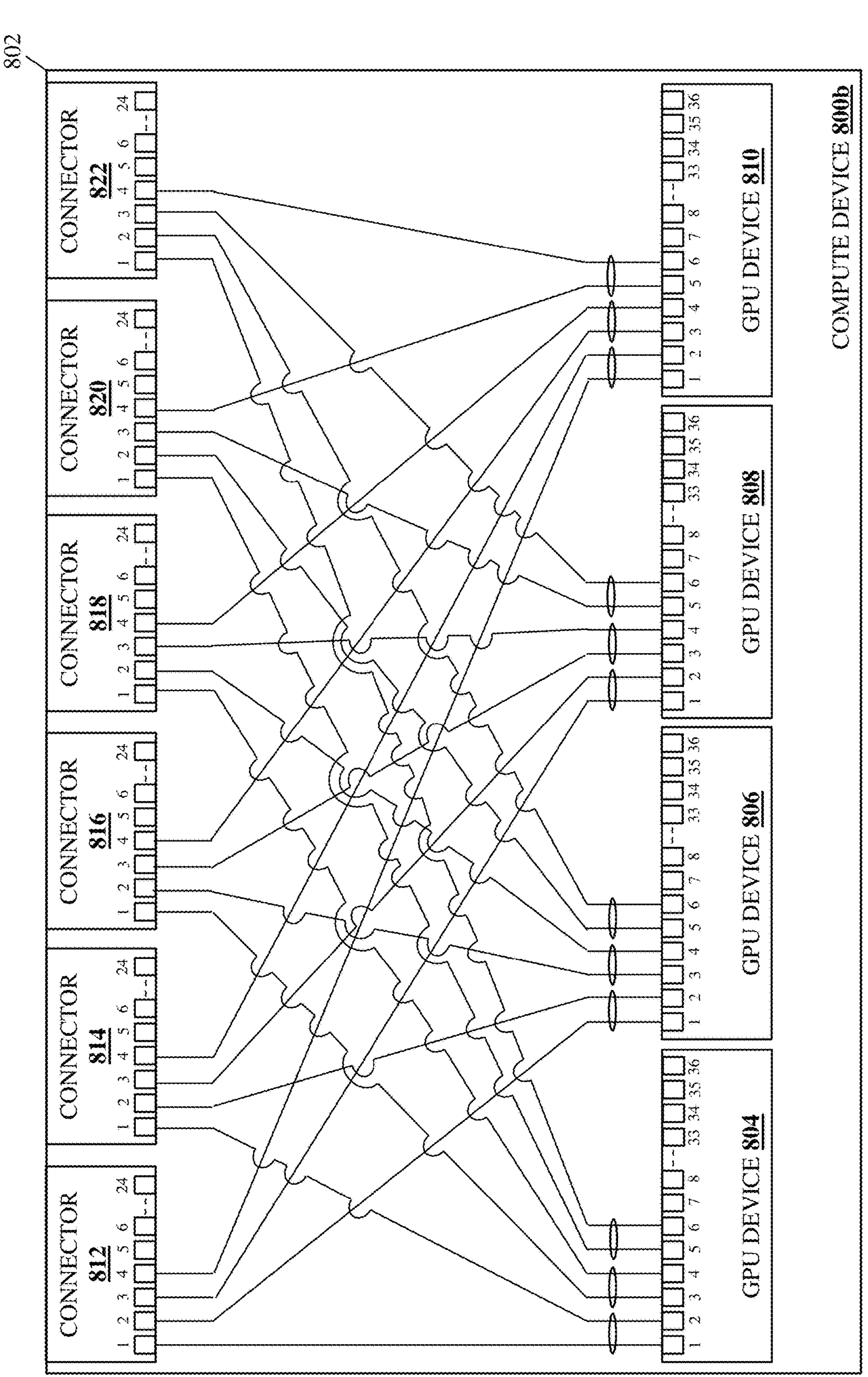
FIG. 8B is a schematic view illustrating an embodiment of a compute device that may be used in the racked GPU system of the present disclosure.

Referring now to FIG. 8B, an embodiment of a compute device 800*b* utilized in the racked GPU system of the present disclosure is illustrated. As will be appreciated by one of skill in the art in possession of the present disclosure, the compute device 800*b* is similar to the compute device 800*a*, and thus similar components have been provided with similar reference numbers. The compute device 800*b* includes the chassis 802 that houses the components of the compute device 800*b*, only some of which are illustrated and described below. In the illustrated example, the chassis 802 of the compute device 800*b* houses four GPU devices 804, 806, 808, and 810, with each GPU device including 36 GPU interfaces (e.g. 36 GPU bidirectional interfaces in the examples provided herein). In a specific example, each of the GPU devices 804-810 may be provided by the "Blackwell" GPUs described above, although other GPU devices will fall within the scope of the present disclosure as well. While not illustrated or described in detail, one of skill in the art in possession of the present disclosure will appreciate how the compute device 800*b* may include other processing systems while remaining within the scope of the present disclosure as well.

The chassis 802 of the compute device 800*b* also includes six connectors 812, 814, 816, 818, 820, and 822, with each connector including 24 connector interfaces. The GPU devices 804-810 and the connectors 812-822 are coupled to each other, with only a subset of those connections illustrated in FIG. 8A for clarity. As can be seen, each of the "1-6" GPU interfaces on the GPU device 804 is connected to a "1" connector interface on a respective one of the connectors 812-822 (i.e., with the "1" GPU interface on the GPU device 804 connected to the "1" connector interface on the connector 812, the "2" GPU interface on the GPU device 804 connected to the "1" connector interface on the connector 814, the "3" GPU interface on the GPU device 804 connected to the "1" connector interface on the connector 816, the "4" GPU interface on the GPU device 804 connected to the "1" connector interface on the connector 818, the "5" GPU interface on the GPU device 804 connected to the "1" connector interface on the connector 820, and the "6" GPU interface on the GPU device 804 connected to the "1" connector interface on the connector 822).

Similarly, each of the "1-6" GPU interfaces on the GPU device 806 is connected to a "2" connector interface on a respective one of the connectors 812-822 (i.e., with the "1" GPU interface on the GPU device 806 connected to the "2" connector interface on the connector 812, the "2" GPU interface on the GPU device 806 connected to the "2" connector interface on the connector 814, the "3" GPU interface on the GPU device 806 connected to the "2" connector interface on the connector 816, the "4" GPU interface on the GPU device 806 connected to the "2" connector interface on the connector 818, the "5" GPU interface on the GPU device 806 connected to the "2" connector interface on the connector 820, and the "6" GPU interface on the GPU device 806 connected to the "2" connector interface on the connector 822). Similarly as well, each of the "1-6" GPU interfaces on the GPU device 808 is connected to a "3" connector interface on a respective one of the connectors 812-822 (i.e., with the "1" GPU interface on the GPU device 808 connected to the "3" connector interface on the connector 812, the "2" GPU interface on the GPU device 808 connected to the "3" connector interface on the connector 814, the "3" GPU interface on the GPU device 808 connected to the "3" connector interface on the connector 816, the "4" GPU interface on the GPU device 808 connected to the "3" connector interface on the connector 818, the "5" GPU interface on the GPU device 808 connected to the "3" connector interface on the connector 820, and the "6" GPU interface on the GPU device 808 connected to the "3" connector interface on the connector 822).

Similarly as well, each of the "1-6" GPU interfaces on the GPU device 810 is connected to a "4" connector interface on a respective one of the connectors 812-822 (i.e., with the "1" GPU interface on the GPU device 810 connected to the "4" connector interface on the connector 812, the "2" GPU interface on the GPU device 810 connected to the "4" connector interface on the connector 814, the "3" GPU interface on the GPU device 810 connected to the "4" connector interface on the connector 816, the "4" GPU interface on the GPU device 810 connected to the "4" connector interface on the connector 818, the "5" GPU interface on the GPU device 810 connected to the "4" connector interface on the connector 820, and the "6" GPU interface on the GPU device 810 connected to the "4" connector interface on the connector 822). Furthermore, while not illustrated or described in detail, one of skill in the art in possession of the present disclosure will recognize how the "7-36" GPU interfaces on the GPU devices 804-810 may be connected to the "5-24" connector interfaces on the connectors 812-822 similarly as described above.

As will be appreciated by one of skill in the art in possession of the present disclosure, each of the serial links (e.g., bidirectional serial links in the examples provided herein) that is provided by a respective connected GPU interface/connector interface pair on the GPU devices 804-810 and connectors 812-422 is used to provide 36 communication paths for each GPU device to (e.g., a first communication path for the GPU device 804 using each serial link provided by the connected GPU/connector interfaces 1/1, a second communication path for the GPU device 804 using each serial link provided by the connected GPU connector interfaces 2/1, etc.). Furthermore, one of skill in the art in possession of the present disclosure will appreciate how each GPU device may communication with each of the 36 networking processing devices provided in the racked GPU system described below via a respective one of those 36 communication paths.

Figure 9A:
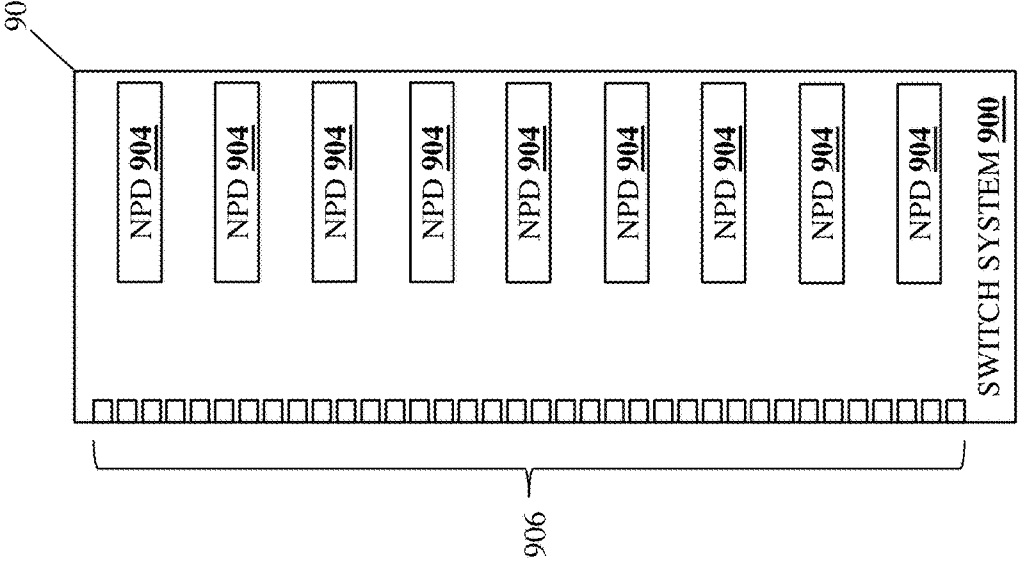
FIG. 9A is a schematic view illustrating an embodiment of a switch system that may be used in the racked GPU system of the present disclosure.

Referring now to FIG. 9A, an embodiment of a switch system 900 utilized in the racked GPU system of the present disclosure is illustrated. As described below, the switch system 900 is utilized in embodiments of the racked GPU system of the present disclosure that allow for the use of up to four of the switch systems 900. However, as discussed below, other switch systems may be provided that are utilized in embodiments of the racked GPU system of the present disclosure that allow for the use of up to six of those switch systems, and one of skill in the art in possession of the present disclosure will appreciate how different numbers of switch systems may be enabled via the teachings of the present disclosure as well.

The switch system 900 includes a chassis 902 that supports the components of the switch system 900, only some of which are illustrated and described below. As described below, the chassis 902 may be provided by circuit board(s), sheet metal, and/or other chassis materials that one of skill in the art in possession of the present disclosure would recognize as providing the functionality described below. In the illustrated example, the chassis 902 supports nine Networking Processing Devices (NPDs) 904, although as described below switch systems provided according to the teachings of the present disclosure may support different numbers of networking processing devices while remaining within the scope of the present disclosure as well. In the illustrated example, the chassis 902 also supports thirty-six switch system connectors 906 that may be coupled to each of the networking processing devices 904 as described in further detail below.

Figure 9B:
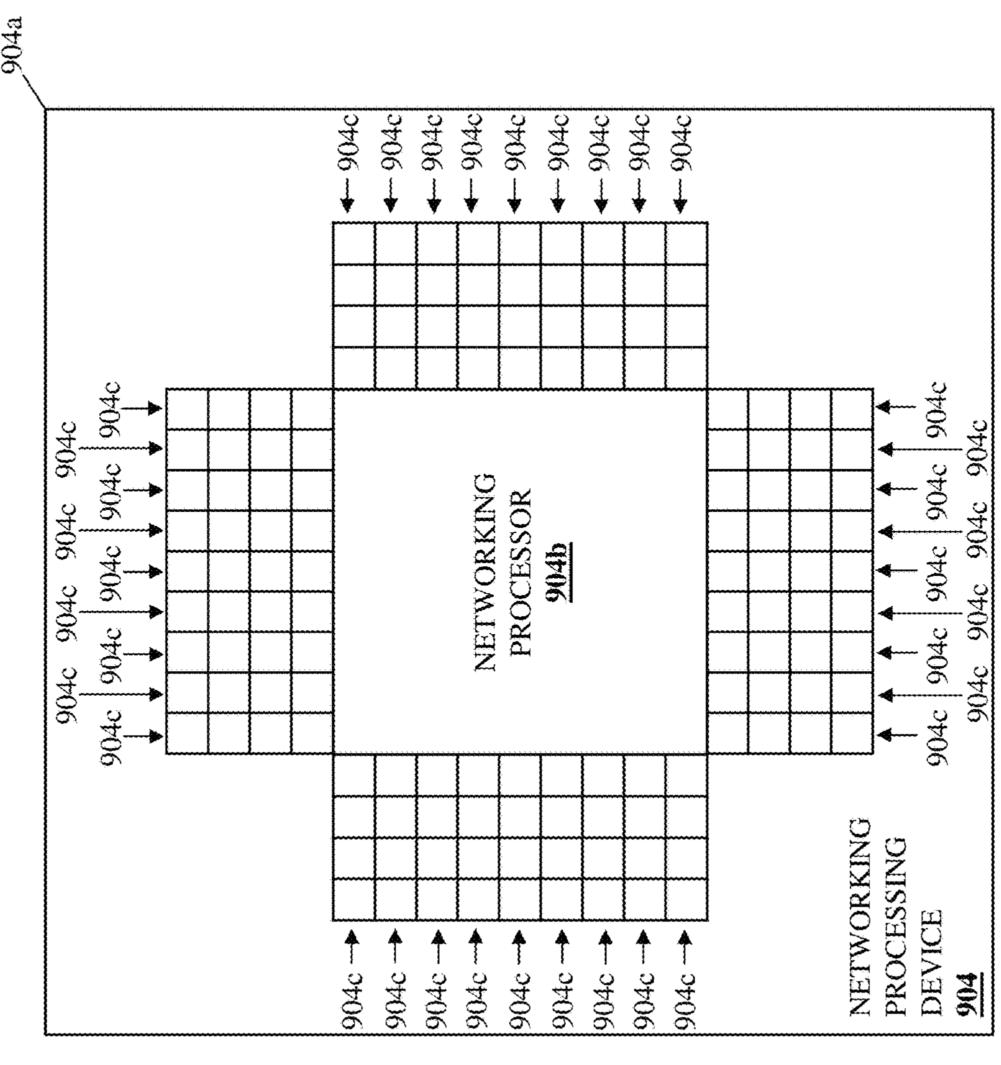
FIG. 9B is a schematic view illustrating an embodiment of a networking processing device that may be included in the switch system of FIG. 9A.

With reference to FIG. 9B, an embodiment of one of the networking processing devices 904 is illustrated, and one of skill in the art in possession of the present disclosure will appreciate how each of the networking processing devices 904 discussed above with reference to FIG. 9A may be provided by the networking processing device 904 of FIG. 9B. In the illustrated example, the networking processing device 904 includes a circuit board 904*a*, and a networking processor 904*b* that is mounted to the circuit board 904*a* and that may be provided by a switching ASIC (e.g., the "Quantum-3" ASIC described above) and/or other networking processors that would be apparent to one of skill in the art in possession of the present disclosure. In the illustrated example, the networking processing device 904 also includes thirty-six networking processor connectors 904*c* (e.g., thirty-six networking processor connectors each including four bidirectional serial interfaces in the examples provided herein).

Figure 9C:
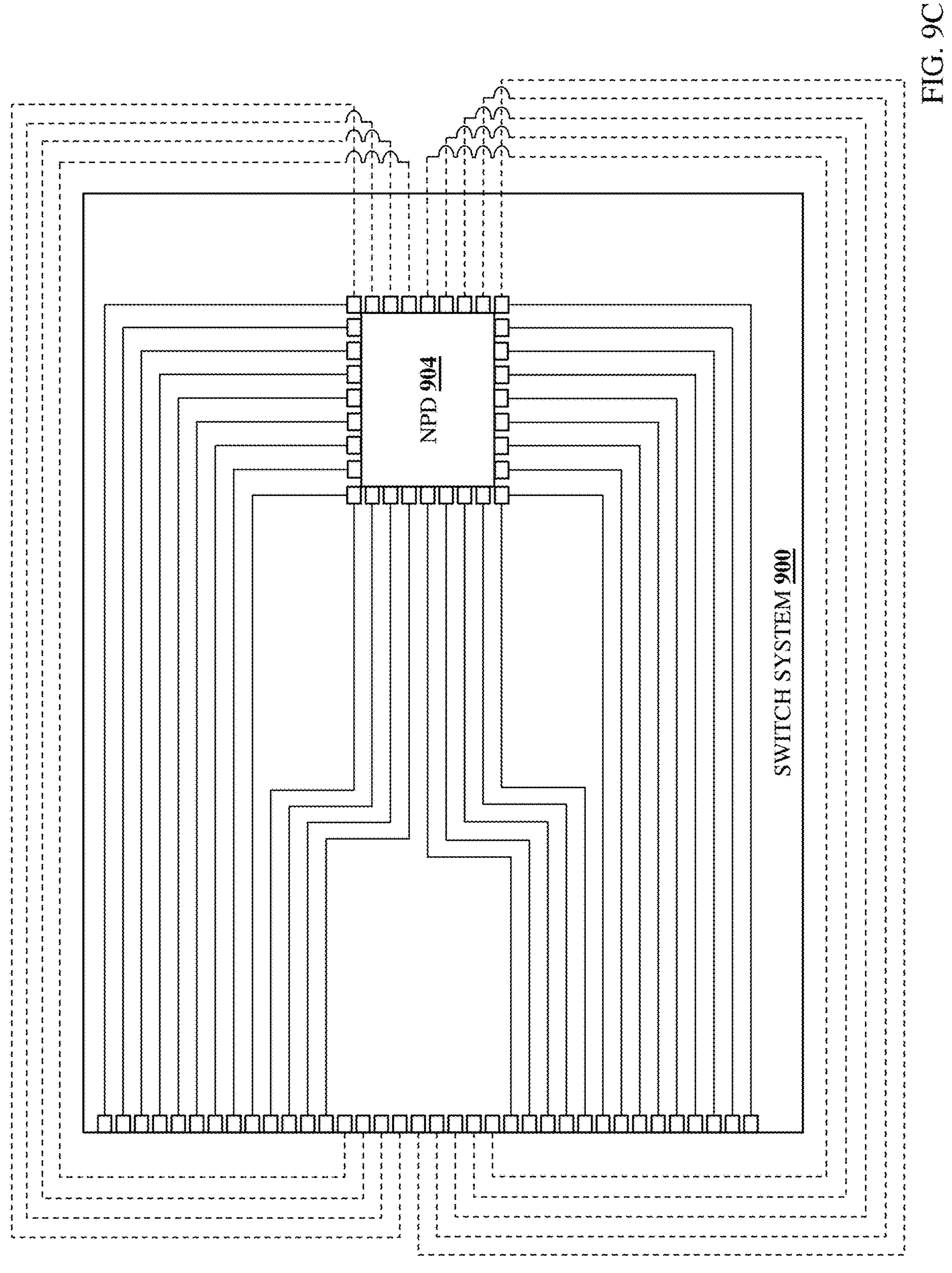
FIG. 9C is a partial schematic view illustrating an embodiment of connectivity for the networking processing device of FIG. 9B in the switch system of FIG. 9A.

With reference to FIG. 9C, an embodiment of the connections between one of the networking processing devices 904 and the thirty-six switch system connectors 906 on the switch system 900 are illustrated, and while element numbers have been omitted for clarity, one of skill in the art in possession of the present disclosure will appreciate how the thirty-six switch system connectors 906 discussed above with reference to FIG. 9A are represented by the boxes provided on the left side of the switch system 900 in FIG.

9C, while the thirty-six networking processor connectors 904*c* on the networking processing device 904 discussed above with reference to FIG. 9B are represented by the boxes provided around the perimeter of the networking processing device 904 in FIG. 9C. As can be seen, each of the thirty-six networking processor connectors 904*c* on the networking processing device 904 may be connected to a respective one of the thirty-six switch system connectors 906, and one of skill in the art in possession of the present disclosure will appreciate how the dashed lines identify connections that may be provided on the chassis 902 but that are drawn off the chassis 902 in FIG. 9C for clarity. As discussed below, the connections provided between any networking processor connector 904*c* and its connected switch system connector 906 (e.g., the connections that each provided four bidirectional serial interfaces in the examples provided herein) may be included in a twin-axial breakout cable, a circuit board, and/or using other connection techniques that would be apparent to one of skill in the art in possession of the present disclosure.

Figure 9D:
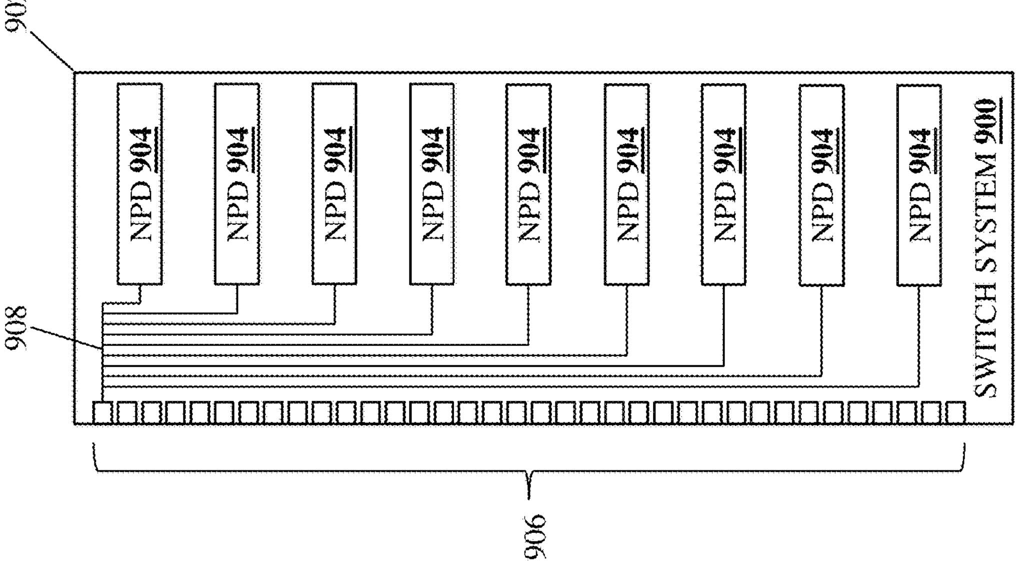
FIG. 9D is a partial schematic view illustrating an embodiment of connectivity for networking processing devices in the switch system of FIG. 9A.

With reference to FIG. 9D, an embodiment of a connection system 908 that provides connections between a "first" switch system connector 906 on the switch system 900 (i.e., the switch system connector 906 adjacent the "top" of the switch system 900 in FIG. 9D) and each of the networking processing devices 904 on the switch system 900 is illustrated. For example, the connection system 908 may be provided by a breakout cable (e.g., a copper twin-axial breakout cable) that includes a primary connector connected to the "first" switch system connector 906, as well as nine breakout connectors that extend from the primary connector via respective breakout sub-cables that are provided with respective lengths that allow each of those nine breakout connectors to connect to a respective one of the networking processing devices 904. However, while a specific example utilizing copper twin-axial cabling (i.e., similar to the "NVL72" racked GPU systems described above), one of skill in the art in possession of the present disclosure will appreciate how the use of co-packaged optical cabling and/or other networking processing device/connector couplings will fall within the scope of the present disclosure as well.

As will be appreciated by one of skill in the art in possession of the present disclosure, a respective similar connection system may be provided to connect each of the remaining switch system connectors 906 to each of the networking processing devices 904, and in embodiments in which those connection systems are provided by a breakout cable as described above, 18 breakout cables with different breakout sub-cable lengths may be provided to connect pairs of the switch system connectors 906 (e.g., the breakout cable used to connect the "first" switch system connector 906 to each of the networking processing devices 904 as described above will have the appropriate sub-cable lengths to connect the "last" switch system connector 906 (i.e., the switch system connector 906 adjacent the "bottom" of the switch system 900 in FIG. 9D) to each of the networking processing devices 904, the breakout cable used to connect the "second" switch system connector 906 (i.e., the switch system connector 906 immediately adjacent the "first" switch system connector 906 in FIG. 9D) to each of the networking processing devices 904 will have the appropriate sub-cable lengths to connect the "second-to-last" switch system connector 906 (i.e., the switch system connector 906 immediately adjacent the "last" switch system connector 906 in FIG. 9D) to each of the networking processing devices 904, and so on).

Figure 9E:
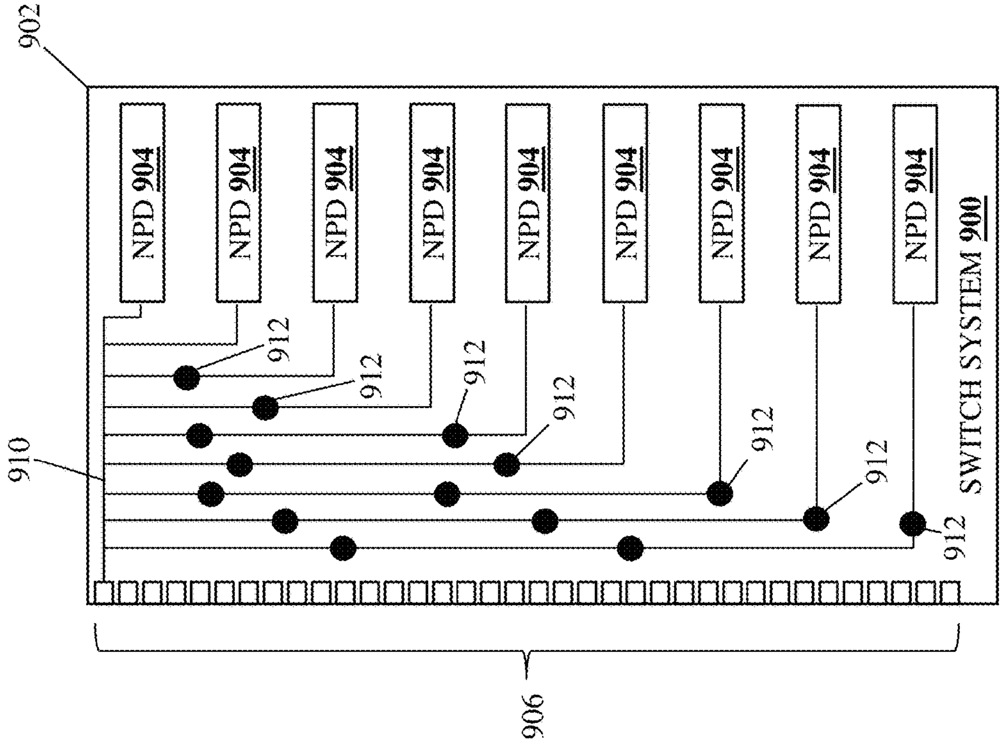
FIG. 9E is a partial schematic view illustrating an embodiment of connectivity for networking processing devices in the switch system of FIG. 9A.

With reference to FIG. 9E, an embodiment of a connection system 910 that provides connections between a "first" switch system connector 906 on the switch system 900 (i.e., the switch system connector 906 adjacent the "top" of the switch system 900 in FIG. 9D) and each of the networking processing devices 904 on the switch system 900 is illustrated. For example, the connection system 908 may be provided by traces that are included in a circuit board that provides the chassis 902 and that extend between the "first" switch system connector 906 and each of the networking processing devices 904. As will be appreciated by one of skill in the art in possession of the present disclosure, the size required for such a circuit board will result in relatively long traces that can introduce signal integrity issues, and thus one or more analog re-timers 912 (represented by black circles in FIG. 9E, only some of which are provided with element numbers for clarity) may be provided along at least some of those traces 912 as illustrated in FIG. 9E to address those signal integrity issues.

Figure 9F:
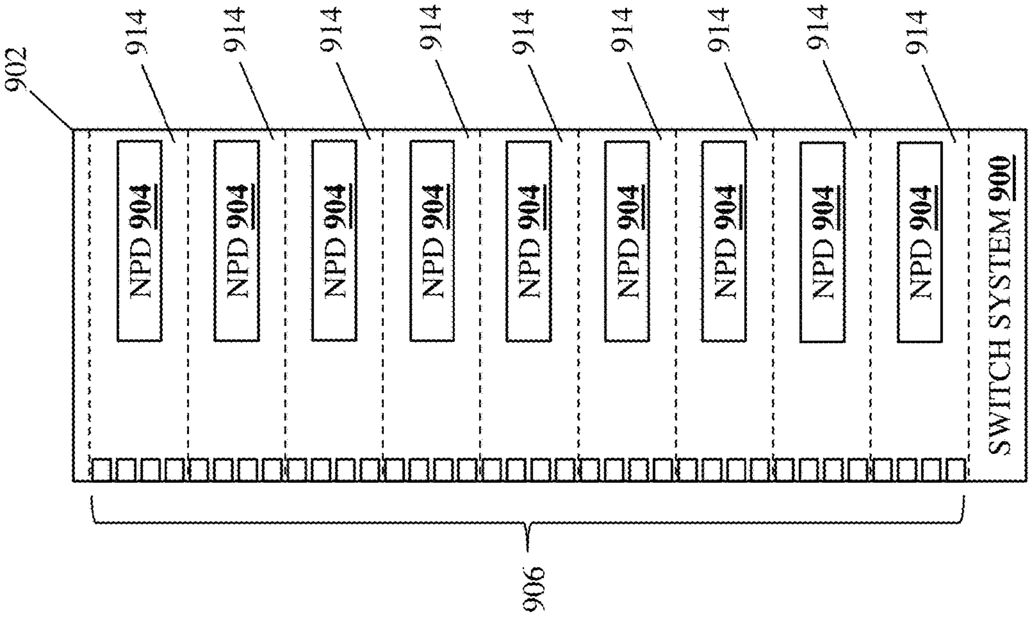
FIG. 9F is a schematic view illustrating an embodiment of the switch system of FIG. 9A.

With reference to FIG. 9F, an embodiment of the switch system 900 is illustrated in which each of the networking processing devices 904 is provided on a respective circuit board 914 (which the boundaries of each circuit board in FIG. 9F illustrated with dashed lines) that may be mounted to the chassis 902 of the switch system 900, with that chassis 902 provided by sheet metal and/or other chassis materials that would be apparent to one of skill in the art in possession of the present disclosure. As will be appreciated by one of skill in the art in possession of the present disclosure, each of the networking processing devices 904 illustrated in the switch system 900 of FIG. 9F may be connected to the switch system connectors 906 using the connection techniques described above. However, while several specific examples of the switch system of the present disclosure have been described, one of skill in the art in possession of the present disclosure will appreciate how the switch systems of the present disclosure may include a variety of components and/or component configurations that will fall within the scope of the present disclosure as well.

Referring now to FIGS. 10A, 10B, 10C, and 10D, an embodiment of an interposer device 1000 utilized in the racked GPU system of the present disclosure is illustrated. The interposer device 1000 includes a chassis 1002 that supports the components of the interposer device 1000, only some of which are illustrated and described below. As described below, the chassis 1002 may be provided by circuit board(s), sheet metal, and/or other chassis materials that one of skill in the art in possession of the present disclosure would recognize as providing the functionality described below. In the illustrated example, the chassis 1002 includes a top edge 1002*a*, a bottom edge 1002*b* that is located opposite the chassis 1002 from the top edge 1002*a*, a pair of opposing side edges 1002*c* and 1002*d* that are located opposite the chassis 1002 from each other and that extend between the top edge 1002*a* and the bottom edge 1002*b*, a switch system connection surface 1002*e* that extends between the top edge 1002*a*, the bottom edge 1002*b*, and the side edges 1002*c* and 1002*d*, and a compute device connection surface 1002*f* that is located opposite the chassis 1002 from the switch system connection surface 1002*d* and that extends between the top edge 1002*a*, the bottom edge 1002*b*, and the side edges 1002*c* and 1002*d*.

Figure 10A:
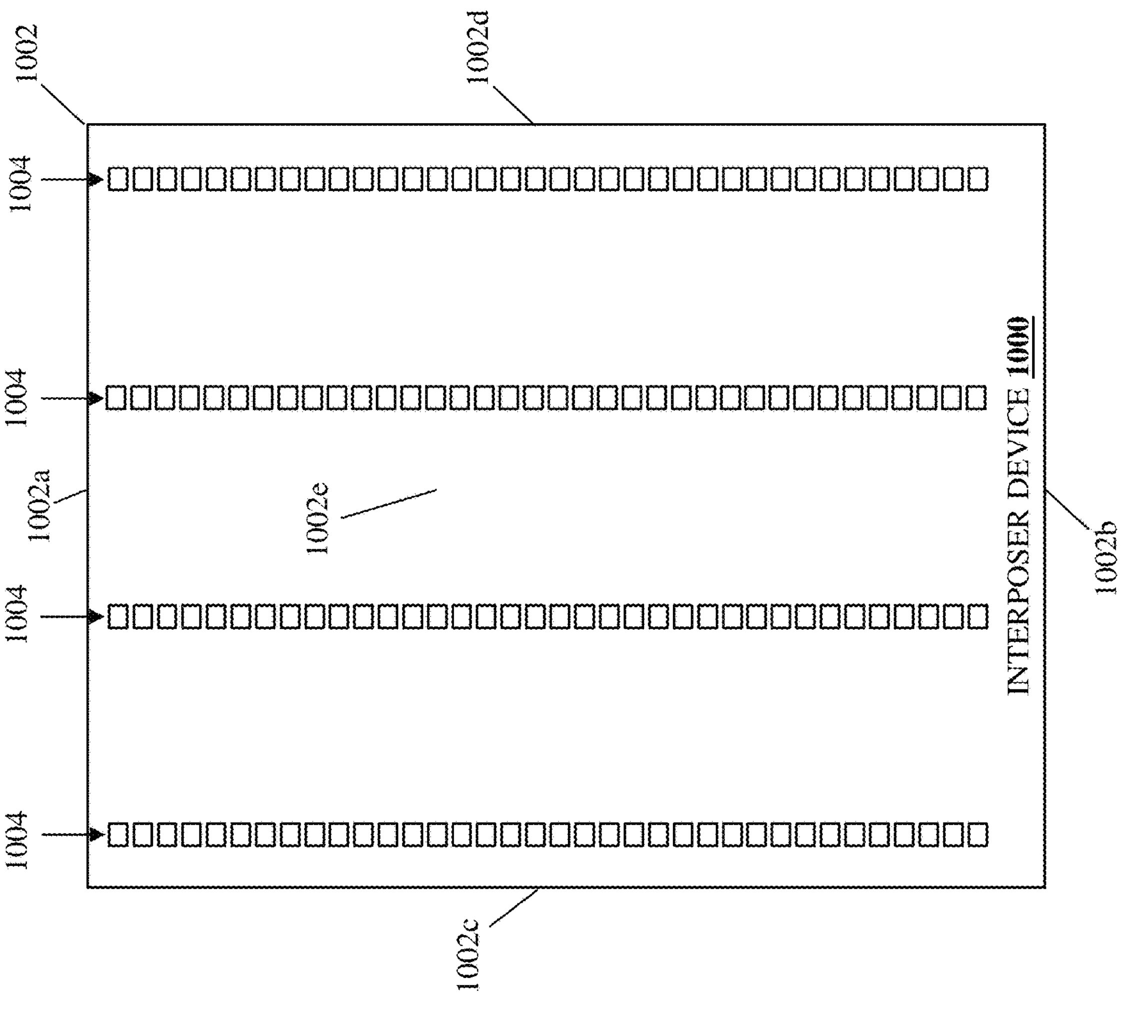
FIG. 10A is a schematic front view illustrating an embodiment of an interposer device that may be used in the racked GPU system of the present disclosure.

As can be seen in the illustrated example of FIG. 10A, four switch system connector groups 1004 are provided on the switch system connection surface 1002*e*, with each switch system connector group 1004 including thirty-six switch system connectors provided in a vertically aligned orientation. Furthermore, as can be seen in the illustrated example of FIG. 10B, thirty-six compute device connector groups 1006 (with every other compute device connector group 1006 provided with an element number in FIG. 10B for clarity) are provided on the compute device connection surface 1002*f*, with each compute device connector group 1006 including four compute device connectors provided in a horizontally aligned orientation. As will be appreciated by one of skill in the art in possession of the present disclosure, the compute device connector groups 1006 are provided on the compute device connection surface 1002*f* such that each of the compute device connectors in those compute device connector groups are vertically aligned with corresponding compute device connectors in the other compute device connector groups (i.e., the "first" compute device connector in each of the compute device connector groups 1006 are vertically aligned, the "second" compute device connector in each of the compute device connector groups 1006 are vertically aligned, the "third" compute device connector in each of the compute device connector groups 1006 are vertically aligned, and the "fourth" compute device connector in each of the compute device connector groups 1006 are vertically aligned).

Figure 10B:
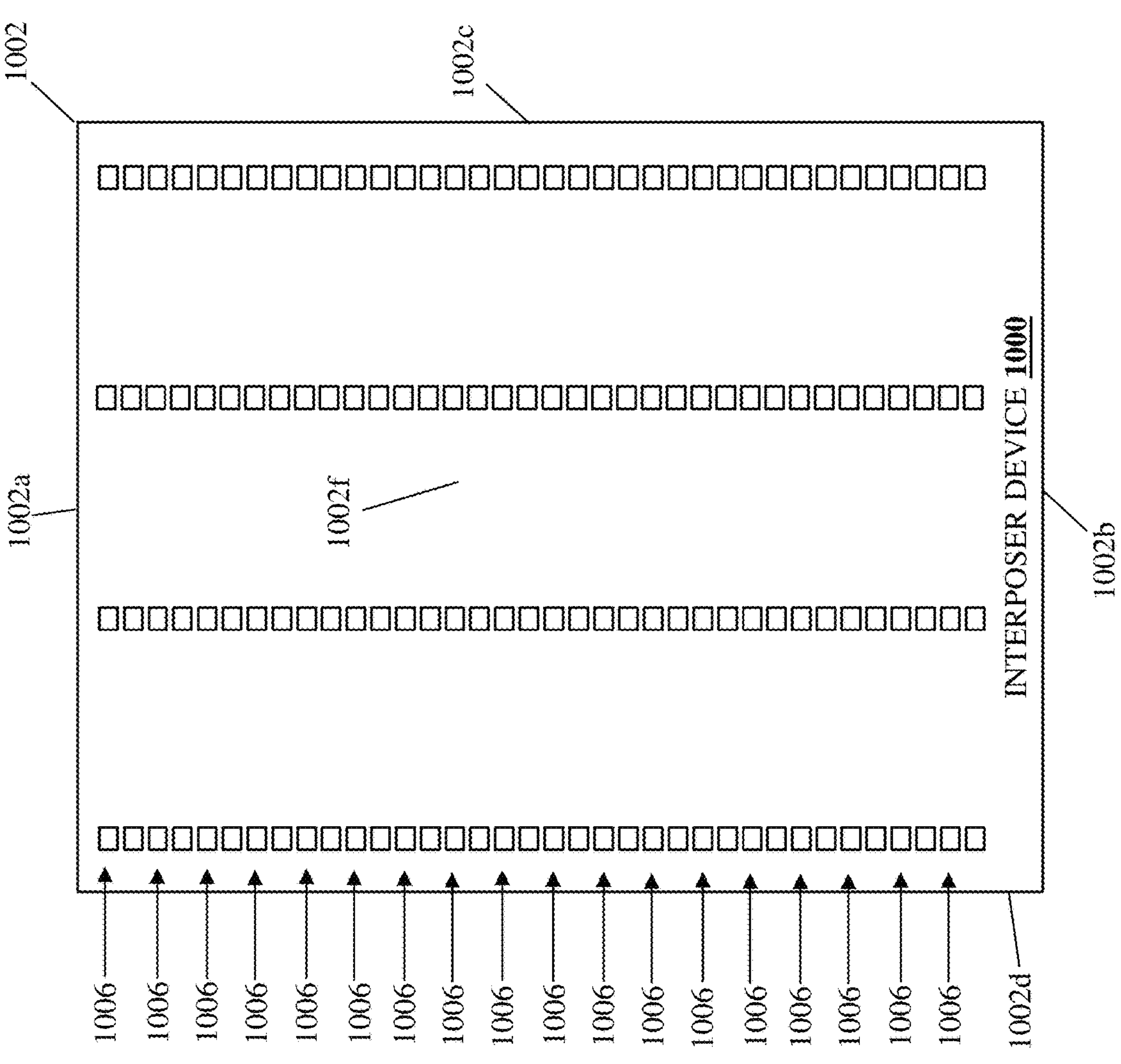
FIG. 10B is a schematic rear view illustrating an embodiment of the interposer device of FIG. 10A.
Figure 10C:
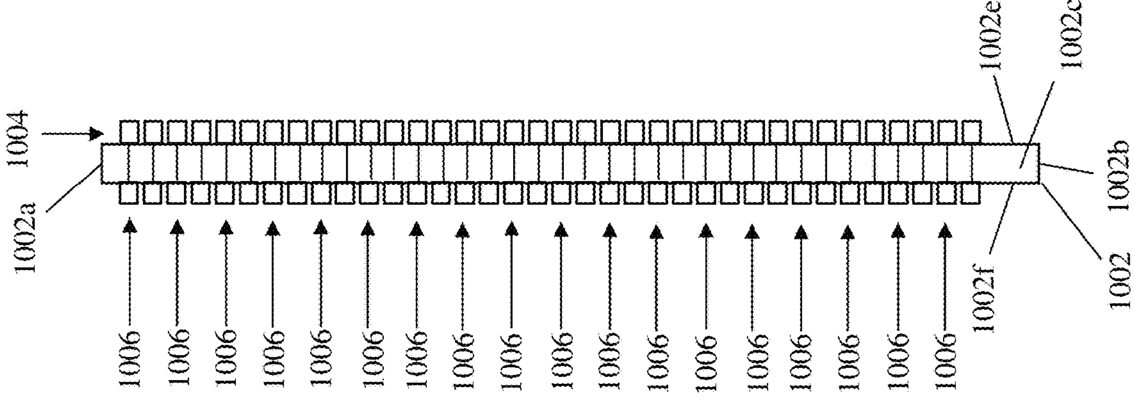
FIG. 10C is a schematic side view illustrating an embodiment of the interposer device of FIGS. 10A and 10B.

As will also be appreciated by one of skill in the art in possession of the present disclosure, each of the switch system connector groups 1006 is located substantially opposite the chassis 1002 from the vertically aligned compute device connectors, and FIG. 10C illustrates how each of the switch system connectors in one of the switch system connector groups 1006 may be connected to the compute device connector that is located immediately opposite the chassis 1002 from it (i.e., the "top" switch system connector in each of the four switch system connector groups 1004 in FIG. 10A are connected to the respective compute device connectors in the "top" compute device connector group 1006 in FIG. 10B that are located immediately opposite the chassis 1002 from them, the "second-from-the-top" switch system connector in each of the four switch system connector groups 1004 in FIG. 10A are connected to the respective compute device connectors in the "second-from-the-top" compute device connector group 1006 in FIG. 10B that are located immediately opposite the chassis 1002 from them, and so on).

Figure 10D:
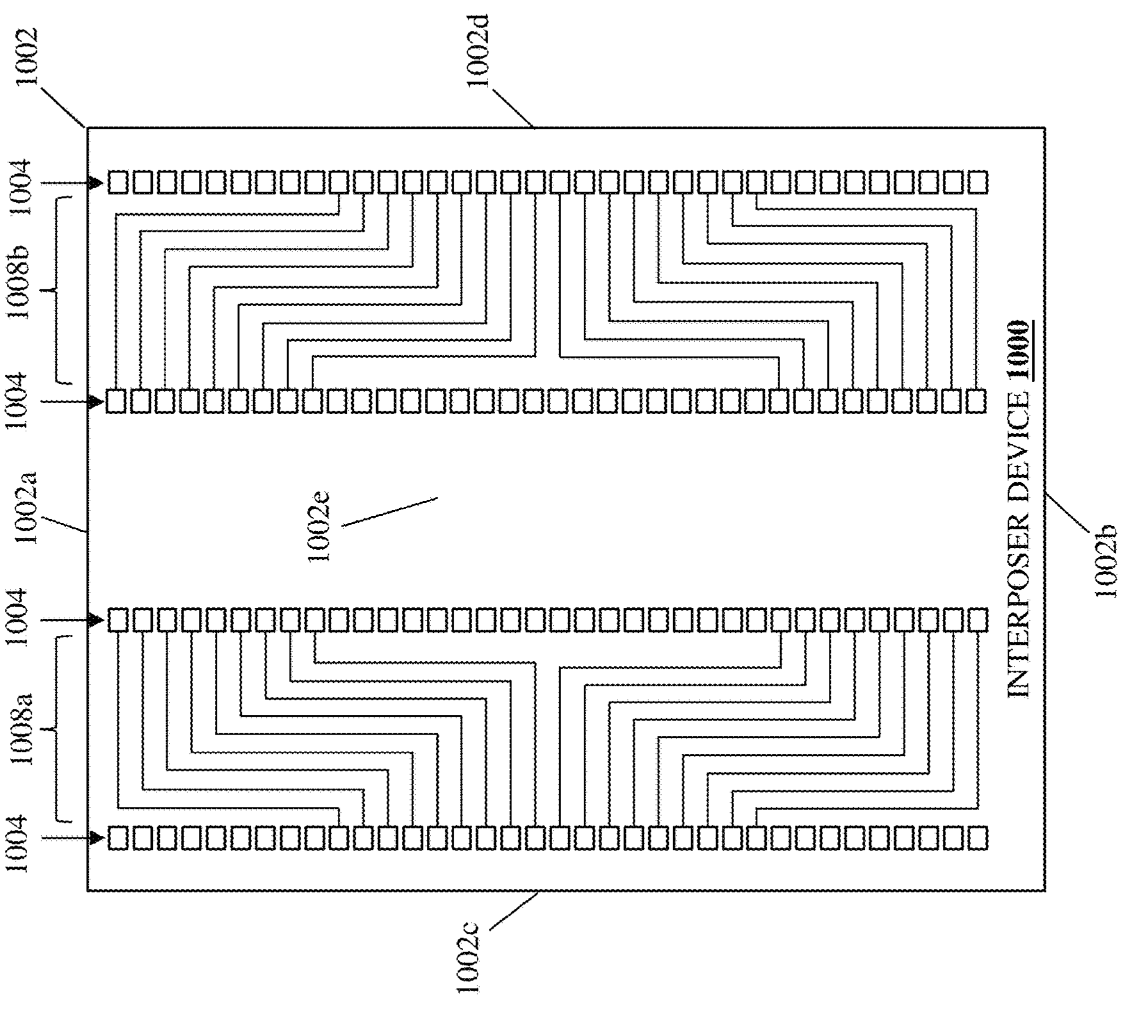
FIG. 10D is a schematic view illustrating an embodiment of reconfiguration connection systems on the interposer device of FIG. 10A-10C.

Furthermore, with reference to FIG. 10D, the interposer device 1000 may include a reconfiguration connection system 1008*a* between a first pair of the switch system connector groups 1004 (e.g., between the two switch connection groups 1004 on the "left" side of the interposer device in FIG. 10D) and a reconfiguration connection system 1008*b* between a second pair of the switch system connector groups 1004 (i.e., between the two switch connection groups 1004 on the "right" side of the interposer device in FIG. 10D). As can be seen in FIG. 10D, the reconfiguration connection system 1008*a* and 1008*b* includes respective connections that connect respective pairs of switch system connectors in its different switch system connectors groups 1004, and as discussed below may include microprocessors, microswitches, and/or other components that one of skill in the art in possession of the present disclosure will recognize are configured to connect and disconnect those switch system connectors depending on which of the switch system connector groups 1004 are connected to a switch system in order to provide the "passive" interposer device reconfigurations described in further detail below.

Figure 11:
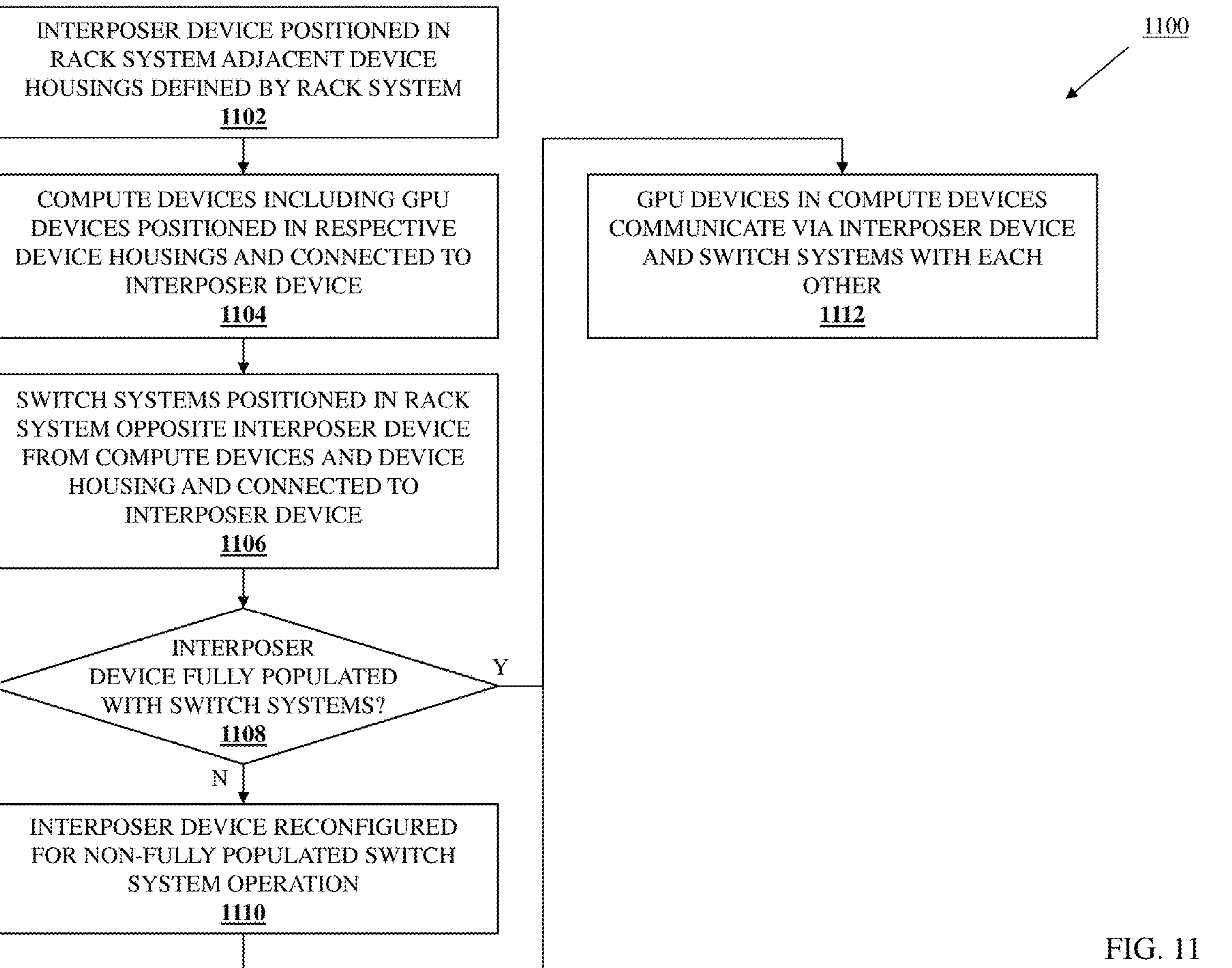
FIG. 11 is a flow chart illustrating an embodiment of a method for providing a racked GPU system.

Referring now to FIG. 11, an embodiment of a method 1100 for providing a racked Graphics Processing Unit (GPU) system is illustrated. As discussed below, the systems and methods of the present disclosure provide a racked GPU system configuration in which all compute device housings defined by a rack system may be used to house compute devices including GPU devices, and networking processing devices are coupled to those GPU devices via an interposer device that is positioned between the compute devices/device housings and switch systems that include the networking processing devices, with the interposer device configurable to allow the number of switch systems required in the racked GPU system to be scaled based on the number of compute device/GPU devices being used. For example, the racked GPU system of the present disclosure may include a rack system defining a plurality of device housings. An interposer device is housed in the rack system adjacent the plurality of device housings. A plurality of compute devices that each include a plurality of Graphics Processing Units (GPU) devices are housed in a respective one of the plurality of the device housings and connected to the interposer device. At least one switch system including a plurality of networking processing devices is housed in the rack system opposite the interposer device from the plurality of compute devices and the plurality of device housings, and connected to the interposer device to communicatively couple each of the plurality of networking processing devices in that switch system to each of the plurality of GPU devices in each of the plurality of compute devices. As such, GPU density is increased relative to conventional racked GPU systems, while also enabling the scaling of networking processing devices based on the number of GPU devices being used.

Figure 12A:
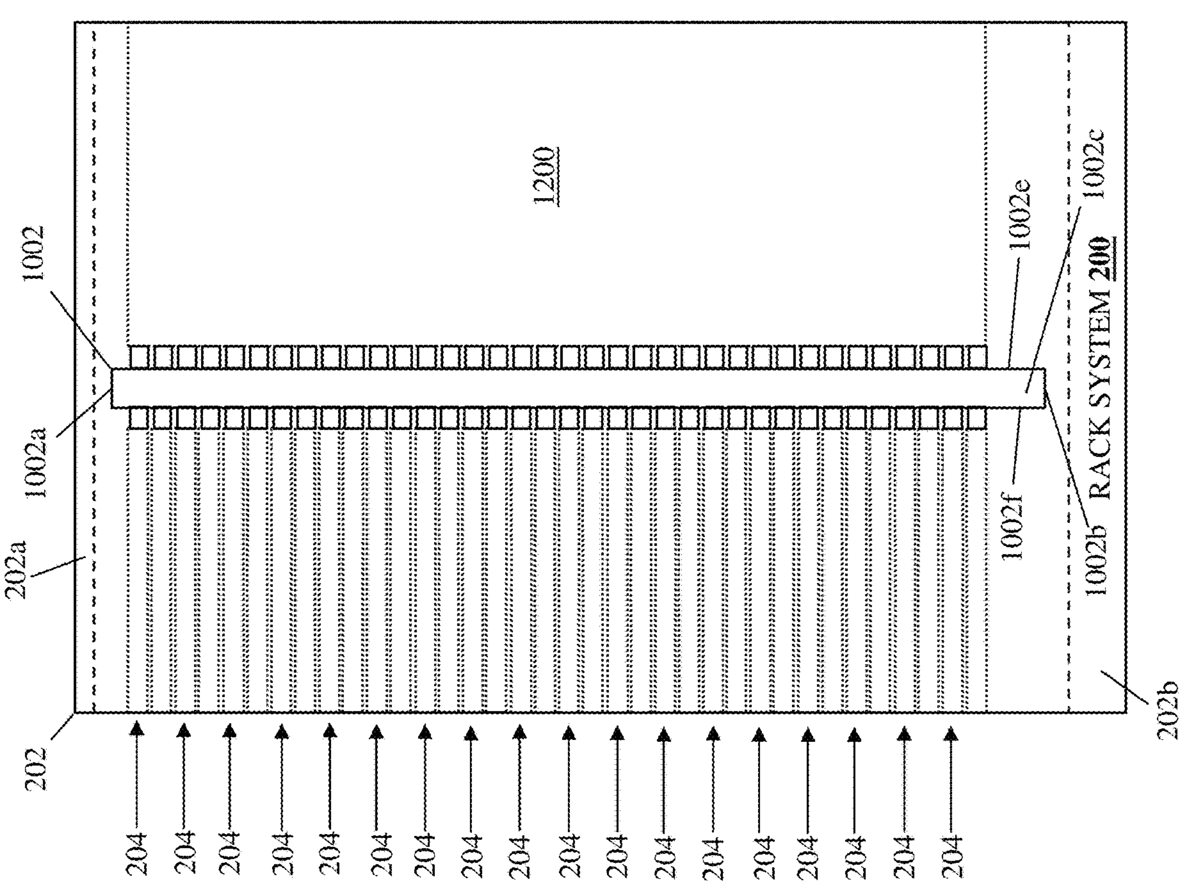
FIG. 12A is a schematic view illustrating an embodiment of the interposer device of FIGS. 10A-10D provided in the rack system of FIG. 2.

The method 1100 begins at block 1102 where an interposer device is positioned in a rack system adjacent device housings defined by the rack system. With reference to FIGS. 2, 10A-10C, and 12A, in an embodiment of block 1102, the interposer device 1000 may be positioned in the rack system 200 adjacent the device housings 204 (with only half of the device housings 204 identified by element numbers in FIG. 12A for clarity) and connected, mounted, and/or otherwise coupled to the rack system 200 using any of a variety of techniques that would be apparent to one of skill in the art in possession of the present disclosure. As can be seen in FIG. 12A, the positioning of the interposer device 1000 in the rack system 200 adjacent the device housings 204 defines a switch system housing 1200 opposite the interposer device 1000 from the device housings 204, with each of the computing device connector groups 1006 located adjacent a respective computing device housing 204, and the switch system connector groups 1004 located adjacent the switch system housing 1200.

As will be appreciated by one of skill in the art in possession of the present disclosure, while the conventional rack system 200 discussed above with reference to FIG. 2 is described as being utilized with the racked GPU system of the present disclosure, modified rack systems may be provided that include the rack system features used in the racked GPU system described herein. In some examples, the conventional rack system 200 may include sufficient space to provide the switch system housing 1200 that houses the switch systems 900 as described below. However, in other examples, the conventional rack system 200 may be modified with an increased depth to allow the rack system 200 to provide the switch system housing 1200 that houses the switch systems 900 as described below when the interposer device 1000 is positioned therein. As such, one of skill in the art in possession of the present disclosure will appreciate how a variety of rack systems may be utilized with the racked GPU system of the present disclosure while remaining within its scope.

Figure 12B:
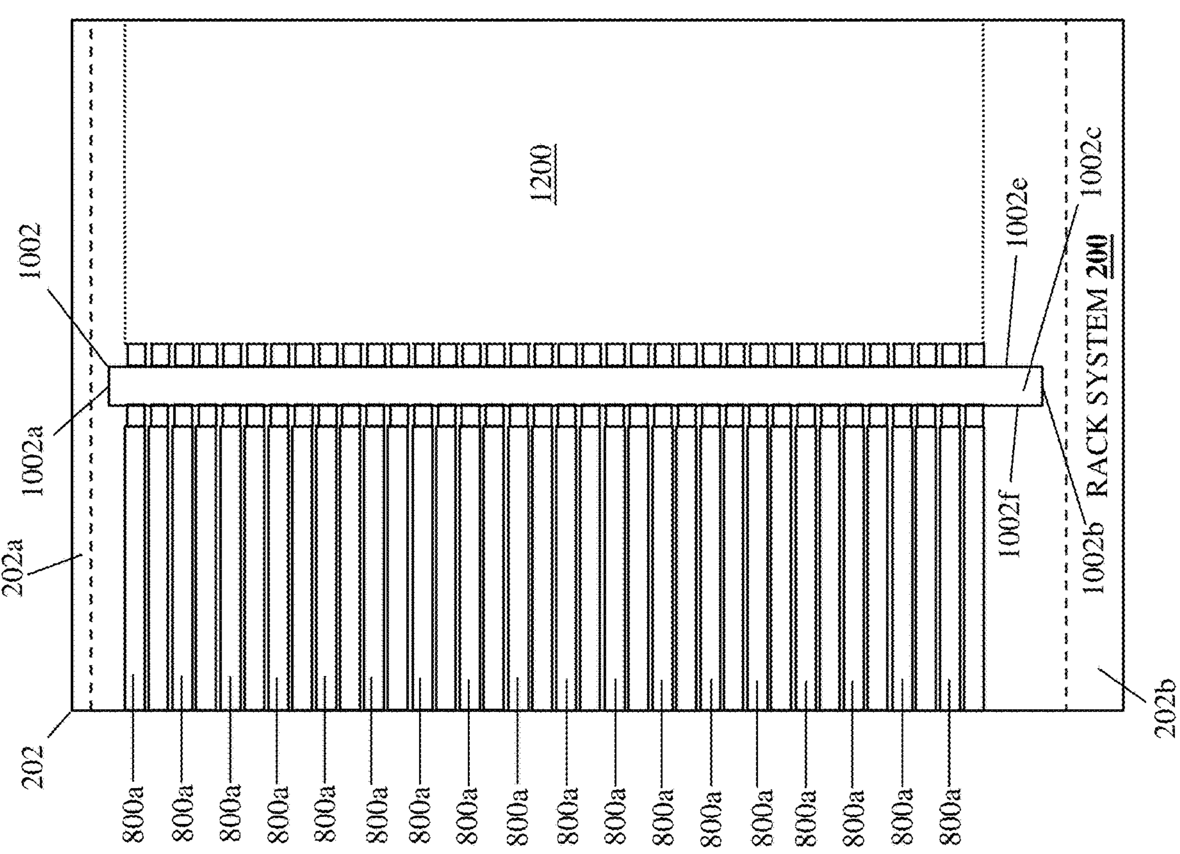
FIG. 12B is a schematic view illustrating an embodiment of a plurality of the compute devices of FIG. 8A provided in the rack system of FIG. 12A and connected to the interposer device of FIGS. 10A-10D.
Figure 12C:
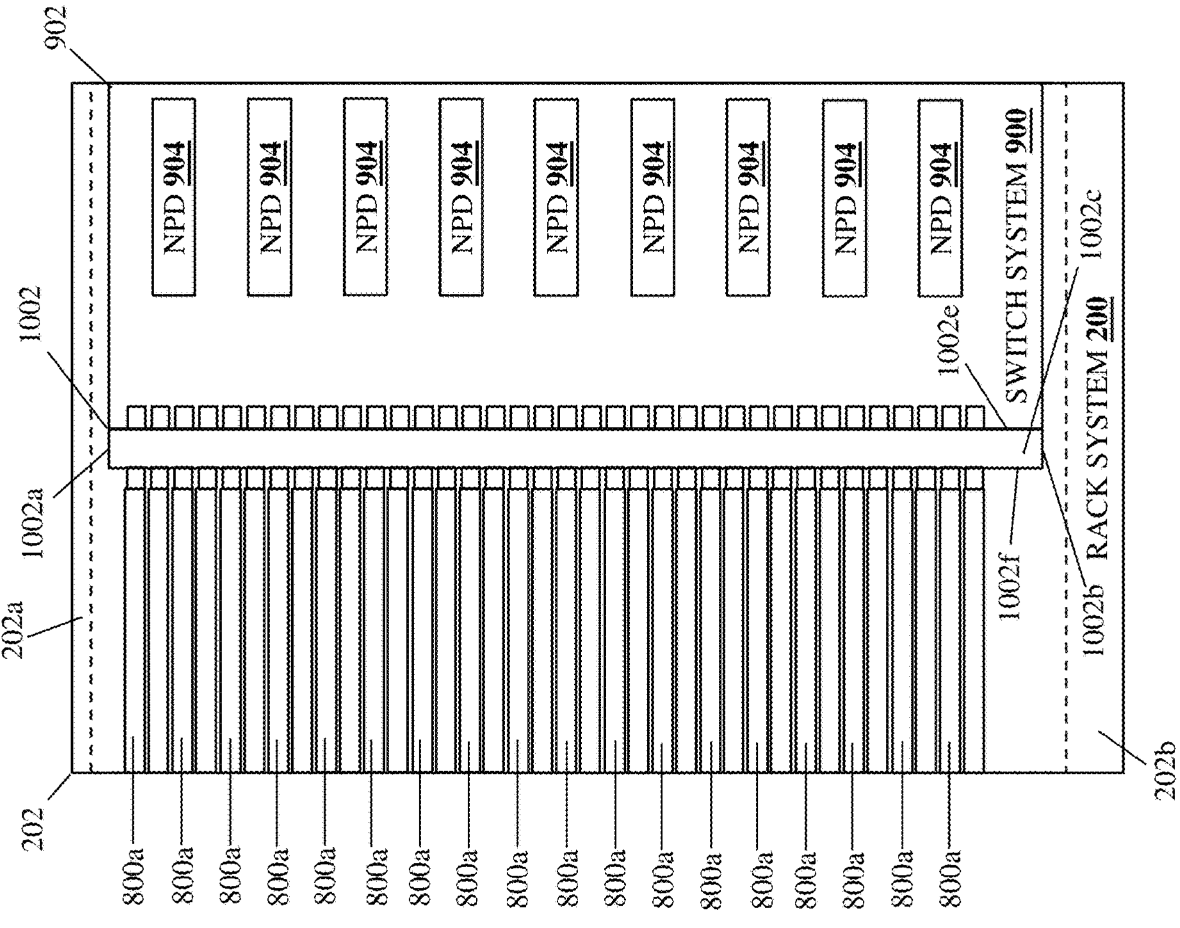
FIG. 12C is a schematic view illustrating an embodiment of the switch system of FIG. 9A provided in the rack system of FIG. 12B and connected to the interposer device of FIGS. 10A-10D to provide the racked GPU system of the present disclosure.

The method 1100 then proceeds to block 1104 where compute devices including GPU devices are positioned in respective device housings and are connected to the interposer device. With reference to FIGS. 8A, 10B, 10C, and 12B, in an embodiment of block 1104, a computing device 800*a* may be positioned in any of the compute device housings 204 such that its connectors 812-818 connect to the compute device connectors included in the compute device connector group 1006 that is located adjacent that compute device housing 204, and while FIG. 12B illustrates a respective compute device 800*a* positioned in each of the compute device housings 204 such that each of compute device connector groups 1006 is connected to a respective compute device 800*a*, as described below compute devices 800*a* may be positioned in subsets of the compute device housings 204 such that subsets of the compute device connector groups 1006 are connected to respective compute devices 800*a* while remaining within the scope of the present disclosure as well. Furthermore, while not illustrated or described in detail, as described above the compute devices 800*a* positioned in the rack system 200 and connected to the interposer device 1000 may engage compute device coupling features on the rack system 200 to mechanically support those compute devices 800*a* (i.e., in addition to the mechanical support provided by the interposer device 1000).

The method 1100 then proceeds to block 1106 where switch systems are positioned in the rack system opposite the interposer device from the compute devices and device housings and are connected to the interposer device. With reference to FIGS. 9A, 10A, 10C, and 12C, in an embodiment of block 1106, a switch system 900 may be positioned in the switch system housing 1200 such that the switch system connectors 906 on that switch system 900 connect to the switch system connectors included in one of the switch system connector groups 1004. Furthermore, while not illustrated or described in detail, the switch system 900 positioned in the rack system 200 and connected to the interposer device 1000 may engage switch system coupling features on the rack system 200 to mechanically support that switch system 900 (i.e., in addition to the mechanical support provided by the interposer device 1000).

The method 1100 then proceeds to decision block 1108 where the method 1100 proceeds depending on whether the interposer device is fully populated with switch systems. As discussed in further detail below, the interposer device 1000 may be configurable based on the number of switch systems 900 connected to its switch system connector groups 1004, and thus the configuration of the interposer device 1000 may change based on how many switch systems 900 are positioned in the rack system 200 and connected to the interposer device 1000 at block 1106.

Figure 13:
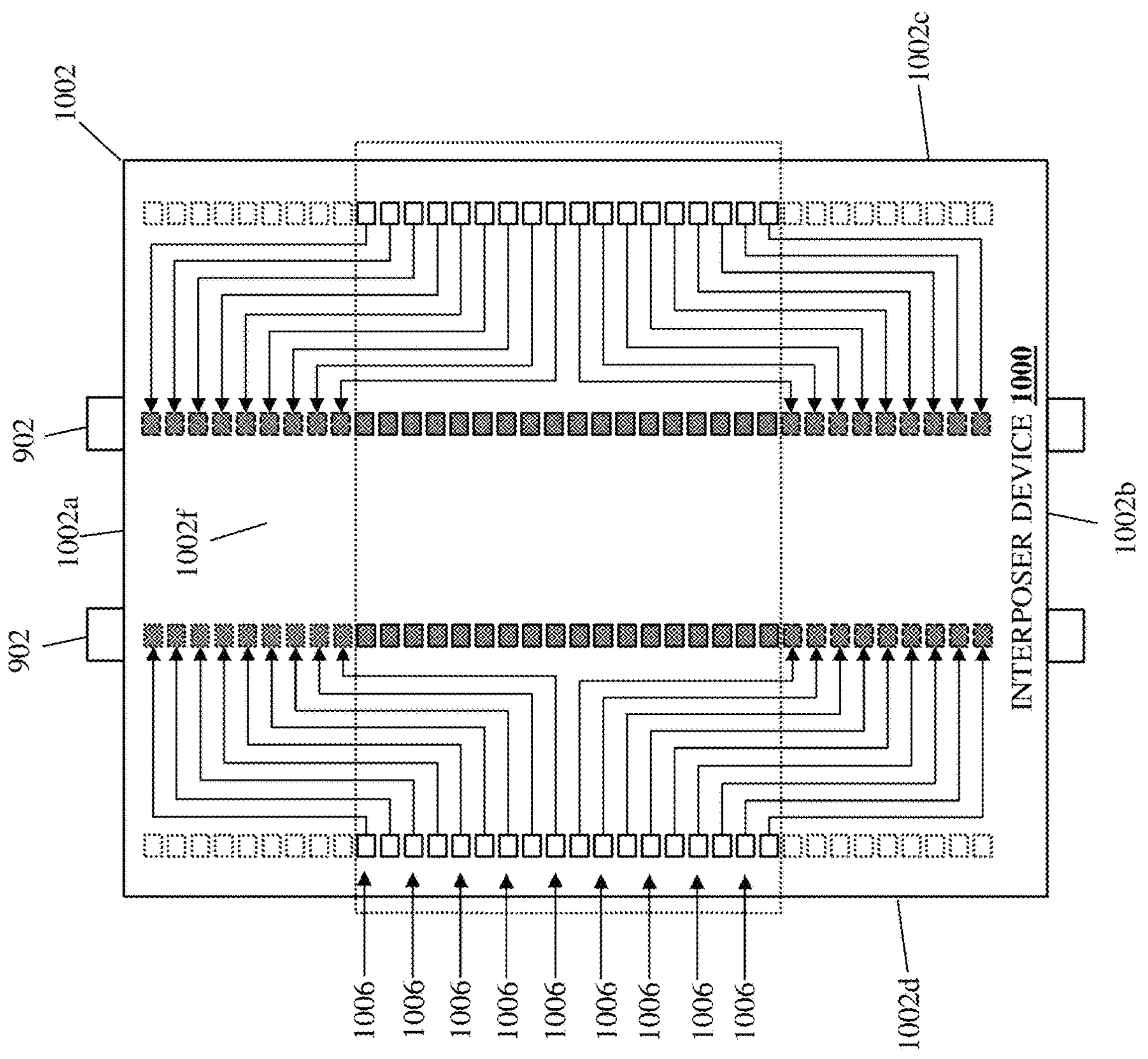
FIG. 13 is a schematic view illustrating an embodiment of the interposer device of FIGS. 10A-10D coupled to two of the switch systems of FIG. 9A to provide the racked GPU system of the present disclosure.

If, at decision block 1108, the interposer device is not fully populated with switch systems, the method 1100 proceeds to block 1110 where the interposer device is reconfigured for non-fully populated switch system operation. With reference to FIG. 13, an embodiment of the interposer device 1000 is illustrated with only two of its four switch system connector groups 1004 connected to respective switch systems 900 (i.e., the two "middle" switch system connector groups 1004 in FIG. 13), and only eighteen of its thirty-six compute device connector groups 1006 connected to respective compute devices 800*a* (i.e., the "middle" compute device connector groups 1006 between the nine compute device connector groups 1006 immediately adjacent the "top" of the interposer device 1000 and the nine compute device connector groups 1006 immediately adjacent the "bottom" of the interposer device 1000 in FIG. 13).

As will be appreciated by one of skill in the art in possession of the present disclosure, FIG. 13 illustrates the interposer device 1000 with the computing device connector groups 1006 visible, with computing device connector groups 1006 that are connected to compute devices 800*a* illustrated with solid lines and outlined with a dashed box, and computing device connector groups 1006 that are not connected to compute devices 800*a* illustrated with dashed lines. Furthermore, FIG. 13 illustrates the two switch systems 900 connected to respective switch system connector groups 1004 on the non-visible side of the interposer device 1000, with the compute device connectors that are located immediately opposite those switch system connector groups 1004 shaded. As such, the non-shaded compute device connectors illustrated in solid lines in FIG. 13 indicate compute device connectors in compute device connector groups 1006 that are connected to a compute device 800*a*, but that are located immediately opposite a switch connector in a switch system connector group 1004 that is not connected to a switch system 900.

With reference to FIGS. 10D and 13, in an embodiment of block 1110 and in response to the two switch systems 900 being connected to the respective switch system connector groups 1004 at decision block 1108, the reconfiguration connection systems 1008*a* and 1008*b* may operate to reconfigure the connections between the switch system connectors in the switch system connectors groups 1004 such that switch system connectors in a switch system connector group 1004 that are not connected to a switch system 900 but that are located immediately opposite a compute device connector that is connected to a compute device 800*a* are linked to switch system connectors in a switch system connector group 1004 that are connected to a switch system 900 but that are located immediately opposite a compute device connector that is not connected to a compute device 800*a*.

For example, consider the "tenth" compute device connector group 1006 in FIG. 13 (i.e., the tenth compute device connector group 1006 from the "top" of the interposer device 1000 in FIG. 13) that is the "first" of the compute device connector groups 1006 that is connected to a compute device as described above. As can be seen in FIG. 13, at block 1110, the switch system connector that is located immediately opposite the "first" compute device connector (i.e., the compute device connector located immediately adjacent the side edge 1002*d* of the interposer device 1000 in FIG. 13) in the "tenth" compute device connector group 1006 and that is not connected to a switch system 900 is linked to the switch system connector that is located immediately opposite the "second" compute device connector (i.e., the second compute device connector from the side edge 1002*d* of the interposer device 1000 in FIG. 13) in the "first" compute device connector group 1006 (i.e., the first compute device connector group 1006 from the "top" of the interposer device 1000 in FIG. 13) and that is connected to a switch system 900. As such, compute device communications received via the "first" compute device connector in the "tenth" compute device connector group 1006 (which is located immediately opposite a switch system connector that is not connected to a switch system 900) will be transmitted to the switch system connector that is located immediately opposite the "second" compute device connector in the "first" compute device connector group 1006 (and that is connected to a switch system 900).

While not described in detail, one of skill in the art in possession of the present disclosure will appreciate how FIG. 13 details a specific example of how each of the switch system connectors that are not connected to a switch system and that are located immediately opposite a compute device connector that is connected to a compute device may be linked to a switch system connector that is included on the two connected switch systems and that is located immediately opposite a compute device connector that is not connected to a compute device. Furthermore, while a specific example that allows half the available compute device connector groups to be connected to compute devices while enabling communications between the GPU devices in those compute devices using switch systems connected to half the available switch system connector groups, one of skill in the art in possession of the present disclosure will appreciate how other configurations and reconfiguration functionality for the interposer device 1000 that allow other numbers of compute devices and switch systems to be used to provide the racked GPU system of the present disclosure will fall within its scope as well.

While the reconfiguration of the interposer device 1000 is described above as being provided by a "passive" interposer device reconfiguration system that detects how the interposer device 1000 is populated with less than the maximum number of switch systems 900 (i.e., that detects that only the two "middle" switch system connector groups 1004 on the interposer device 1000 are populated with two switch systems in the specific example provided above) and, in response, automatically reconfigures the connections between the switch system connectors in the switch system connector groups 1004 to provide connectivity between GPU devices in less than the maximum number of computing devices 800*a* (i.e., GPU devices included in eighteen compute device connected to the eighteen "middle" compute device connector groups 1004 on the interposer device 1000 in the specific example provided above), one of skill in the art in possession of the present disclosure will appreciate how "active" interposer device reconfiguration (i.e., a user providing the interposer device reconfiguration described above via the use of cabling and/or other techniques known in the art) will fall within the scope of the present disclosure as well.

Figure 14:
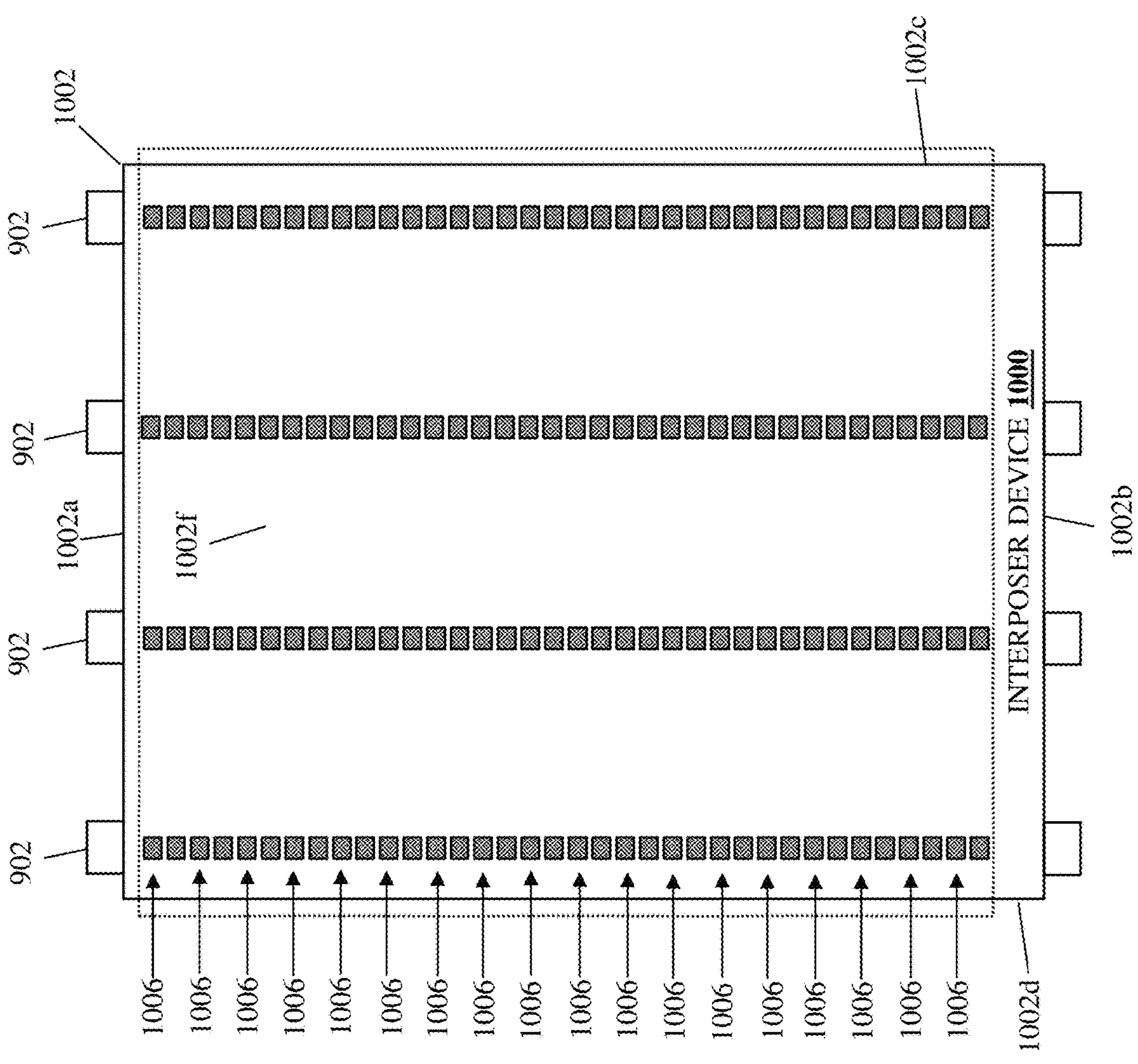
FIG. 14 is a schematic view illustrating an embodiment of the interposer device of FIGS. 10A-10D coupled to four of the switch systems of FIG. 9A to provide the racked GPU system of the present disclosure.

Following block 1110, or if at decision block 1108 the interposer device is fully populated with switch systems, the method 1100 proceeds to block 1112 where the GPU devices in the compute devices communicate via the interposer device and the switch systems with each other. With reference to FIG. 14, an embodiment of the interposer device 1000 is illustrated with all of its four switch system connector groups 1004 connected to respective switch systems 900, and all of its thirty-six compute device connector groups 1006 connected to respective compute devices 800*a*.

As will be appreciated by one of skill in the art in possession of the present disclosure, FIG. 14 uses the same illustration conventions as FIG. 13 discussed above. As such, the interposer device 1000 is illustrated with the computing device connector groups 1006 visible, the computing device connector groups 1006 that are connected to compute devices 800*a* illustrated with solid lines and outlined with a dashed box, and the four switch systems 900 connected to respective switch system connector groups 1004 on the non-visible side of the interposer device 1000 with the compute device connectors that are located immediately opposite those switch system connector groups 1004 shaded. The GPU device communication of block 1112 is described below based on the "fully populated" compute device/switch system configuration illustrated in FIG. 14, but one of skill in the art in possession of the present disclosure will appreciate how GPU devices in the "partially populated" compute device/switch system configuration illustrated in FIG. 13 may communicate in a similar manner (but using the reconfigured switch system connector connections described above).

Figure 15A:
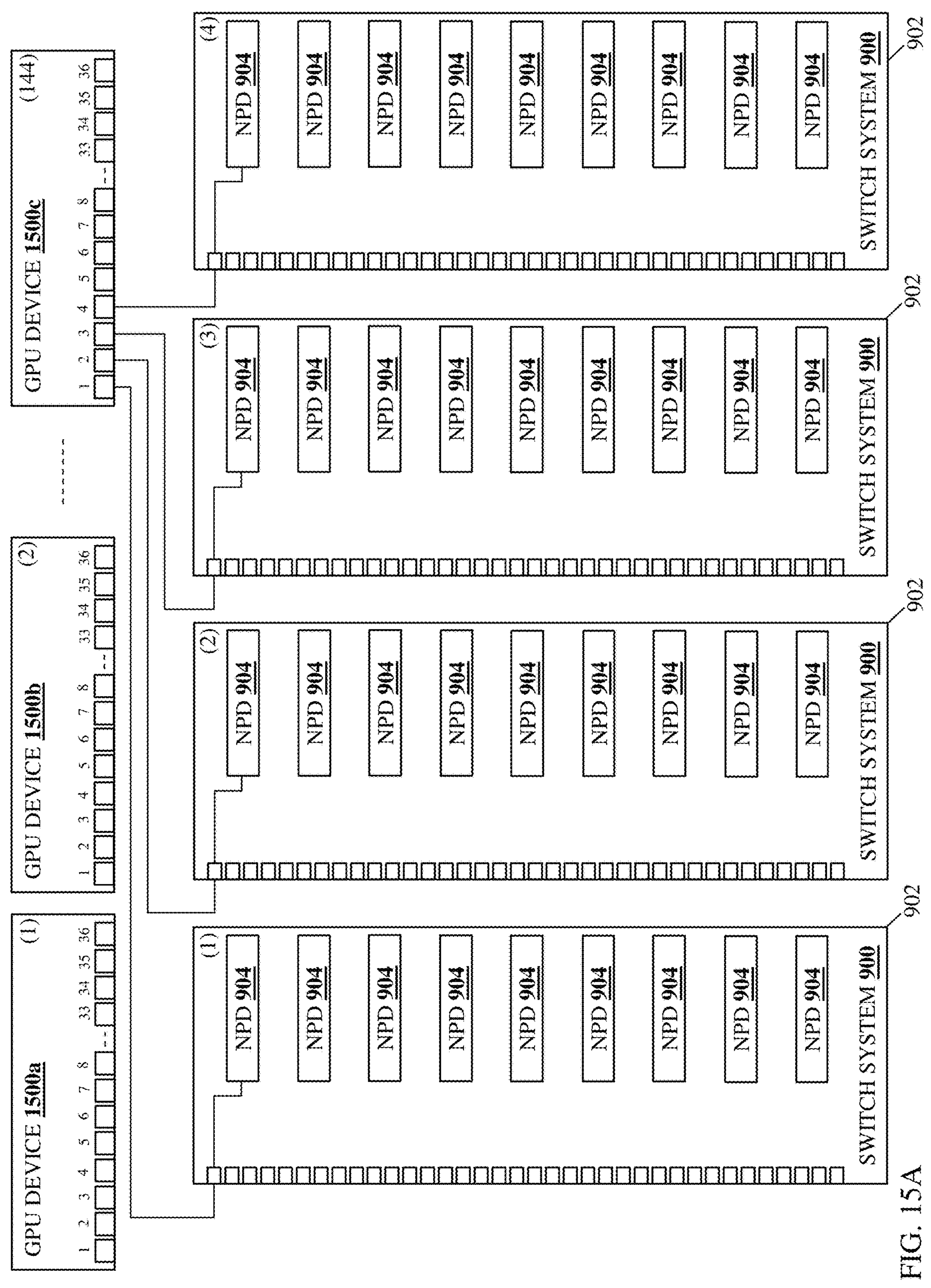
FIG. 15A is a schematic view illustrating some of the connections provided by the interposer device of FIGS. 10A-10D in the racked GPU system of FIGS. 12C and 14 between some of the networking processing devices the switch systems and one of the GPU devices in the compute devices.
Figure 15B:
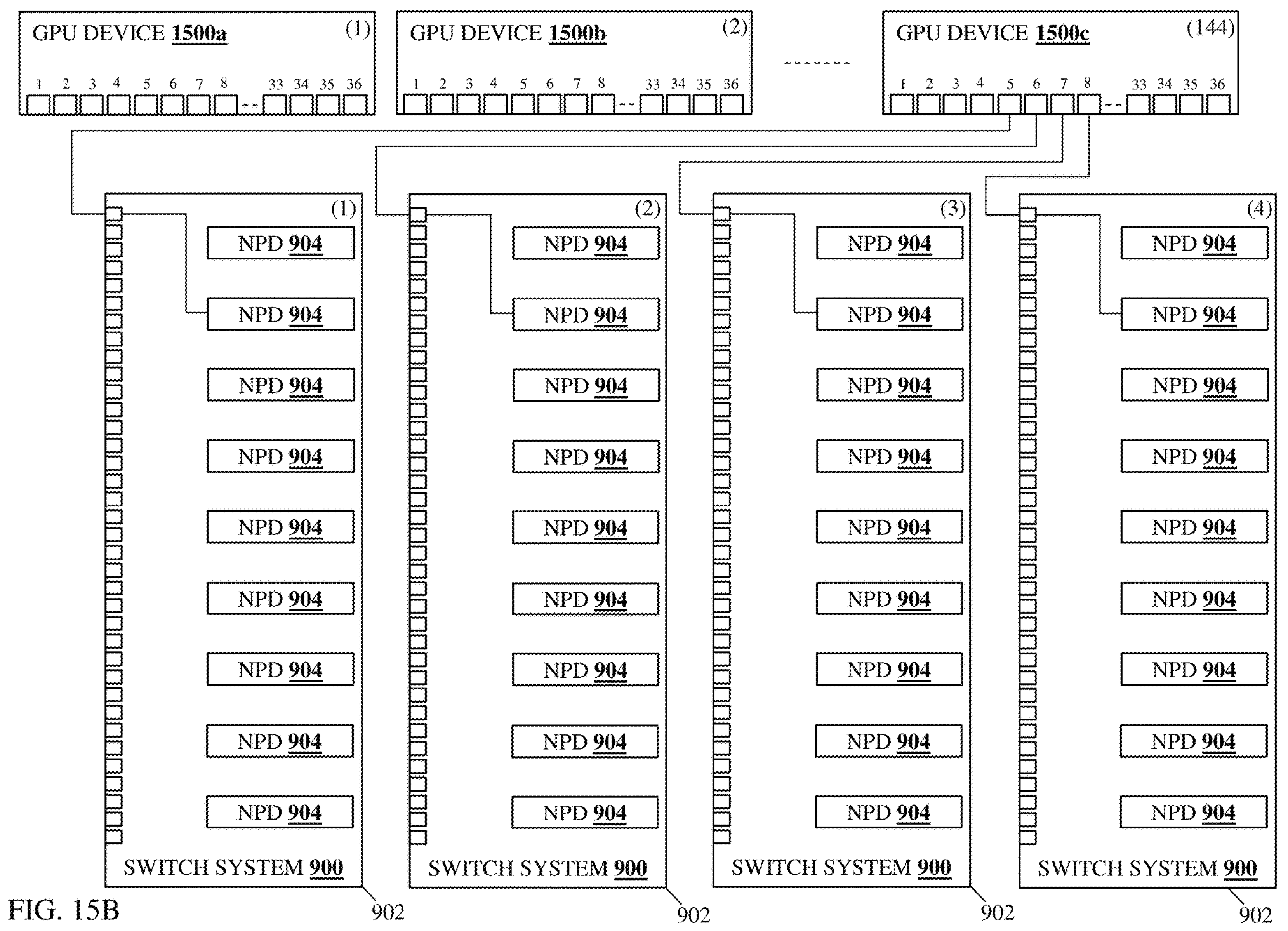
FIG. 15B is a schematic view illustrating some of the connections provided by the interposer device of FIGS. 10A-10D in the racked GPU system of FIGS. 12C and 14 between some of the networking processing devices the switch systems and one of the GPU devices in the compute devices.
Figure 15C:
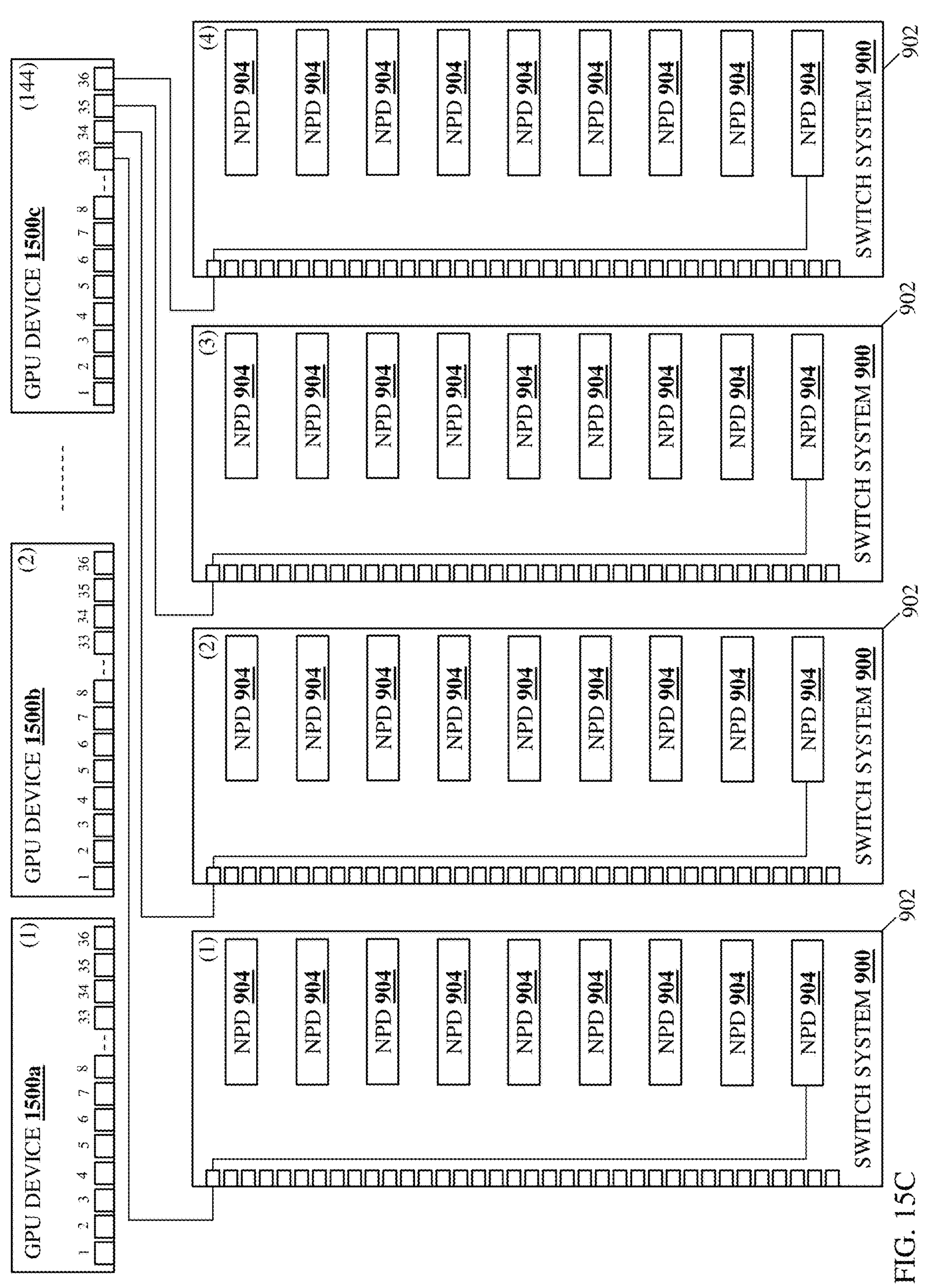
FIG. 15C is a schematic view illustrating some of the connections provided by the interposer device of FIGS. 10A-10D in the racked GPU system of FIGS. 12C and 14 between some of the networking processing devices the switch systems and one of the GPU devices in the compute devices.

With reference to FIGS. 9A, 12C, 14, 15A, 15B, and 15C, an embodiment of the connections between one of the GPU devices and some of the networking processing devices provided in the racked GPU system of the present disclosure is illustrated. In FIGS. 15A-15C, the GPU devices provided in the compute devices 800*a* in the racked GPU system of the present disclosure are renumbered to GPU devices 1500*a*, 1500*b*, and up to 1500*c*, and in the examples discussed above, the 36 compute devices 800*a* provide 4 GPU devices each to provide (36*4=) 144 GPU devices that are coupled to the 36 networking processing devices 904 provided by the four switch systems 900.

FIG. 15A illustrates how each of the "1-4" GPU interfaces (e.g., GPU bidirectional interfaces in the examples provided herein) on the "one hundred and forty fourth" GPU device 1500*c* are connected via the "first" switch system connector 906 on a respective one of the four switch systems 900 (i.e., the switch device connector 906 located immediately adjacent the "top" of that switch system 900 in FIG. 15A) to the "first" networking processing device 904 on that switch system 900 (i.e., the networking processing device 904 located immediately adjacent the "top" of that switch system 900 in FIG. 15A). FIG. 15B illustrates how each of the "5-8" GPU interfaces (e.g., GPU bidirectional interfaces in the examples provided herein) on the "one hundred and forty fourth" GPU device 1500*c* are connected via the "first" switch system connector 906 on a respective one of the four switch systems 900 (i.e., the switch device connector 906 located immediately adjacent the "top" of that switch system 900 in FIG. 15B) to the "second" networking processing device 904 on that switch system 900 (i.e., the networking processing device 904 located second from the "top" of that switch system 900 in FIG. 15B). FIG. 15C illustrates how each of the "33-36" GPU interfaces (e.g., GPU bidirectional interfaces in the examples provided herein) on the "one hundred and forty fourth" GPU device 1500*c* are connected via the "first" switch system connector 906 on a respective one of the four switch systems 900 (i.e., the switch device connector 906 located immediately adjacent the "top" of that switch system 900 in FIG. 15C) to the "last" networking processing device 904 on that switch system 900 (i.e., the networking processing device 904 located immediately adjacent the "bottom" of that switch system 900 in FIG. 15C).

However, while only a few of the connections between the GPU device 1500*c* and the networking processing devices 904 in the four switch systems 900 are illustrated and described, one of skill in the art in possession of the present disclosure will appreciate how the GPU device 1500*c* is connected to all of the networking processing devices 904 in the four switch systems 900 similarly as illustrated in FIGS. 15A-15C. Furthermore, one of skill in the art in possession of the present disclosure will appreciate how each of the GPU devices provided in the rack GPU system of the present disclosure is connected to all of the networking processing devices 904 in the four switch systems 900 similarly as illustrated for the GPU device 1500*c* in FIGS. 15A-15C as well. Finally, one of skill in the art in possession of the present disclosure will appreciate how each of the GPU devices in the 18 compute devices provided in the "partially populated" racked GPU system discussed above with reference to FIGS. 12C and 13 may be connected to all of the networking processing devices 904 included in the two switch systems 900 provided in that "partially populated" racked GPU system similarly as described above as well.

As such, one of skill in the art in possession of the present disclosure will appreciate how, at block 1112, any of the GPU devices 1500*a*-1500*c* may communicate with any of the other GPU devices in the racked GPU system via the interposer device 1000 and the switch systems 900 using the communicative couplings provided between those GPU devices 1500*a*-1500*c* via the connection of the compute devices 800*a* and the switch systems 900 to the interposer device 1000.

Figure 16A:
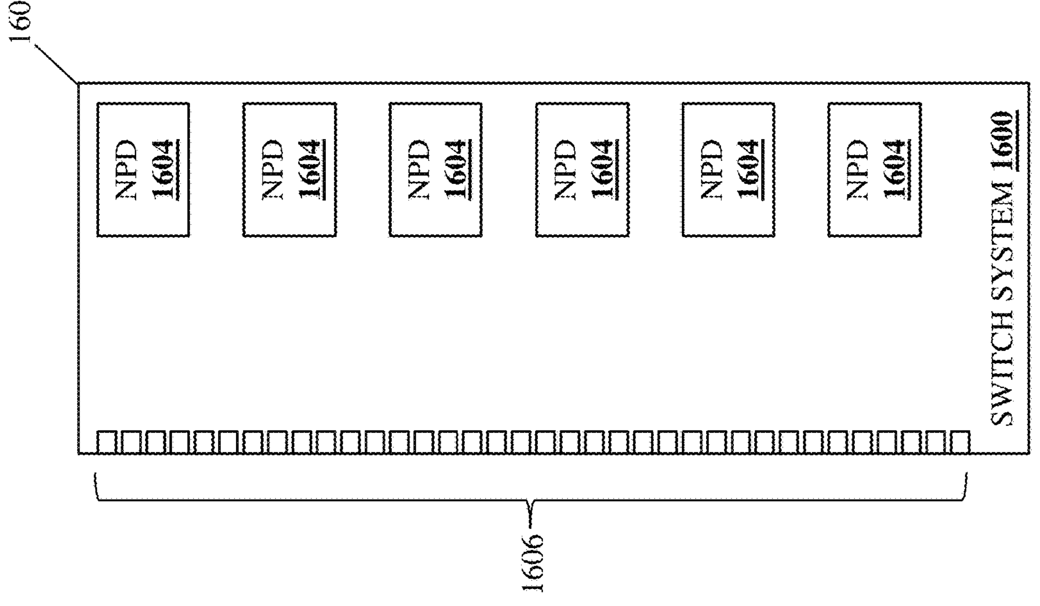
FIG. 16A is a schematic view illustrating an embodiment of a switch system that may be used in the racked GPU system of the present disclosure.

Referring now to FIG. 16A, an embodiment of a switch system 1600 utilized in the racked GPU system of the present disclosure is illustrated. As described below, the switch system 900 is utilized in embodiments of the racked GPU system of the present disclosure that allow for the use of up to six of the switch systems 900. The switch system 1600 includes a chassis 1602 that supports the components of the switch system 1600, only some of which are illustrated and described below. As described below, the chassis 1602 may be provided by circuit board(s), sheet metal, and/or other chassis materials that one of skill in the art in possession of the present disclosure would recognize as providing the functionality described below. In the illustrated example, the chassis 1602 supports six Networking Processing Devices (NPDs) 1604. In the illustrated example, the chassis 1602 also supports thirty-six switch system connectors 1606 that may be coupled to each of the networking processing devices 1604 as described herein.

Figure 16B:
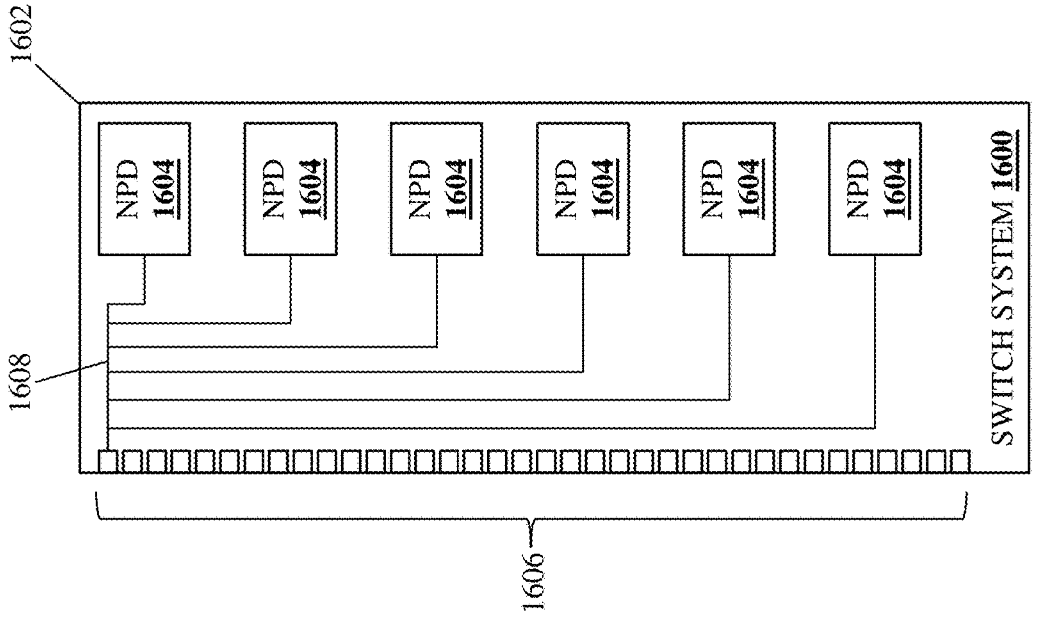
FIG. 16B is a partial schematic view illustrating an embodiment of connectivity for networking processing devices in the switch system of FIG. 16A.

With reference to FIG. 16B, an embodiment of a connection system 1608 that provides connections between a "first" switch system connector 1606 on the switch system 1600 (i.e., the switch system connector 1606 adjacent the "top" of the switch system 1600 in FIG. 16B) and each of the networking processing devices 1604 on the switch system 1600 is illustrated, and a respective similar connection system may be provided to connect each of the remaining switch system connectors 1606 to each of the networking processing devices 1604. As will be appreciated by one of skill in the art in possession of the present disclosure, the switch system 1600 and the switch system connector/networking processing device connectivity may be provided similarly as described above with reference to the different embodiments of the switch system 900 described above with reference to FIGS. 9A-9F.

Figure 17A:
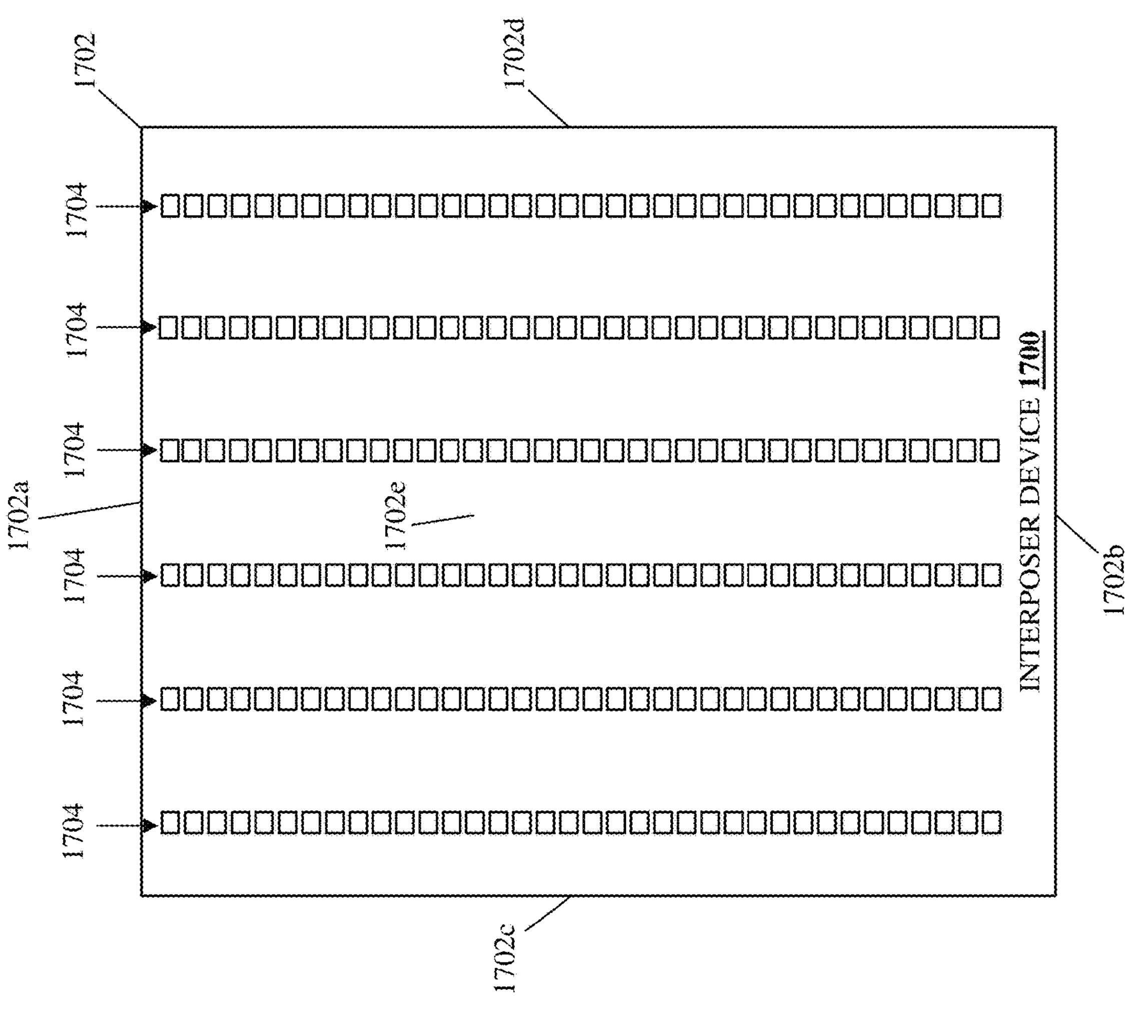
FIG. 17A is a schematic front view illustrating an embodiment of an interposer device that may be used in the racked GPU system of the present disclosure.
Figure 17B:
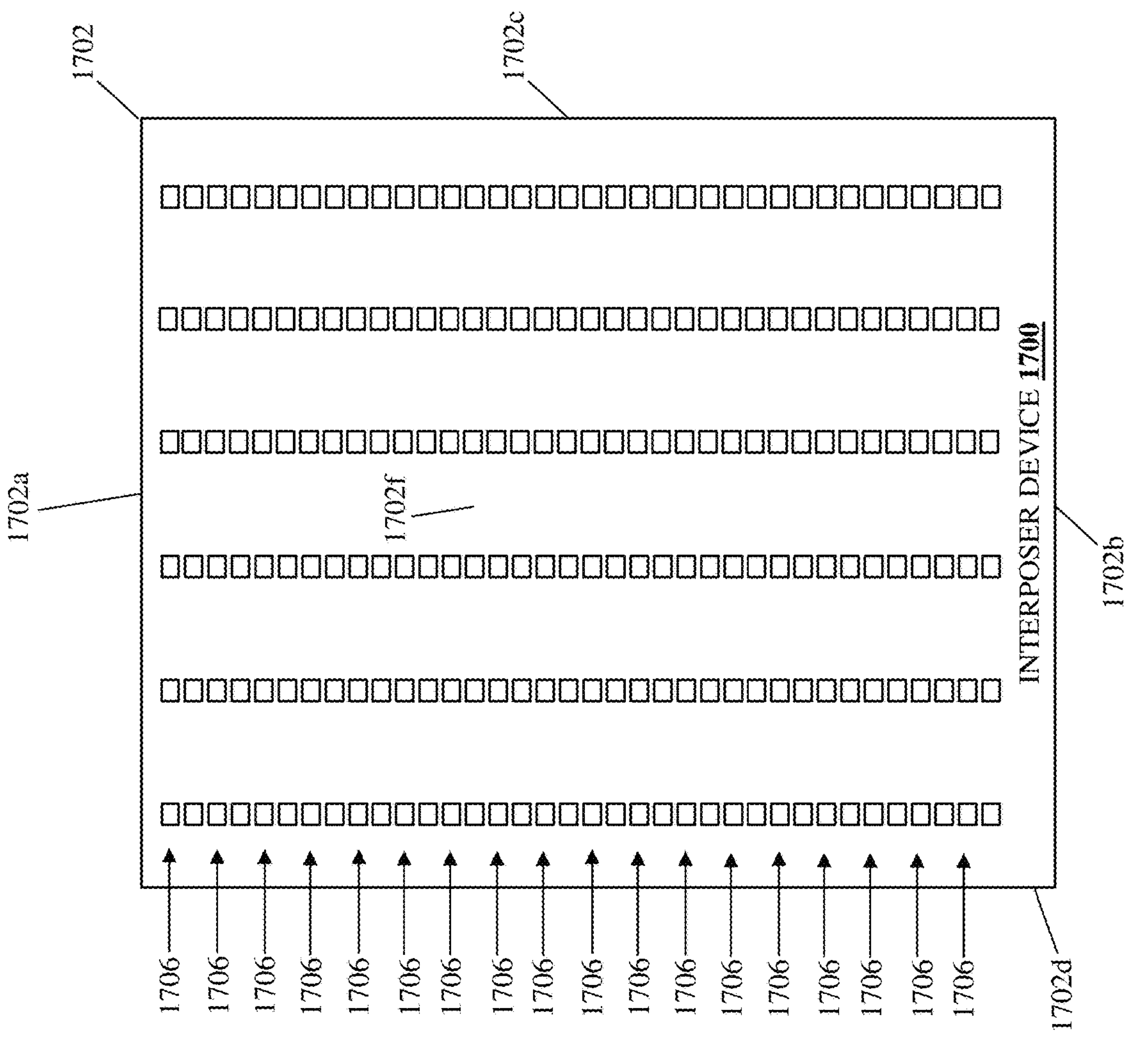
FIG. 17B is a schematic rear view illustrating an embodiment of the interposer device of FIG. 17A.

Referring now to FIGS. 17A, 17B, and 17C, an embodiment of an interposer device 1700 utilized in the racked GPU system of the present disclosure is illustrated. The interposer device 1700 includes a chassis 1702 that supports the components of the interposer device 1700, only some of which are illustrated and described below. As described below, the chassis 1702 may be provided by circuit board(s), sheet metal, and/or other chassis materials that one of skill in the art in possession of the present disclosure would recognize as providing the functionality described below. In the illustrated example, the chassis 1702 includes a top edge 1702*a*, a bottom edge 1702*b* that is located opposite the chassis 1702 from the top edge 1702*a*, a pair of opposing side edges 1702*c* and 1702*d* that are located opposite the chassis 1702 from each other and that extend between the top edge 1702*a* and the bottom edge 1702*b*, a switch system connection surface 1702*e* that extends between the top edge 1702*a*, the bottom edge 1702*b*, and the side edges 1702*c* and 1702*d*, and a compute device connection surface 1702*f* that is located opposite the chassis 1702 from the switch system connection surface 1702*d* and that extends between the top edge 1702*a*, the bottom edge 1702*b*, and the side edges 1702*c* and 1702*d*.

As can be seen in the illustrated example of FIG. 17A, six switch system connector groups 1704 are provided on the switch system connection surface 1702*e*, with each switch system connector group 1704 including thirty-six switch system connectors provided in a vertically aligned orientation. Furthermore, as can be seen in the illustrated example of FIG. 17B, thirty-six compute device connector groups 1706 (with every other compute device connector group 1706 provided with an element number in FIG. 17B for clarity) are provided on the compute device connection surface 1702*f*, with each compute device connector group 1706 including six compute device connectors provided in a horizontally aligned orientation. As will be appreciated by one of skill in the art in possession of the present disclosure, the compute device connector groups 1706 are provided on the compute device connection surface 1702*f* such that each of the compute device connectors in those compute device connector groups are vertically aligned with corresponding compute device connectors in the other compute device connector groups (i.e., the "first" compute device connector in each of the compute device connector groups 1706 are vertically aligned, the "second" compute device connector in each of the compute device connector groups 1706 are vertically aligned, the "third" compute device connector in each of the compute device connector groups 1706 are vertically aligned, the "fourth" compute device connector in each of the compute device connector groups 1706 are vertically aligned, the "fifth" compute device connector in each of the compute device connector groups 1706 are vertically aligned, and the "sixth" compute device connector in each of the compute device connector groups 1706 are vertically aligned).

As will also be appreciated by one of skill in the art in possession of the present disclosure, each of the switch system connector groups 1706 is located substantially opposite the chassis 1002 from the vertically aligned compute device connectors, and FIG. 17C illustrates how each of the switch system connectors in one of the switch system connector groups 1706 may be connected to the compute device connector that is located immediately opposite the chassis 1702 from it (i.e., the "top" switch system connector each of the six switch system connector groups 1704 are connected to the respective compute device connectors in the "top" compute device connector group 1706 that are located immediately opposite the chassis 1702 from them, the "second-from-the-top" switch system connector each of the six switch system connector groups 1704 are connected to the respective compute device connectors in the "second-from-the-top" compute device connector group 1706 that are located immediately opposite the chassis 1002 from them, and so on). As described in further detail below, the connectivity provided between the compute device connectors and the switch system connectors on the interposer device 1700 may be reconfigurable based on the number of switch systems connected to the switch system connector groups 1704 similarly as described above for the interposer device 1000, but may utilize an "active" interposer device reconfiguration technique (as opposed to the passive interposer device reconfiguration technique described above for the interposer device 1000) in most embodiments.

Figure 18:
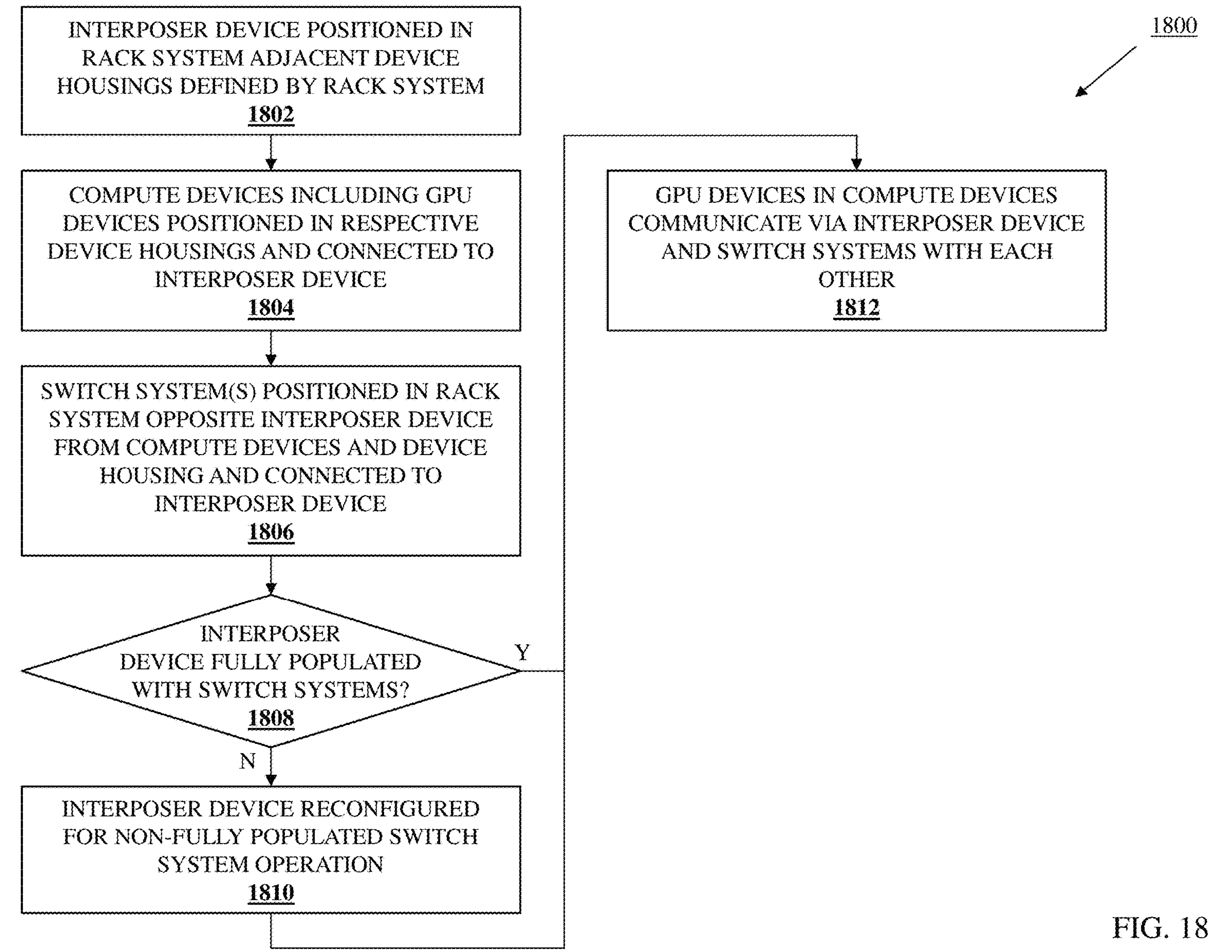
FIG. 18 is a flow chart illustrating an embodiment of a method for providing a racked GPU system.

Referring now to FIG. 18, an embodiment of a method 1800 for providing a racked Graphics Processing Unit (GPU) system is illustrated. As discussed below, the systems and methods of the present disclosure provide a racked GPU system configuration in which all compute device housings defined by a rack system may be used to house compute devices including GPU devices, and networking processing devices are coupled to those GPU devices via an interposer device that is positioned between the compute devices/device housings and switch systems that include the networking processing devices, with the interposer device configurable to allow the number of switch systems required in the racked GPU system to be scaled based on the number of compute device/GPU devices being used. For example, the racked GPU system of the present disclosure may include a rack system defining a plurality of device housings. An interposer device is housed in the rack system adjacent the plurality of device housings. A plurality of compute devices that each include a plurality of Graphics Processing Units (GPU) devices are housed in a respective one of the plurality of the device housings and connected to the interposer device. At least one switch system including a plurality of networking processing devices is housed in the rack system opposite the interposer device from the plurality of compute devices and the plurality of device housings, and connected to the interposer device to communicatively couple each of the plurality of networking processing devices in that switch system to each of the plurality of GPU devices in each of the plurality of compute devices. As such, GPU density is increased relative to conventional racked GPU systems, while also enabling the scaling of networking processing devices based on the number of GPU devices being used.

Figure 19A:
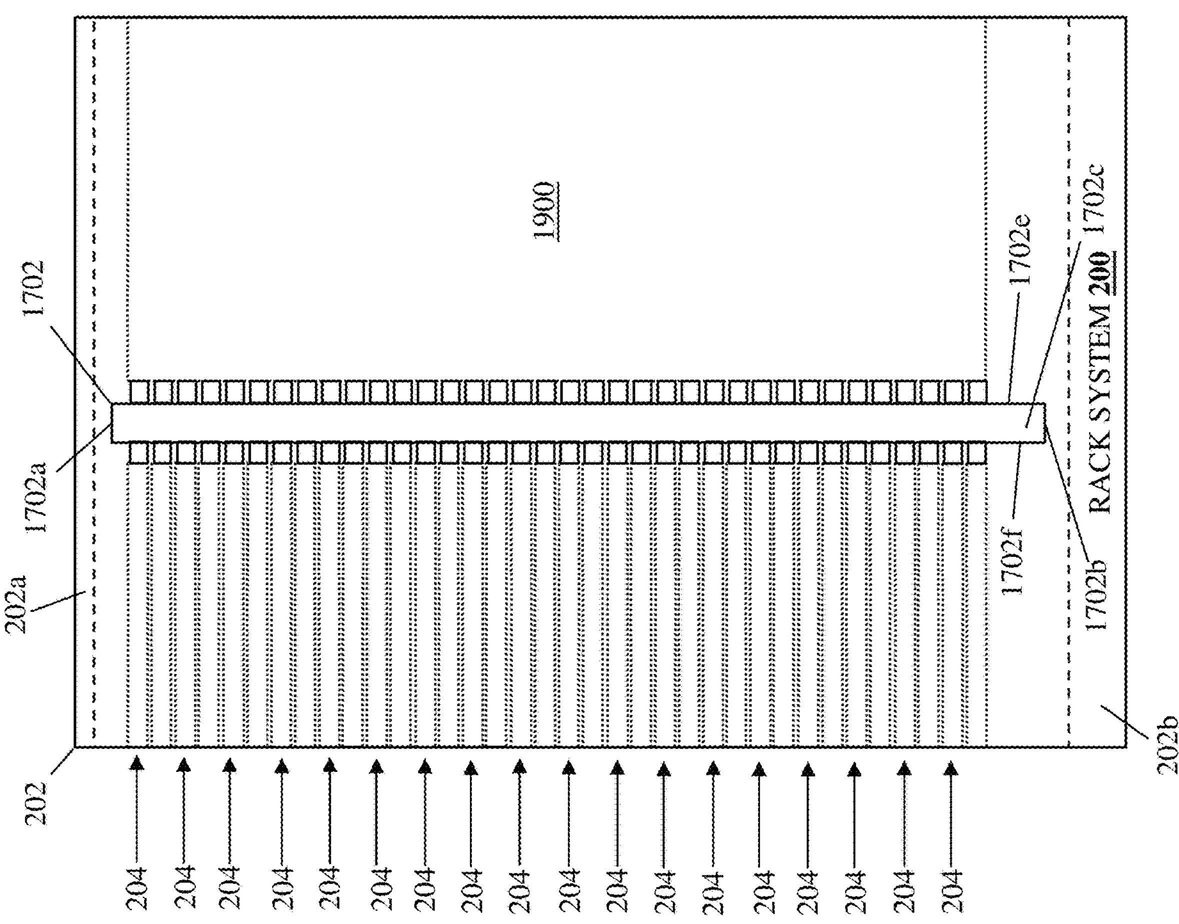
FIG. 19A is a schematic view illustrating an embodiment of the interposer device of FIGS. 17A-17C provided in the rack system of FIG. 2.

The method 1800 begins at block 1802 where an interposer device is positioned in a rack system adjacent device housings defined by the rack system. With reference to FIGS. 2, 16A-16C, and 19A, in an embodiment of block 1802, the interposer device 1700 may be positioned in the rack system 200 adjacent the device housings 204 (with only half of the device housings 204 identified by element numbers in FIG. 19A for clarity) and connected, mounted, and/or otherwise coupled to the rack system 200 using any of a variety of techniques that would be apparent to one of skill in the art in possession of the present disclosure. As can be seen in FIG. 19A, the positioning of the interposer device 1700 in the rack system 200 adjacent the device housings 204 defines a switch system housing 1900 opposite the interposer device 1700 from the device housings 204, with each of the computing device connector groups 1706 located adjacent a respective computing device housing 204, and the switch system connector groups 1704 located adjacent the switch system housing 1900.

As will be appreciated by one of skill in the art in possession of the present disclosure, while the conventional rack system 200 discussed above with reference to FIG. 2 is described as being utilized with the racked GPU system of the present disclosure, modified rack systems may be provided that include the rack system features used in the racked GPU system described herein. In some examples, the conventional rack system 200 may include sufficient space to provide the switch system housing 1900 that houses the switch systems 1600 as described below. However, in other examples, the conventional rack system 200 may be modified with an increased depth to allow the rack system 200 to provide the switch system housing 1900 that houses the switch systems 1600 as described below when the interposer device 1700 is positioned therein. As such, one of skill in the art in possession of the present disclosure will appreciate how a variety of rack systems may be utilized with the racked GPU system of the present disclosure while remaining within its scope.

Figure 19B:
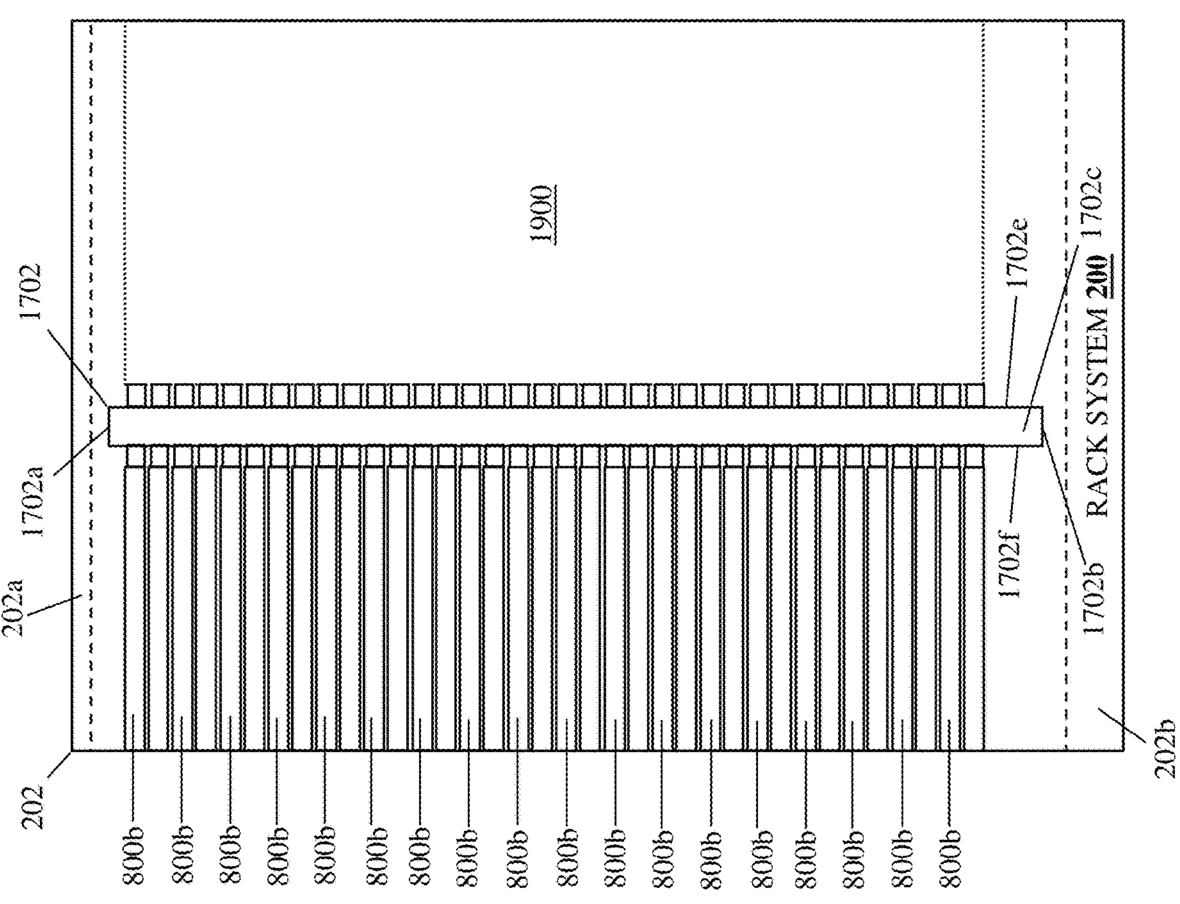
FIG. 19B is a schematic view illustrating an embodiment of a plurality of the compute devices of FIG. 8B provided in the rack system of FIG. 2 and connected to the interposer device of FIGS. 17A-17C.
Figure 19C:
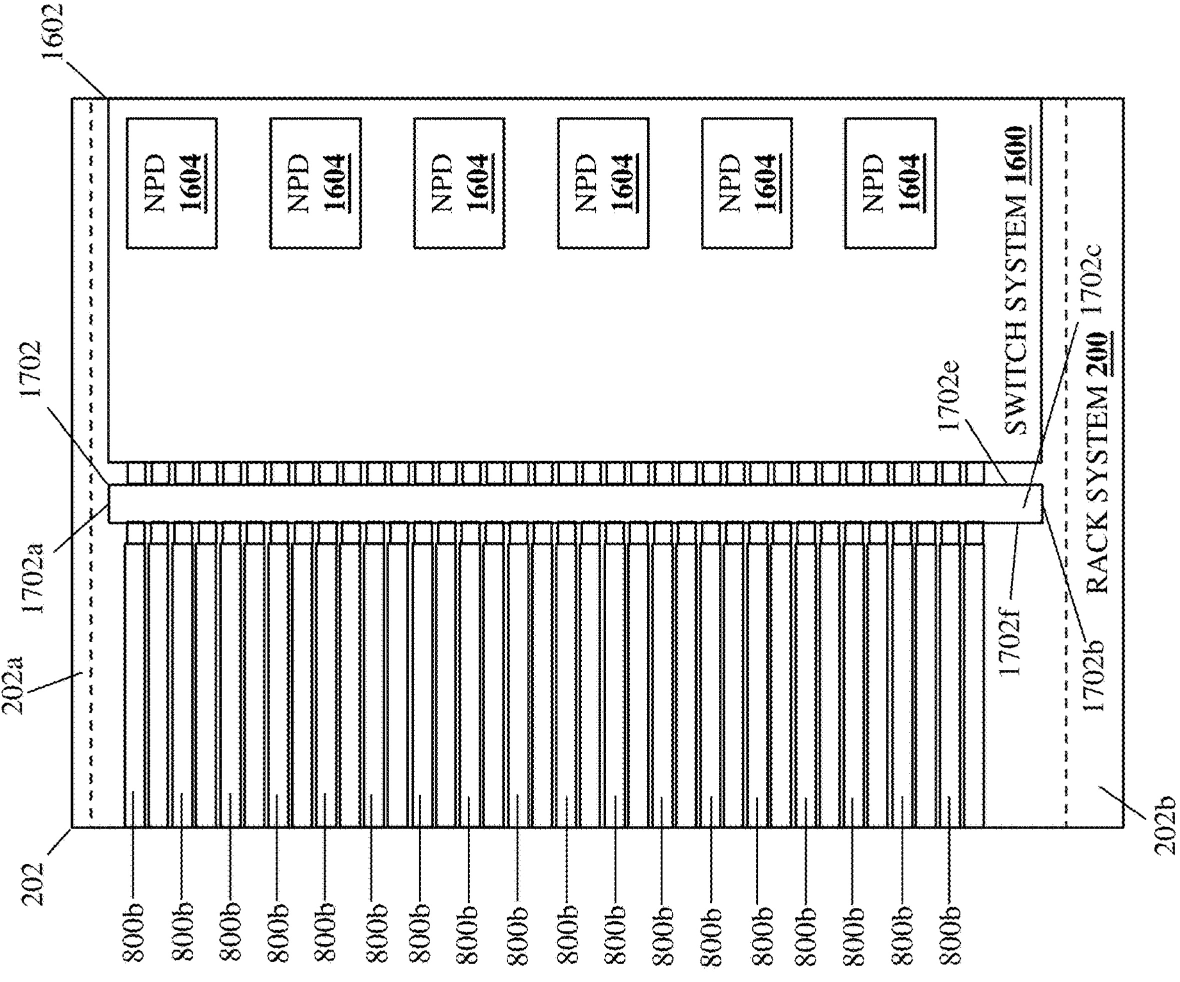
FIG. 19C is a schematic view illustrating an embodiment of the switch system of FIG. 16A provided in the rack system of FIG. 2 and connected to the interposer device of FIGS. 17A-17C to provide the racked GPU system of the present disclosure.

The method 1800 then proceeds to block 1804 where compute devices including GPU devices are positioned in respective device housings and are connected to the interposer device. With reference to FIGS. 8, 16B, 16C, and 19B, in an embodiment of block 1804, a computing device **800*b* may be positioned in any of the compute device housings 204 such that its connectors 812-818 connect to the compute device connectors included in the compute device connector group 1706 that is located adjacent that compute device housing 204, and while FIG. 19B illustrates a respective compute device 800*b* positioned in each of the compute device housings 204 such that each of compute device connector groups 1706 is connected to a respective compute device 800*b*, as described below compute devices 800*b* may be positioned in subsets of the compute device housings 204 such that subsets of the compute device connector groups 1706 are connected to respective compute devices 800*b* while remaining within the scope of the present disclosure as well. Furthermore, while not illustrated or described in detail, as described above the compute devices 800*b* positioned in the rack system 200 and connected to the interposer device 1700 may engage compute device coupling features on the rack system 200 to mechanically support those compute devices 800*b* (i.e., in addition to the mechanical support provided by the interposer device 1700**).

The method 1800 then proceeds to block 1806 where at least one switch system is positioned in the rack system opposite the interposer device from the compute devices and device housings and is connected to the interposer device. With reference to FIGS. 16A, 17A, 17C, and 19C, in an embodiment of block 1806, a switch system 1600 may be positioned in the switch system housing 1900 such that the switch system connectors 1606 on that switch system 1600 connect to the switch system connectors included in one of the switch system connector groups 1704. Furthermore, while not illustrated or described in detail, the switch system 1600 positioned in the rack system 200 and connected to the interposer device 1700 may engage switch system coupling features on the rack system 200 to mechanically support that switch system 1600 (i.e., in addition to the mechanical support provided by the interposer device 1700).

The method 1800 then proceeds to decision block 1808 where the method 1800 proceeds depending on whether the interposer device is fully populated with switch systems. As discussed in further detail below, the interposer device 1700 may be configurable based on the number of switch systems 1600 connected to its switch system connector groups 1704, and thus the configuration of the interposer device 1700 may be changed based on how many switch systems 1600 are positioned in the rack system 200 and connected to the interposer device 1700 at block 1806.

If, at decision block 1808, the interposer device is not fully populated with switch systems, the method 1800 proceeds to block 1810 where the interposer device is reconfigured for non-fully populated switch system operation. As discussed in further detail below, the interposer device 1700 is described as being configurable to provide GPU device/networking processing device connectivity based on the connection of one, two, three, or six of the switch systems 1600 to particular switch system connector groups 1704 on the interposer device 1700, but one of skill in the art in possession of the present disclosure will recognize that other configurations that provide GPU device/networking processing device connectivity based on different numbers of connected switch systems and/or their connection to different switch system connector groups 1704 will fall within the scope of the present disclosure as well.

Figure 20:
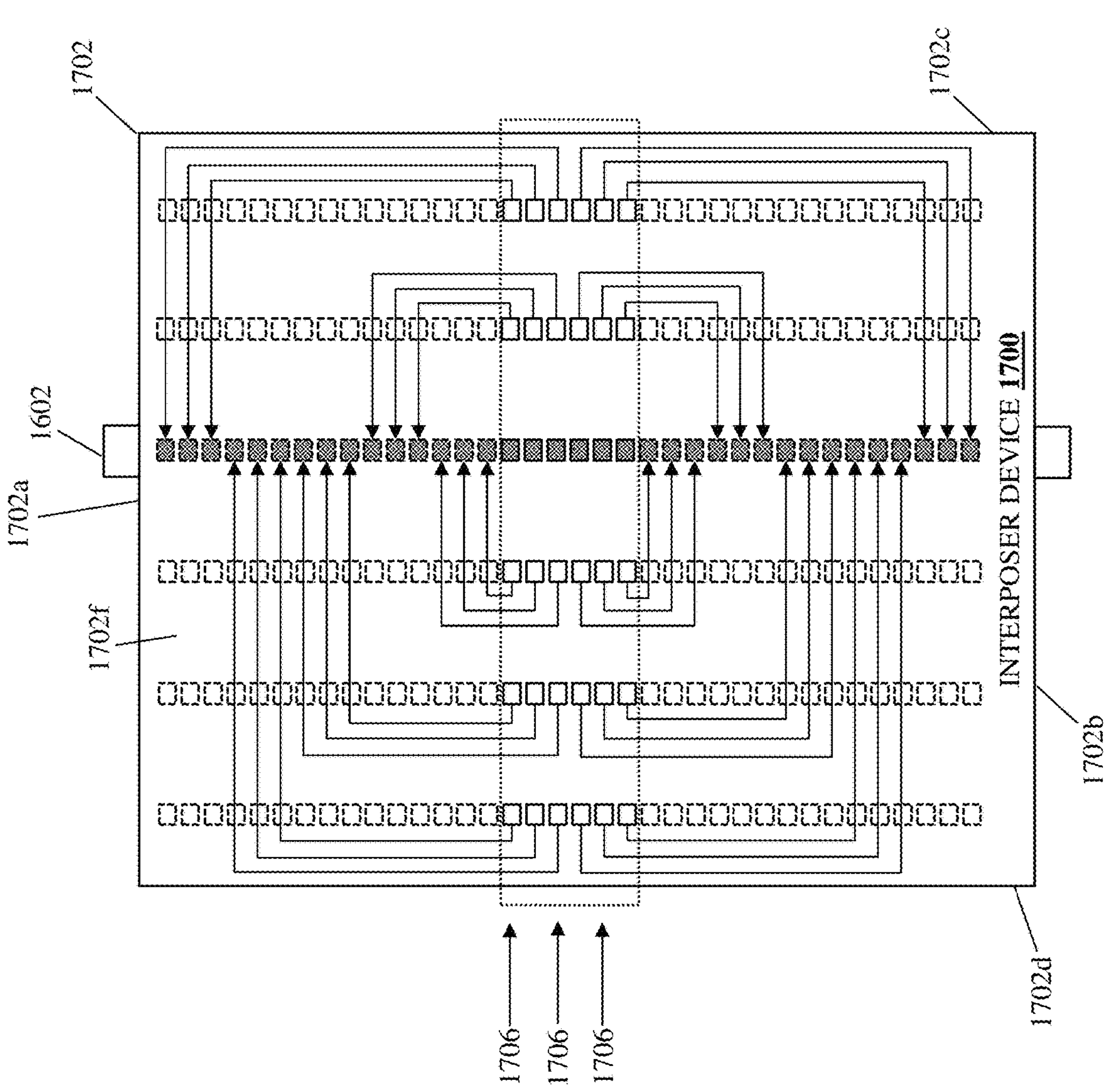
FIG. 20 is a schematic view illustrating an embodiment of the interposer device of FIGS. 17A-17C coupled to one of the switch systems of FIG. 16A and reconfigured to provide the racked GPU system of the present disclosure.

With reference to FIG. 20, an embodiment of the interposer device 1700 is illustrated with only one of its six switch system connector groups 1704 connected to a respective switch system 1600 (i.e., the "fourth" switch system connector group 1704 from the side edge 1702*d* of the chassis 1702 of the interposer device 1700 in FIG. 20), and only six of its thirty-six compute device connector groups 1706 connected to respective compute devices 800*b* (i.e., the "middle" compute device connector groups 1706 between the fifteen compute device connector groups 1706 immediately adjacent the "top" of the interposer device 1700 and the fifteen compute device connector groups 1706 immediately adjacent the "bottom" of the interposer device 1700 in FIG. 20).

As will be appreciated by one of skill in the art in possession of the present disclosure, FIG. 20 illustrates the interposer device 1700 with the computing device connector groups 1706 visible, with computing device connector groups 1706 that are connected to compute devices 800*b* illustrated with solid lines and outlined with a dashed box, and computing device connector groups 1706 that are not connected to compute devices 800*b* illustrated with dashed lines. Furthermore, FIG. 20 illustrates the one switch system 1600 connected to a respective switch system connector group 1704 on the non-visible side of the interposer device 1700, with the compute device connectors that are located immediately opposite that switch system connector group 1704 shaded. As such, the non-shaded compute device connectors illustrated in solid lines in FIG. 20 indicate compute device connectors in compute device connector groups 1706 that are connected to a compute device 800*b*, but that are located immediately opposite a switch connector in a switch system connector group 1704 that is not connected to a switch system 1600.

As illustrated in FIG. 20, in an embodiment of block 1110 and in response to the one switch system 1600 being connected to the switch system connector group 1704 at decision block 1808, the connections between the switch system connectors in the switch system connectors group 1704 may be reconfigured such that switch system connectors in a switch system connector group 1704 that are not connected to a switch system 1600 but that are located immediately opposite a compute device connector that is connected to a compute device 800*b* are linked to switch system connectors in the switch system connector group 1704 that are connected to the switch system 1600 but that are located immediately opposite a compute device connector that is not connected to a compute device 800*b*.

For example, consider the "sixteenth" compute device connector group 1706 in FIG. 20 (i.e., the sixteenth compute device connector group 1706 from the "top" of the interposer device 1700 in FIG. 20) that is the "first" of the compute device connector groups 1706 that is connected to a compute device as described above. As can be seen in FIG. 20, at block 1810, the switch system connector that is located immediately opposite the "first" compute device connector (i.e., the compute device connector located immediately adjacent the side edge 1702*d* of the interposer device 1700 in FIG. 20) in the "sixteenth" compute device connector group 1706 and that is not connected to a switch system 1600 is linked to the switch system connector that is located immediately opposite the "fourth" compute device connector (i.e., the fourth compute device connector from the side edge 1702*d* of the interposer device 1700 in FIG. 20) in the "sixth" compute device connector group 1706 (i.e., the sixth compute device connector group 1706 from the "top" of the interposer device 1700 in FIG. 20) and that is connected to a switch system 1600. As such, compute device communications received via the "first" compute device connector in the "sixteenth" compute device connector group 1706 (which is located immediately opposite a switch system connector that is not connected to a switch system 1600) will be transmitted to the switch system connector that is located immediately opposite the "fourth" compute device connector in the "sixth" compute device connector group 1706 (and that is connected to a switch system 1600).

While not described in detail, one of skill in the art in possession of the present disclosure will appreciate how FIG. 20 details a specific example of how each of the switch system connectors that are not connected to a switch system and that are located immediately opposite a compute device connector that is connected to a compute device may be linked to a switch system connector that is included on the one connected switch system and that is located immediately opposite a compute device connector that is not connected to a compute device.

Figure 21:
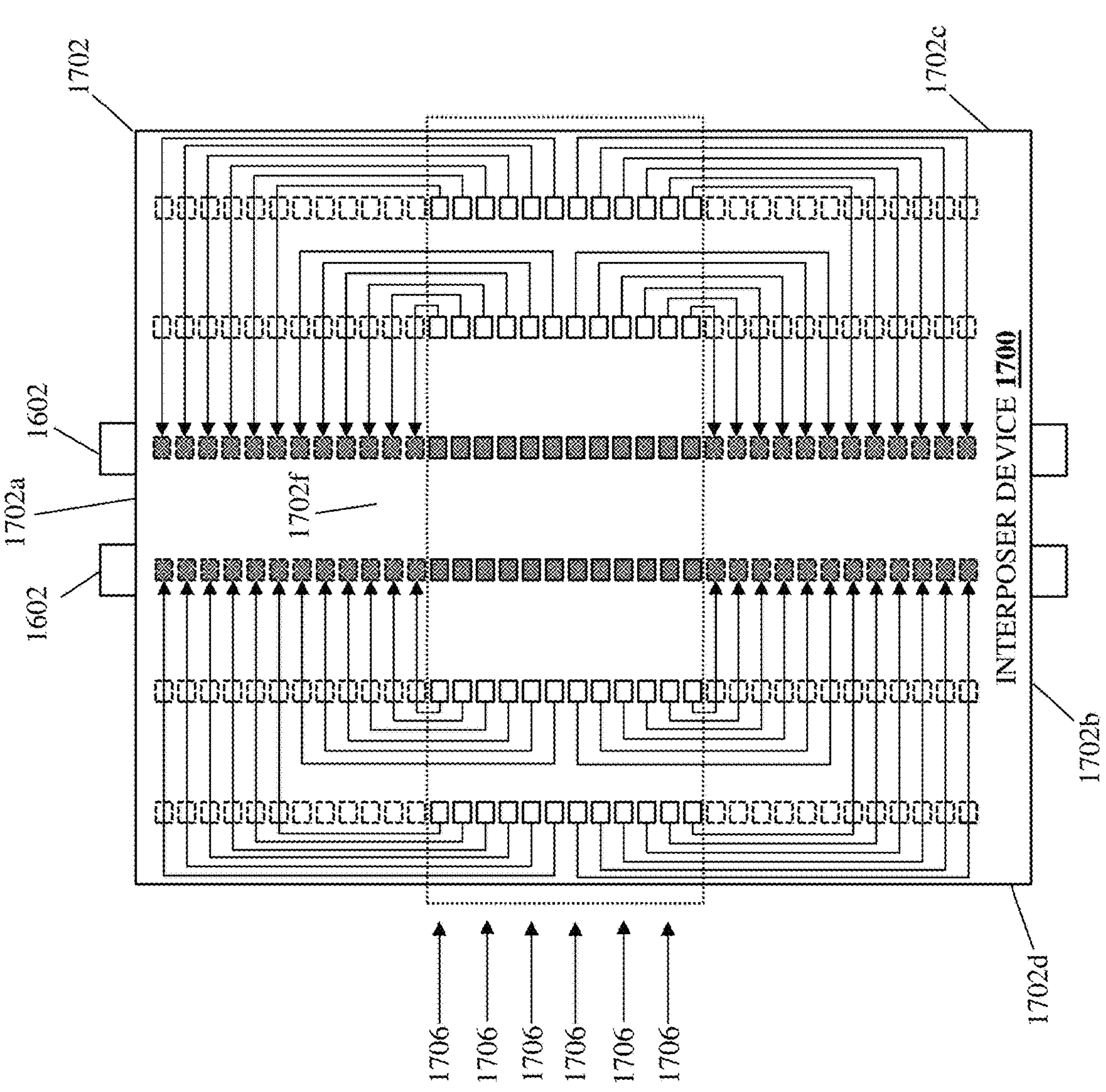
FIG. 21 is a schematic view illustrating an embodiment of the interposer device of FIGS. 17A-17C coupled to two of the switch systems of FIG. 16A and reconfigured to provide the racked GPU system of the present disclosure.

With reference to FIG. 21, an embodiment of the interposer device 1700 is illustrated with only two of its six switch system connector groups 1704 connected to a respective switch system 1600 (i.e., the "third" and "fourth" switch system connector groups 1704 from the side edge 1702*d* of the chassis 1702 of the interposer device 1700 in FIG. 21), and only twelve of its thirty-six compute device connector groups 1706 connected to respective compute devices 800*b* (i.e., the "middle" compute device connector groups 1706 between the twelve compute device connector groups 1706 immediately adjacent the "top" of the interposer device 1700 and the twelve compute device connector groups 1706 immediately adjacent the "bottom" of the interposer device 1700 in FIG. 21).

As will be appreciated by one of skill in the art in possession of the present disclosure, FIG. 21 illustrates the interposer device 1700 with the computing device connector groups 1706 visible, with computing device connector groups 1706 that are connected to compute devices 800*b* illustrated with solid lines and outlined with a dashed box, and computing device connector groups 1706 that are not connected to compute devices 800*b* illustrated with dashed lines. Furthermore, FIG. 21 illustrates the two switch systems 1600 connected to respective switch system connector groups 1704 on the non-visible side of the interposer device 1700, with the compute device connectors that are located immediately opposite those switch system connector groups 1704 shaded. As such, the non-shaded compute device connectors illustrated in solid lines in FIG. 21 indicate compute device connectors in compute device connector groups 1706 that are connected to a compute device 800*b*, but that are located immediately opposite a switch connector in a switch system connector group 1704 that is not connected to a switch system 1600.

As illustrated in FIG. 21, in an embodiment of block 1810 and in response to the two switch systems 1600 being connected to the respective switch system connector groups 1704 at decision block 1808, the connections between the switch system connectors in the switch system connectors groups 1704 may be reconfigured such that switch system connectors in a switch system connector group 1704 that are not connected to a switch system 1600 but that are located immediately opposite a compute device connector that is connected to a compute device 800*b* are linked to switch system connectors in the switch system connector groups

1704 that are connected to one of the two switch systems 1600 but that are located immediately opposite a compute device connector that is not connected to a compute device 800*b*.

For example, consider the "thirteenth" compute device connector group 1706 in FIG. 21 (i.e., the thirteenth compute device connector group 1706 from the "top" of the interposer device 1700 in FIG. 21) that is the "first" of the compute device connector groups 1706 that is connected to a compute device as described above. As can be seen in FIG. 21, at block 1810, the switch system connector that is located immediately opposite the "first" compute device connector (i.e., the compute device connector located immediately adjacent the side edge 1702*d* of the interposer device 1700 in FIG. 21) in the "thirteenth" compute device connector group 1706 and that is not connected to a switch system 1600 is linked to the switch system connector that is located immediately opposite the "third" compute device connector (i.e., the third compute device connector from the side edge 1702*d* of the interposer device 1700 in FIG. 21) in the "sixth" compute device connector group 1706 (i.e., the sixth compute device connector group 1706 from the "top" of the interposer device 1700 in FIG. 21) and that is connected to a switch system 1600. As such, compute device communications received via the "first" compute device connector in the "thirteenth" compute device connector group 1706 (which is located immediately opposite a switch system connector that is not connected to a switch system 1600) will be transmitted to the switch system connector that is located immediately opposite the "third" compute device connector in the "sixth" compute device connector group 1706 (and that is connected to a switch system 1600).

While not described in detail, one of skill in the art in possession of the present disclosure will appreciate how FIG. 21 details a specific example of how each of the switch system connectors that are not connected to a switch system and that are located immediately opposite a compute device connector that is connected to a compute device may be linked to a switch system connector that is included on one of the two connected switch systems and that is located immediately opposite a compute device connector that is not connected to a compute device.

Figure 22A:
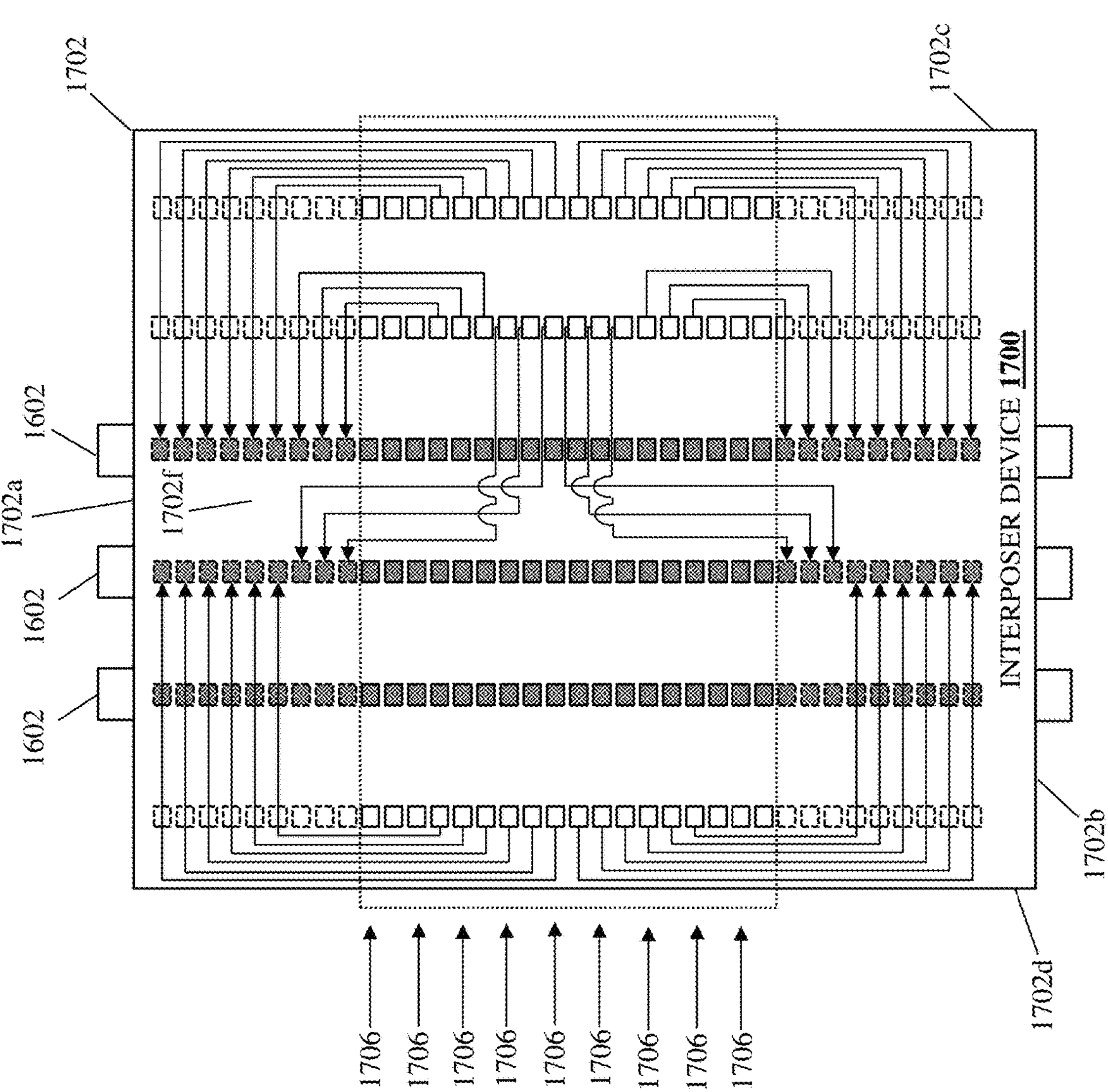
FIG. 22A is a schematic view illustrating an embodiment of the interposer device of FIGS. 17A-17C coupled to three of the switch systems of FIG. 16A and reconfigured to provide the racked GPU system of the present disclosure.
Figure 22B:
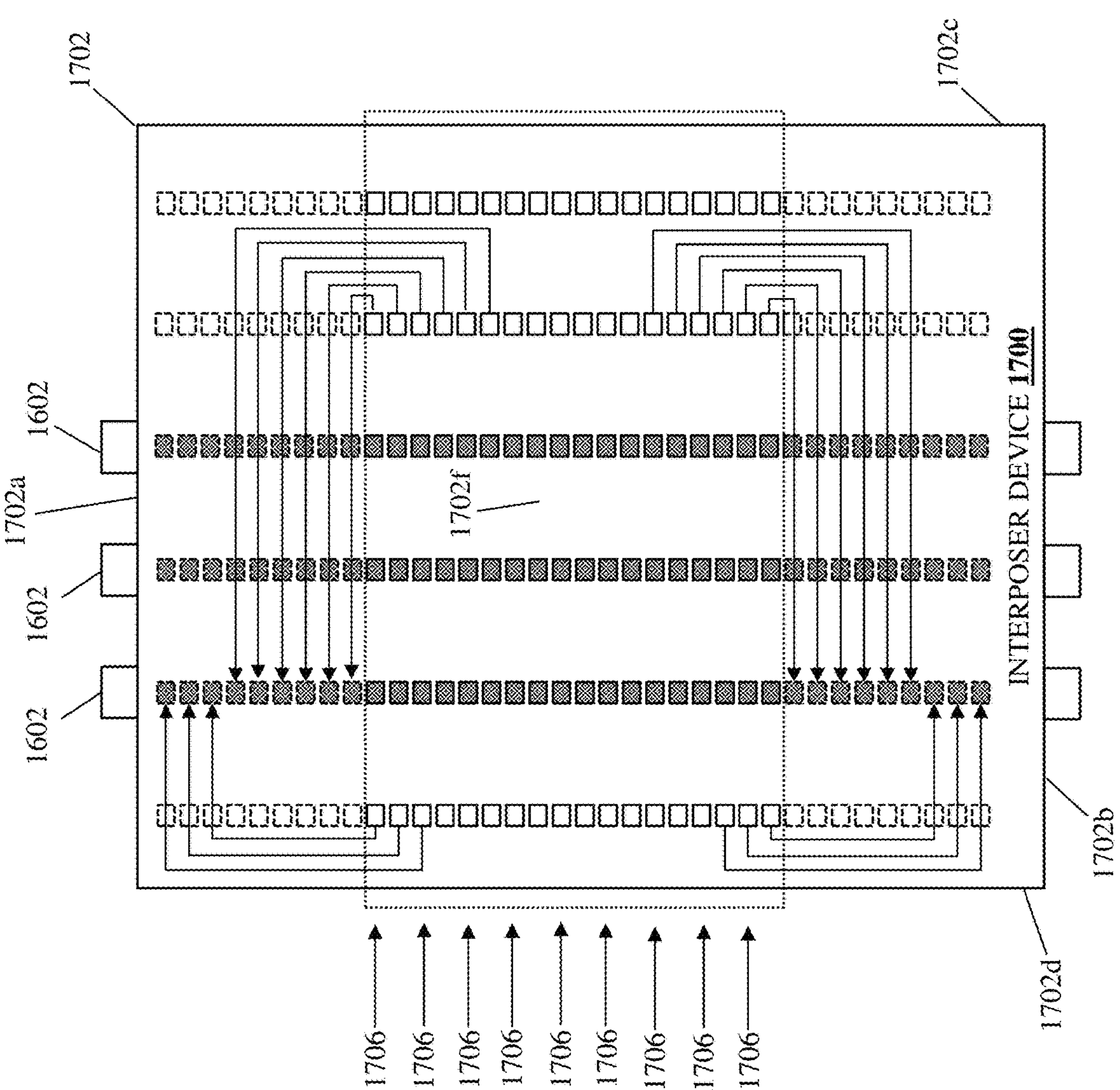
FIG. 22B is a schematic view illustrating an embodiment of the interposer device of FIGS. 17A-17C coupled to three of the switch systems of FIG. 16A and reconfigured to provide the racked GPU system of the present disclosure.

With reference to FIGS. 22A and 22B, an embodiment of the interposer device 1700 is illustrated with only three of its six switch system connector groups 1704 connected to a respective switch system 1600 (i.e., the "second", "third" and "fourth" switch system connector groups 1704 from the side edge 1702*d* of the chassis 1702 of the interposer device 1700 in FIGS. 22A and 22B), and only eighteen of its thirty-six compute device connector groups 1706 connected to respective compute devices 800*b* (i.e., the "middle" compute device connector groups 1706 between the nine compute device connector groups 1706 immediately adjacent the "top" of the interposer device 1700 and the nine compute device connector groups 1706 immediately adjacent the "bottom" of the interposer device 1700 in FIGS. 22A and 22B). As will be appreciated by one of skill in the art in possession of the present disclosure, the reconfiguration connections for the interposer device of FIGS. 22A and 22B are illustrated in two drawings for clarity.

As will be appreciated by one of skill in the art in possession of the present disclosure, FIGS. 22A and 22B illustrate the interposer device 1700 with the computing device connector groups 1706 visible, with computing device connector groups 1706 that are connected to compute devices 800*b* illustrated with solid lines and outlined with a dashed box, and computing device connector groups 1706 that are not connected to compute devices 800*b* illustrated with dashed lines. Furthermore, FIGS. 22A and 22B illustrate the three switch systems 1600 connected to respective switch system connector groups 1704 on the non-visible side of the interposer device 1700, with the compute device connectors that are located immediately opposite those switch system connector groups 1704 shaded. As such, the non-shaded compute device connectors illustrated in solid lines in FIGS. 22A and 22B indicate compute device connectors in compute device connector groups 1706 that are connected to a compute device 800*b*, but that are located immediately opposite a switch connector in a switch system connector group 1704 that is not connected to a switch system 1600.

As illustrated in FIGS. 22A and 22B, in an embodiment of block 1810 and in response to the three switch systems 1600 being connected to the respective switch system connector groups 1704 at decision block 1808, the connections between the switch system connectors in the switch system connectors groups 1704 may be reconfigured such that switch system connectors in a switch system connector group 1704 that are not connected to a switch system 1600 but that are located immediately opposite a compute device connector that is connected to a compute device 800 are linked to switch system connectors in the switch system connector groups 1704 that are connected to one of the three switch systems 1600 but that are located immediately opposite a compute device connector that is not connected to a compute device 800*b*.

For example, consider the "tenth" compute device connector group 1706 in FIG. 22B (i.e., the tenth compute device connector group 1706 from the "top" of the interposer device 1700 in FIG. 22B) that is the "first" of the compute device connector groups 1706 that is connected to a compute device as described above. As can be seen in FIG. 22B, at block 1810, the switch system connector that is located immediately opposite the "first" compute device connector (i.e., the compute device connector located immediately adjacent the side edge 1702*d* of the interposer device 1700 in FIG. 22B) in the "tenth" compute device connector group 1706 and that is not connected to a switch system 1600 is linked to the switch system connector that is located immediately opposite the "second" compute device connector (i.e., the second compute device connector from the side edge 1702*d* of the interposer device 1700 in FIG. 22B) in the "third" compute device connector group 1706 (i.e., the third compute device connector group 1706 from the "top" of the interposer device 1700 in FIG. 22B) and that is connected to a switch system 1600. As such, compute device communications received via the "first" compute device connector in the "tenth" compute device connector group 1706 (which is located immediately opposite a switch system connector that is not connected to a switch system 1600) will be transmitted to the switch system connector that is located immediately opposite the "second" compute device connector in the "third" compute device connector group 1706 (and that is connected to a switch system 1600).

While not described in detail, one of skill in the art in possession of the present disclosure will appreciate how FIGS. 22A and 22B detail a specific example of how each of the switch system connectors that are not connected to a switch system and that are located immediately opposite a compute device connector that is connected to a compute device may be linked to a switch system connector that is included on one of the three connected switch systems and that is located immediately opposite a compute device connector that is not connected to a compute device.

As will be appreciated by one of skill in the art in possession of the present disclosure, the reconfiguration of the interposer device 1700 described above may be an "active" interposer device reconfiguration provided by a user via the use of cabling and/or other techniques known in the art when the interposer device 1700 is populated with less than the maximum number of switch systems 1600. However, the provisioning of "passive" interposer device reconfiguration systems like those described above in the interposer device 1700 are envisioned as falling within the scope of the present disclosure as well. Furthermore, while specific examples that allow one-sixth, one-third, or one-half of the available compute device connector groups to be connected to compute devices while enabling communications between the GPU devices in those compute devices using a switch system connected to one, two, or three of the available switch system connector groups, respectively, one of skill in the art in possession of the present disclosure will appreciate how other configurations and reconfigurations for the interposer device 1700 that allow other numbers of compute devices and switch systems to be used to provide the racked GPU system of the present disclosure will fall within its scope as well.

Figure 23:
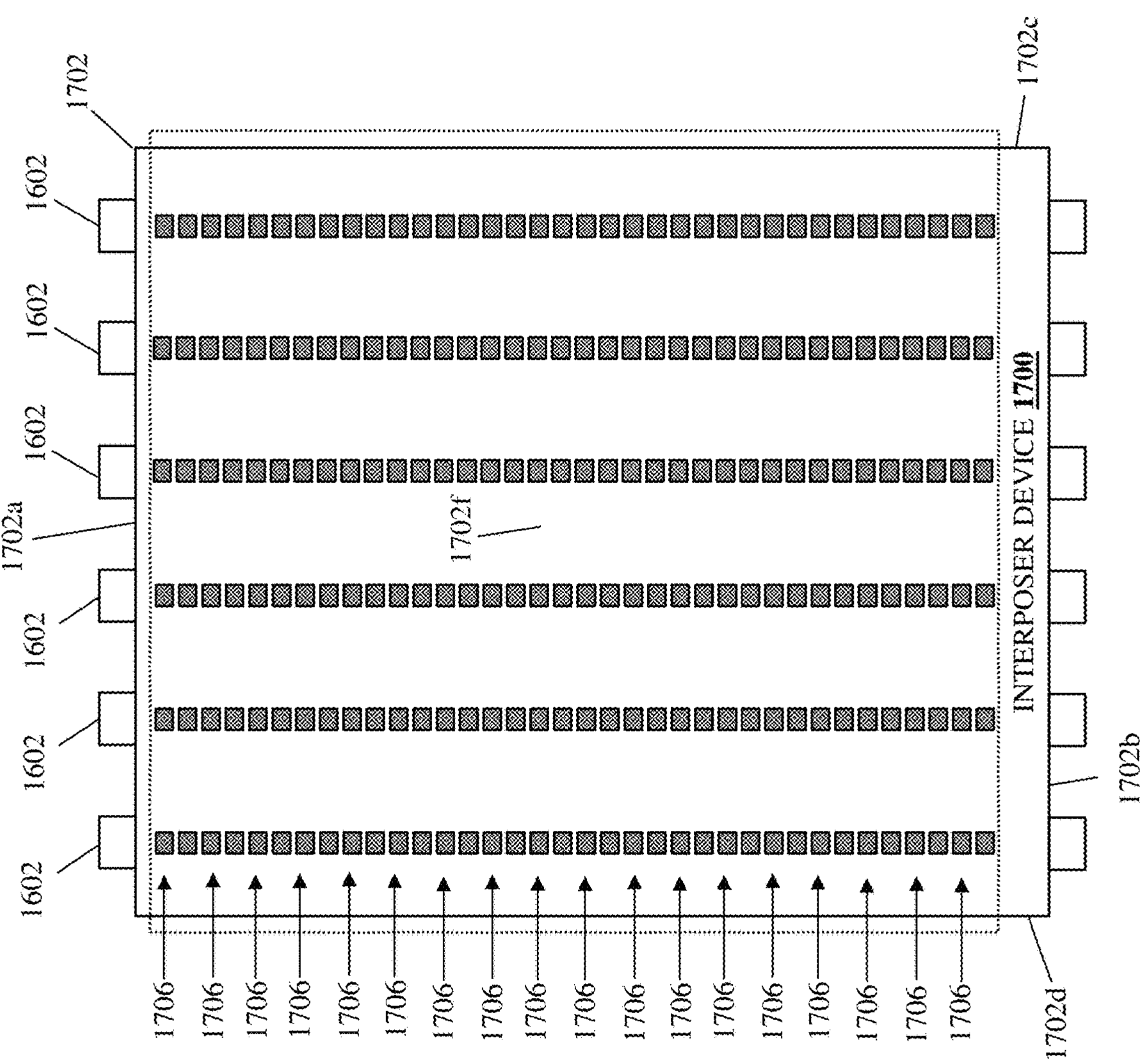
FIG. 23 is a schematic view illustrating an embodiment of the interposer device of FIGS. 17A-17C coupled to six of the switch systems of FIG. 16A to provide the racked GPU system of the present disclosure.

Following block 1810, or if at decision block 1808 the interposer device is fully populated with switch systems, the method 1800 proceeds to block 1812 where the GPU devices in the compute devices communicate via the interposer device and the switch systems with each other. With reference to FIG. 23, an embodiment of the interposer device 1700 is illustrated with all of its six switch system connector groups 1704 connected to respective switch systems 1600, and all of its thirty-six compute device connector groups 1706 connected to respective compute devices 800*b*.

As will be appreciated by one of skill in the art in possession of the present disclosure, FIG. 23 uses the same illustration conventions as FIGS. 20, 21, and 22A/22B discussed above. As such, the interposer device 1700 is illustrated with the computing device connector groups 1706 visible, the computing device connector groups 1706 that are connected to compute devices 800*b* illustrated with solid lines and outlined with a dashed box, and the six switch systems 1600 connected to respective switch system connector groups 1704 on the non-visible side of the interposer device 1700 with the compute device connectors that are located immediately opposite those switch system connector groups 1704 shaded. The GPU device communication of block 1812 is described below based on the "fully populated" compute device/switch system configuration illustrated in FIG. 23, but one of skill in the art in possession of the present disclosure will appreciate how GPU devices in the "partially populated" compute device/switch system configurations illustrated in FIGS. 20, 21, and 22A/22B may communicate in a similar manner (but using the reconfigured switch system connector connections described above.

Figure 24A:
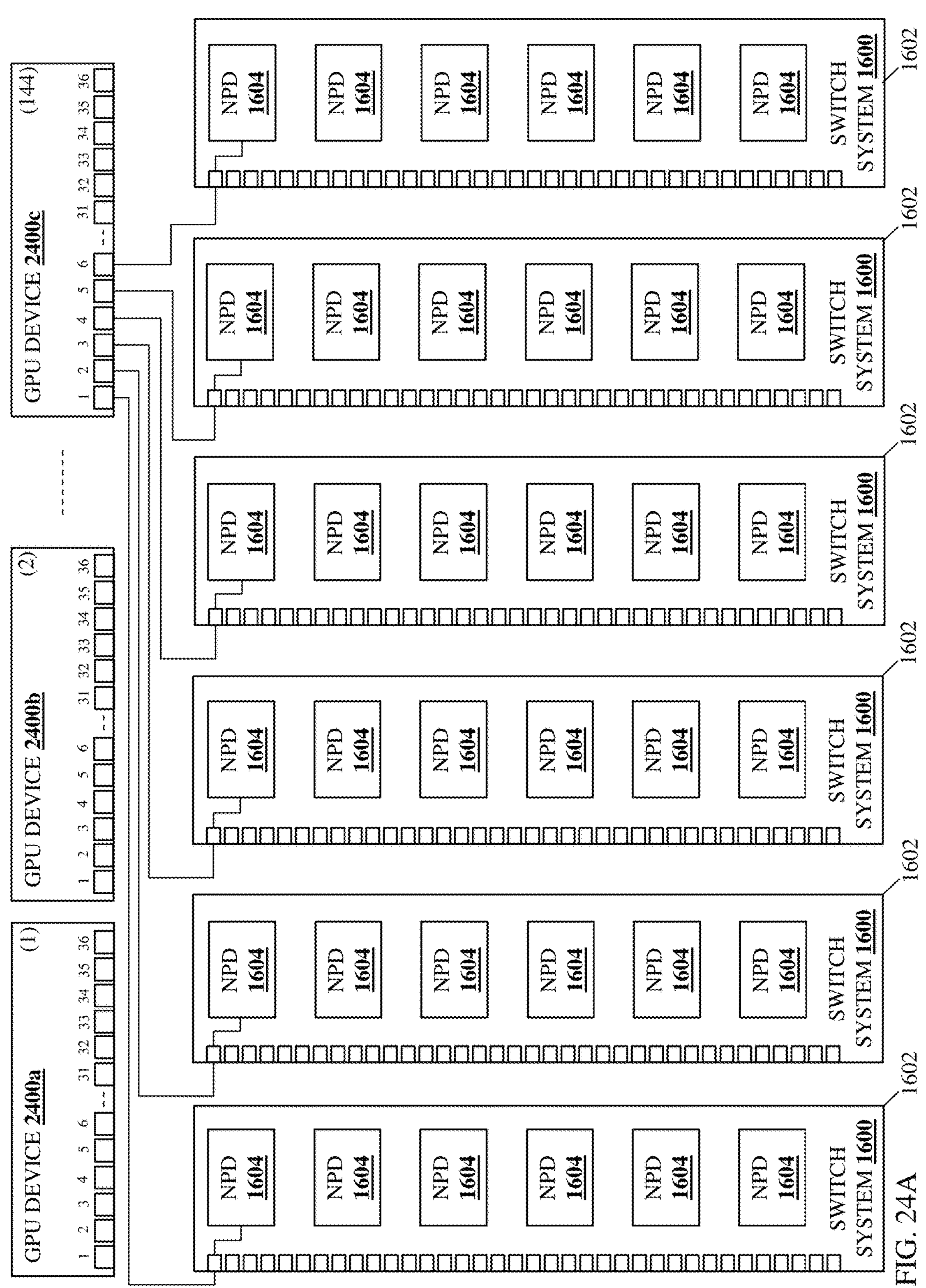
FIG. 24A is a schematic view illustrating some of the connections provided by the interposer device of FIGS. 17A-17C in the racked GPU system of FIGS. 19C and 23 between some of the networking processing devices the switch systems and one of the GPU devices in the compute devices.
Figure 24B:
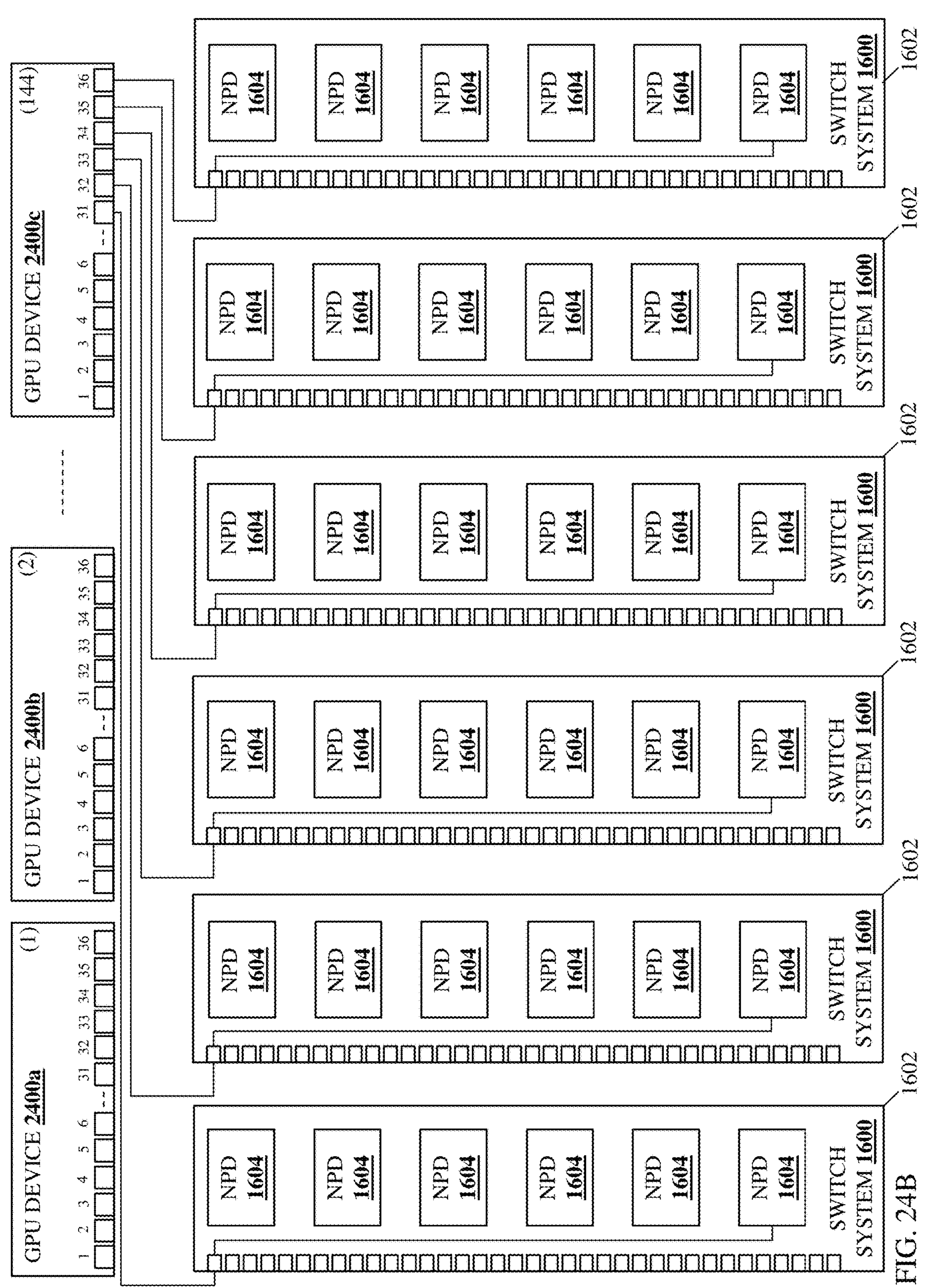
FIG. 24B is a schematic view illustrating some of the connections provided by the interposer device of FIGS. 17A-17C in the racked GPU system of FIGS. 19C and 23 between some of the networking processing devices the switch systems and one of the GPU devices in the compute devices.

With reference to FIGS. 16A, 19C, 23, 24A and 24B, an embodiment of the connections between one of the GPU devices and some of the networking processing devices provided in the racked GPU system of the present disclosure is illustrated. In FIGS. 24A-24C, the GPU devices provided in the compute devices 800*b* in the racked GPU system of the present disclosure are renumbered to GPU devices 2400*a*, 2400*b*, and up to 2400*c*, and in the examples discussed above, the 36 compute devices 800*b* provide 4 GPU devices each to provide (36*4=) 144 GPU devices that are coupled to the 36 networking processing devices 1604 provided by the six switch systems 1600.

FIG. 24A illustrates how each of the "1-6" GPU interfaces on the "one hundred and forty fourth" GPU device 2400*c* are connected via the "first" switch system connector 1606 on a respective one of the six switch systems 1600 (i.e., the switch device connector 1606 located immediately adjacent the "top" of that switch system 1600 in FIG. 24A) to the "first" networking processing device 1604 on that switch system 1600 (i.e., the networking processing device 1604 located immediately adjacent the "top" of that switch system 1600 in FIG. 24A). FIG. 24C illustrates how each of the "31-36" GPU interfaces on the "one hundred and forty fourth" GPU device 2400*c* are connected via the "first" switch system connector 1606 on a respective one of the six switch systems 1600 (i.e., the switch device connector 1606 located immediately adjacent the "top" of that switch system 1600 in FIG. 24B) to the "last" networking processing device 1604 on that switch system 1600 (i.e., the networking processing device 1604 located immediately adjacent the "bottom" of that switch system 1600 in FIG. 24B).

However, while only a few of the connections between the GPU device 2400*c* and the networking processing devices 1604 in the six switch systems 1600 are illustrated and described, one of skill in the art in possession of the present disclosure will appreciate how the GPU device 2400*c* is connected to all of the networking processing devices 1604 in the six switch systems 1600 similarly as illustrated in FIGS. 24A and 24B. Furthermore, one of skill in the art in possession of the present disclosure will appreciate how each of the GPU devices provided in the rack GPU system of the present disclosure are connected to all of the networking processing devices 1604 in the six switch systems 1600 similarly as illustrated for the GPU device 2400*c* in FIGS. 24A-24C as well.

Finally, one of skill in the art in possession of the present disclosure will appreciate how each of the GPU devices in the 6 compute devices provided in the "partially populated" racked GPU system discussed above with reference to FIGS. 19C and 20 may be connected to all of the networking processing devices 904 included in the one switch system 1600 provided in the "partially populated" racked GPU system discussed above with reference to FIGS. 19C and 20, each of the GPU devices in the 12 compute devices provided in the "partially populated" racked GPU system discussed above with reference to FIGS. 19C and 21 may be connected to all of the networking processing devices 904 included in the two switch systems 1600 provided in the "partially populated" racked GPU system discussed above with reference to FIGS. 19C and 21, and each of the GPU devices in the 18 compute devices provided in the "partially populated" racked GPU system discussed above with reference to FIGS. 19C, 22A, and 22B may be connected to all of the networking processing devices 904 provided in the three switch systems 1600 included in the "partially populated" racked GPU system discussed above with reference to FIGS. 19C, 22A, and 22B similarly as described above as well.

As such, one of skill in the art in possession of the present disclosure will appreciate how, at block 1812, any of the GPU devices 2400*a*-2400*c* may communicate with any of the other GPU devices in the racked GPU system via the interposer device 1700 and the switch systems 1600 using the communicative couplings provided between those GPU devices 2400*a*-2400*c* via the connection of the compute devices 800*b* and the switch systems 1600 to the interposer device 1700.

As will be appreciated by one of skill in the art in possession of the present disclosure, the numbers and types of components (e.g. the number and type of GPU devices, the number and type compute device connectors, the number and type switch systems, the number and type networking processing devices, and/or the number and type other components) in the racked GPU system of the present disclosure are based on the "NVL72" racked GPU systems available from NVIDIA® Corporation, and provide double the GPU processing capabilities as those "NVL72" racked GPU systems as described in detail above. However, racked GPU systems provided according to the teachings of the present disclosure may be based on racked GPU systems provided by INTEL® corporation or AMD® corporation, and thus may utilize different numbers and types of components while remaining within the scope of the present disclosure as well.

Thus, systems and methods have been described that provide a racked GPU system configuration in which all compute device housings defined by a rack system may be used to house compute devices including GPU devices, and networking processing devices are coupled to those GPU devices via an interposer device that is positioned between the compute devices/device housings and switch systems that include the networking processing devices, with the interposer device configurable to allow the number of switch systems required in the racked GPU system to be scaled based on the number of compute device/GPU devices being used. For example, the racked GPU system of the present disclosure may include a rack system defining a plurality of device housings. An interposer device is housed in the rack system adjacent the plurality of device housings. A plurality of compute devices that each include a plurality of Graphics Processing Units (GPU) devices are housed in a respective one of the plurality of the device housings and connected to the interposer device. At least one switch system including a plurality of networking processing devices is housed in the rack system opposite the interposer device from the plurality of compute devices and the plurality of device housings, and connected to the interposer device to communicatively couple each of the plurality of networking processing devices in that switch system to each of the plurality of GPU devices in each of the plurality of compute devices. As such, GPU density is increased relative to conventional racked GPU systems, while also enabling the scaling of networking processing devices based on the number of GPU devices being used.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A racked Graphics Processing Unit (GPU) system, comprising:
- a rack system defining a plurality of device housings;
- an interposer device that is configured to be housed in the rack system adjacent the plurality of device housings;
- a plurality of compute devices that each include a plurality of Graphics Processing Units (GPU) devices, wherein each of the plurality of compute devices is configured to be housed in a respective one of the plurality of the device housings and connected to the interposer device; and
- at least one switch system that includes a plurality of networking processing devices, wherein each at least one switch system is configured to be housed in the rack system opposite the interposer device from the plurality of compute devices and the plurality of device housings, and connected to the interposer device to communicatively couple each of the plurality of networking processing devices in that switch system to each of the plurality of GPU devices in each of the plurality of compute devices.

2. The system of claim 1, wherein all of the plurality of device housings that are defined by the rack system are configured to house a respective one of the plurality of compute devices.

3. The system of claim 1, wherein the interposer device includes:
- a plurality of switch system connector groups that each include a plurality of switch system connectors that are configured to connect to a respective one of the at least one switch system; and
- a plurality of compute device connector groups that each include a plurality of compute device connectors that are configured to connect to a respective one of the plurality of compute devices, and wherein the interposer device is configured to:
  - reconfigure the connectivity between the compute device connectors included in the plurality of compute device connector groups and the switch system connectors included in the plurality of switch system connector groups based on a subset of the plurality of switch system connector groups that are connected the at least one switch system.

4. The system of claim 1, wherein each of the plurality of compute devices includes four GPU devices, the at least one switch system includes at least two switch systems each including nine networking processing devices, and the interposer device is configured to connect to up to four switch systems.

5. The system of claim 1, wherein each of the plurality of compute devices includes four GPU devices, each of the at least one switch system includes six networking processing devices, and the interposer device is configured to connect to up to six switch systems.

6. The system of claim 1, wherein the interposer device includes an interposer device chassis, and wherein each of the plurality of networking processing devices is provided on a respective networking processing device board that is mounted to the interposer device chassis.

7. An Information Handling System (IHS), comprising:
- a rack system defining a plurality of device housings;
- an interposer device housed in the rack system adjacent the plurality of device housings;
- a plurality of compute devices that each include a plurality of Graphics Processing Units (GPU) devices, wherein each of the plurality of compute devices is housed in a respective one of the plurality of the device housings and connected to the interposer device; and
- at least one switch system that includes a plurality of networking processing devices, wherein each at least one switch system is housed in the rack system opposite the interposer device from the plurality of compute devices and the plurality of device housings, and connected to the interposer device, wherein each of the plurality of GPU devices in the plurality of compute devices communicates via the interposer device and the at least one switch system with at least one of the others of the plurality of GPU devices in the plurality of compute devices.

8. The IHS of claim 7, wherein all of the plurality of device housings that are defined by the rack system house a respective one of the plurality of compute devices.

9. The IHS of claim 7, wherein the interposer device includes:

a plurality of switch system connector groups that each include a plurality of switch system connectors that are configured to connect to a respective one of the at least one switch system; and a plurality of compute device connector groups that each include a plurality of compute device connectors connected to a respective one of the plurality of compute devices, and wherein the interposer device is configured to:

reconfigure the connectivity between the compute device connectors in the plurality of compute device connector groups and the switch system connectors in the plurality of switch system connector groups based on a subset of the plurality of switch system connector groups that are connected the at least one switch system.

10. The IHS of claim 7, wherein each of the plurality of compute devices includes four GPU devices, the at least one switch system includes at least two switch systems each including nine networking processing devices, and the interposer device is configured to connect to up to four switch systems.

11. The IHS of claim 7, wherein each of the plurality of compute devices includes four GPU devices, each of the at least one switch system includes six networking processing devices, and the interposer device is configured to connect to up to six switch systems.

12. The IHS of claim 7, wherein the interposer device includes an interposer device chassis, and wherein each of the plurality of networking processing devices is provided on a respective networking processing device board that is mounted to the interposer device chassis.

13. The IHS of claim 7, wherein each of the plurality of GPU devices included in the plurality of compute devices is connected to a respective one of the plurality of networking processing devices in the at least one switch system via a single bidirectional serial link.

14. A method for providing a racked Graphics Processing Unit (GPU) system, comprising:

positioning, by an interposer device, in a rack system defining a plurality of device housings such that the interposer device is located adjacent the plurality of device housings;

positioning, by each a plurality of compute devices that each include a plurality of Graphics Processing Units (GPU) devices, in a respective one of the plurality of the device housings;

connecting, by each of the plurality of compute devices in response to being positioned in the respective one of the plurality of the device housings, to the interposer device;

positioning, by at least one switch system that includes a plurality of networking processing devices, in the rack system opposite the interposer device from the plurality of compute devices and the plurality of device housings;

connecting, by the at least one switch system in response to being positioned in the rack system, to the interposer device to communicatively couple each of the plurality of networking processing devices in that switch system to each of the plurality of GPU devices in each of the plurality of compute devices.

15. The method of claim 14, wherein respective one of the plurality of compute devices is positioned in all of the plurality of device housings that are defined by the rack system house.

16. The method of claim 14, further comprising:

connecting, by a plurality of switch system connector groups on the interposer device that each include a plurality of switch system connectors and in response to the at least one switch system being positioned in the rack system, to a respective one of the at least one switch system; and connecting, by a plurality of compute device connector groups on the interposer device that each include a plurality of compute device connectors in response to each of the plurality of compute devices being positioned in the respective one of the plurality of device housings, to a respective one of the plurality of compute devices; and reconfiguring, by the interposer device, the connectivity between the compute device connectors in the plurality of compute device connector groups and the switch system connectors in the plurality of switch system connector groups based on a subset of the plurality of switch system connector groups that are connected the at least one switch system.

17. The method of claim 14, wherein each of the plurality of compute devices includes four GPU devices, the at least one switch system includes at least two switch systems each including nine networking processing devices, and the interposer device is configured to connect to up to four switch systems.

18. The method of claim 14, wherein each of the plurality of compute devices includes four GPU devices, each of the at least one switch system includes six networking processing devices, and the interposer device is configured to connect to up to six switch systems.

19. The method of claim 14, further comprising:

mounting, by a respective networking processing device board included on each of the plurality of networking processing devices, to an interposer device chassis included on the interposer device.

20. The method of claim 14, further comprising:

connecting, by each of the plurality of GPU devices included in the plurality of compute devices, to a respective one of the plurality of networking processing devices in the at least one switch system via a single bidirectional serial link.

* * * * *